(12) United States Patent
Sugimae et al.

(10) Patent No.: US 8,084,324 B2
(45) Date of Patent: Dec. 27, 2011

(54) NONVOLATILE SEMICONDUCTOR MEMORY AND FABRICATION METHOD FOR THE SAME

(75) Inventors: Kikuko Sugimae, Yokohama (JP);
Masayuki Ichige, Yokohama (JP);
Fumitaka Arai, Yokohama (JP);
Yasuhiko Matsunaga, Yokohama (JP);
Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 12/720,062

(22) Filed: Mar. 9, 2010

(65) Prior Publication Data

US 2010/0173471 A1 Jul. 8, 2010

Related U.S. Application Data

(62) Division of application No. 11/553,661, filed on Oct. 27, 2006, now Pat. No. 7,705,394.

(30) Foreign Application Priority Data

Nov. 15, 2005 (JP) ................................. 2005-330405
Oct. 24, 2006 (JP) ................................. 2006-288876

(51) Int. Cl.
*H01L 21/8238* (2006.01)
*H01L 21/336* (2006.01)
*H01L 21/4763* (2006.01)

(52) U.S. Cl. ........ 438/257; 438/201; 438/258; 438/264; 438/587; 438/594; 257/E21.18; 257/E21.209; 257/E21.613; 257/E21.625; 257/E21.645

(58) Field of Classification Search ............. 257/E21.18, 257/E21.209, E21.613, E21.625, E21.645, 257/E21.68, E21.689

See application file for complete search history.

(56) References Cited

U.S. PATENT DOCUMENTS

| 6,657,249 | B2 | 12/2003 | Nishioka et al. | |
| 6,720,612 | B2 | 4/2004 | Takeuchi et al. | |
| 2001/0020718 | A1 | 9/2001 | Takahashi et al. | |
| 2002/0197800 | A1* | 12/2002 | Hashimoto et al. | 438/266 |
| 2004/0038492 | A1* | 2/2004 | Okazaki et al. | 438/391 |
| 2005/0139904 | A1 | 6/2005 | Kamigaichi et al. | |

(Continued)

FOREIGN PATENT DOCUMENTS

JP 2000-100975 4/2000

(Continued)

*Primary Examiner* — Mohsen Ahmadi
(74) *Attorney, Agent, or Firm* — Oblon, Spivak, McClelland, Maier & Neustadt, L.L.P.

(57) ABSTRACT

A nonvolatile semiconductor memory includes a memory cell transistor including a first floating gate electrode layer formed on a first tunneling insulating film, a first inter-gate insulating film, a first and a second control gate electrode layer, and a first metallic silicide film; a high voltage transistor including a high voltage gate electrode layer formed on the high voltage gate insulating film, a second inter-gate insulating film having an aperture, a third and a fourth control gate electrode layer, and a second metallic silicide film; a low voltage transistor including a second floating gate electrode layer formed on the second tunneling insulating film, a third inter-gate insulating film having an aperture, a fifth and a sixth control gate electrode layer, and a third metallic silicide film; and a liner insulating film directly disposed on a first source and drain region of the memory cell transistor, a second source and drain region of the low voltage transistor, and a third source and drain region of the high voltage transistor.

10 Claims, 80 Drawing Sheets

U.S. PATENT DOCUMENTS

| | | |
|---|---|---|
| 2006/0208338 A1* | 9/2006 | Lee et al. .................... 257/516 |
| 2007/0040210 A1 | 2/2007 | Matsunaga |
| 2007/0093027 A1* | 4/2007 | Hashimoto et al. .......... 438/264 |

FOREIGN PATENT DOCUMENTS

| | | |
|---|---|---|
| JP | 2002-110822 | 4/2002 |
| JP | 2002-217319 | 8/2002 |
| JP | 2002-280463 | 9/2002 |
| JP | 2003-037250 | 2/2003 |
| JP | 2003-203999 | 7/2003 |
| JP | 2003-347511 | 12/2003 |
| JP | 2004-111917 | 4/2004 |
| JP | 2005-317138 | 11/2005 |

* cited by examiner

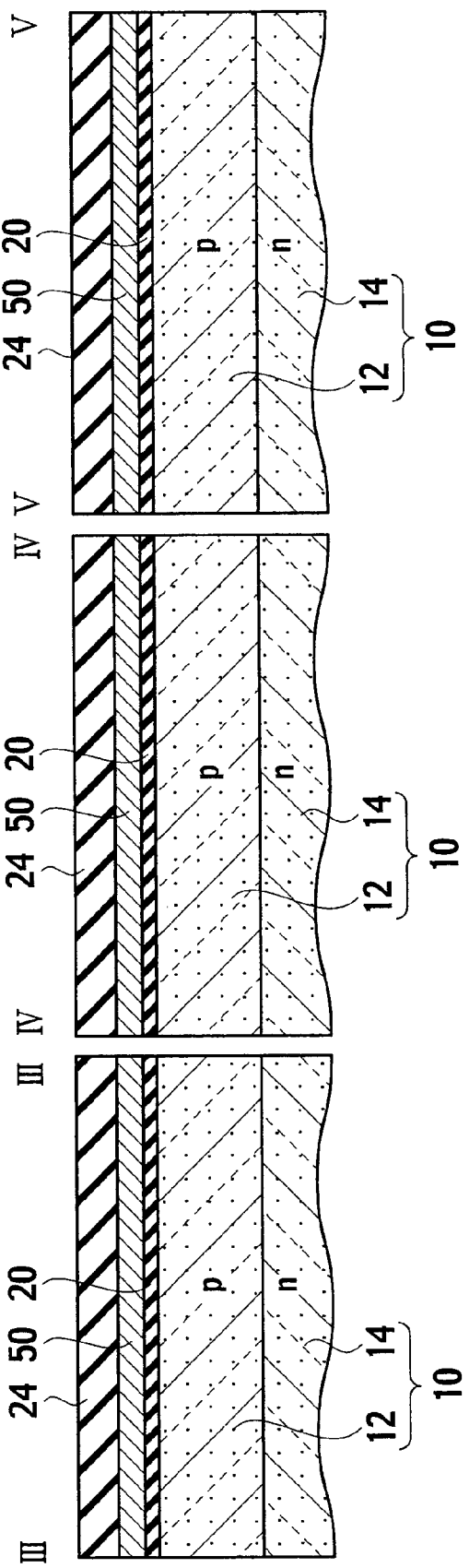

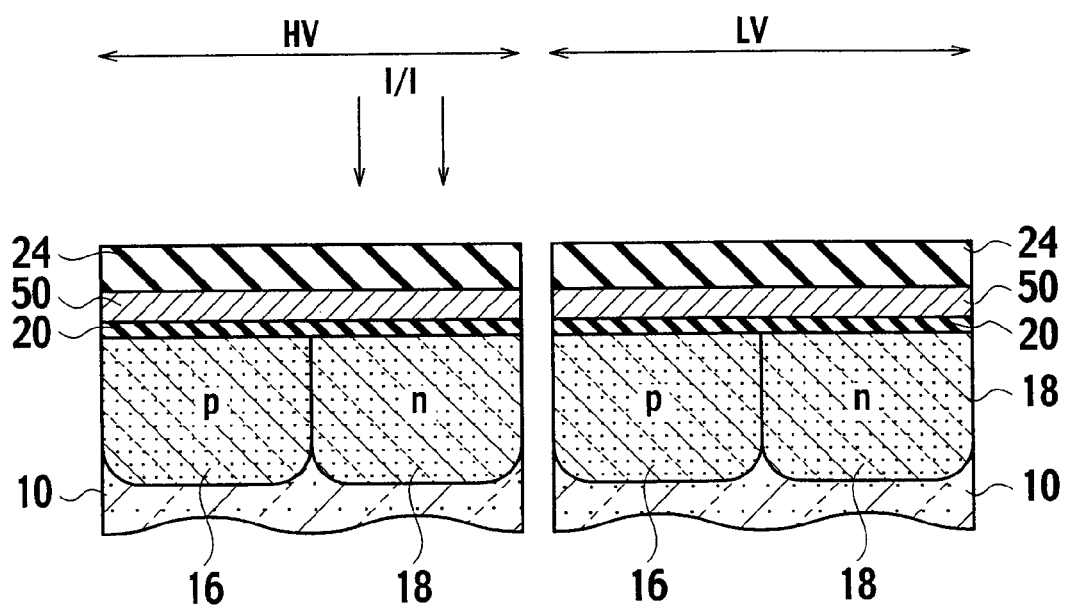

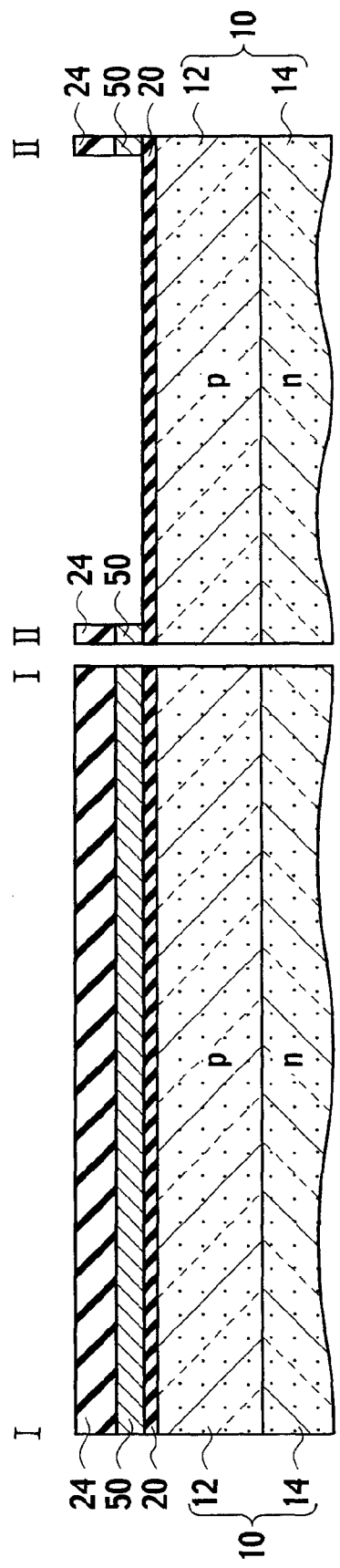

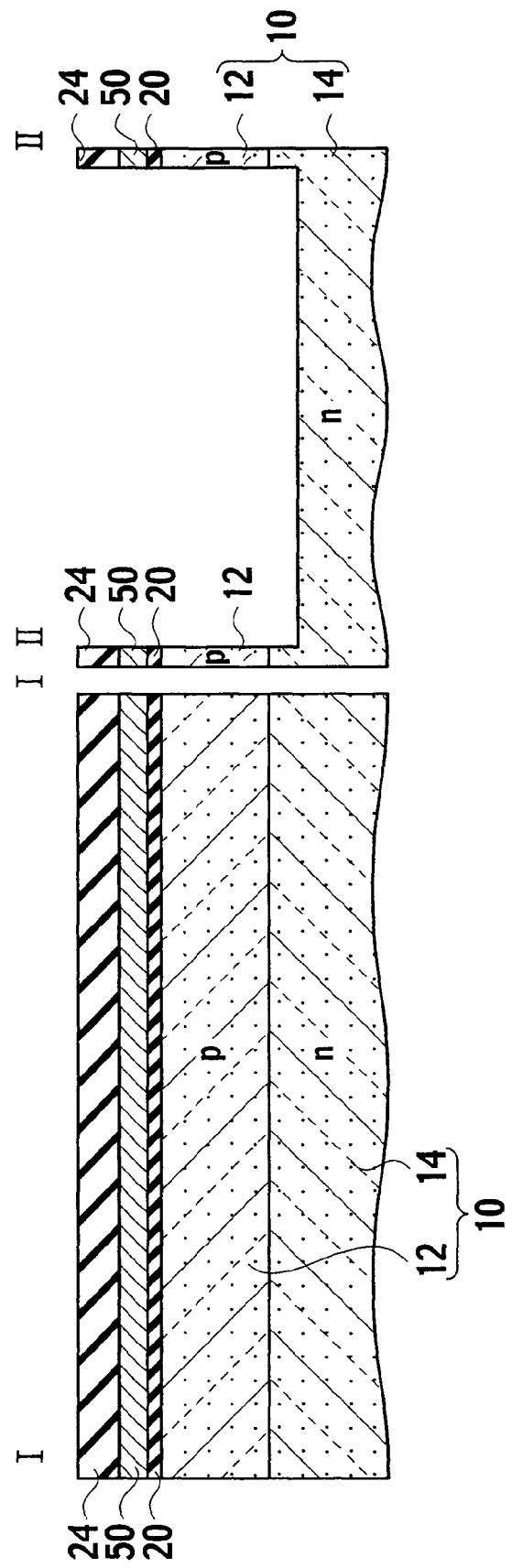

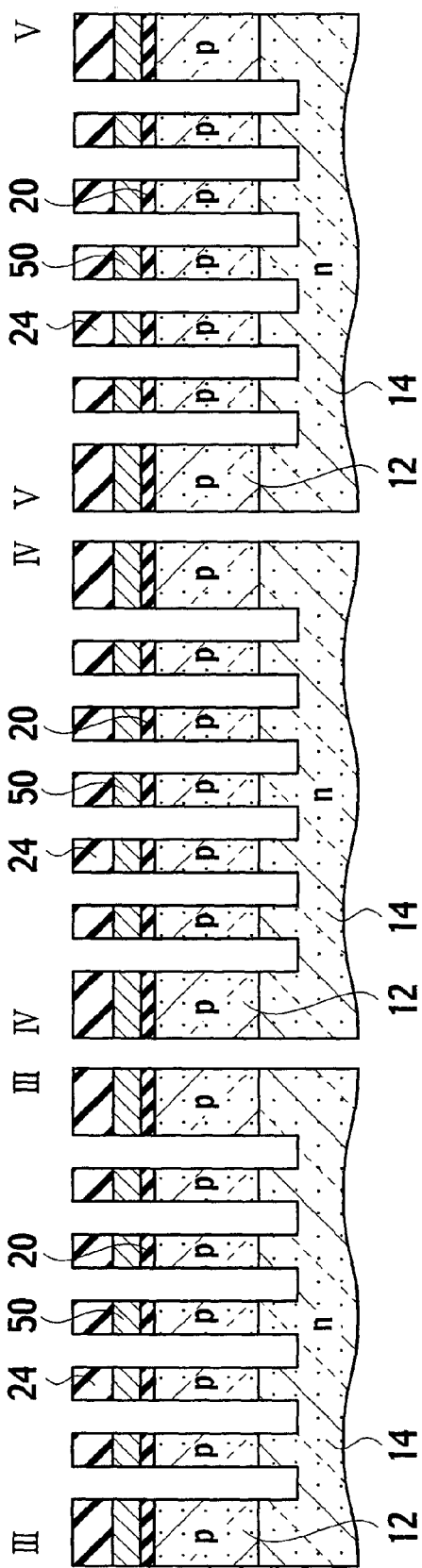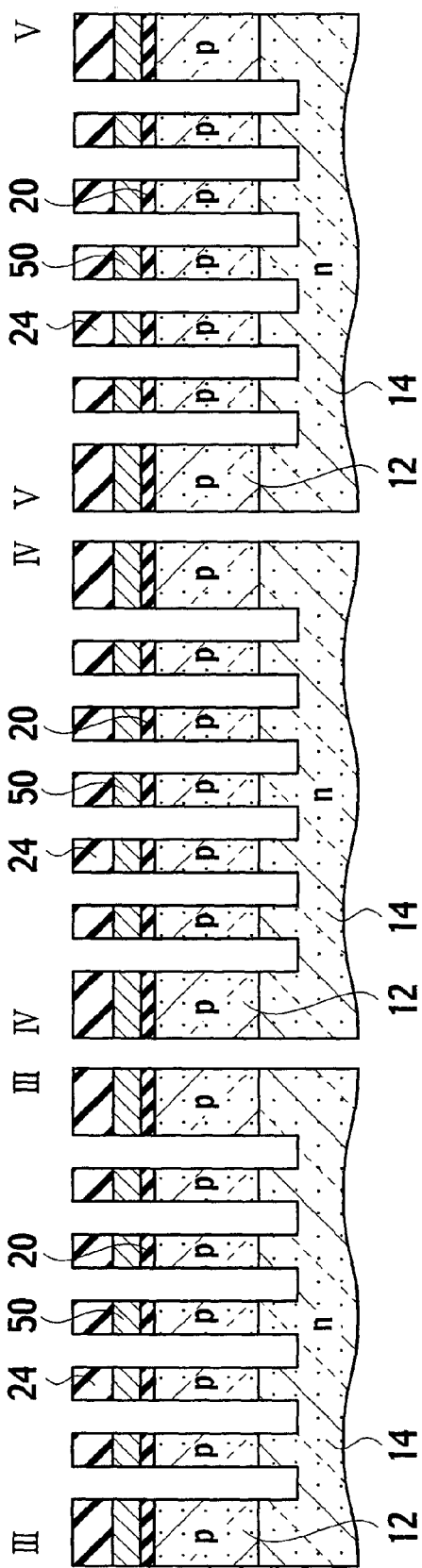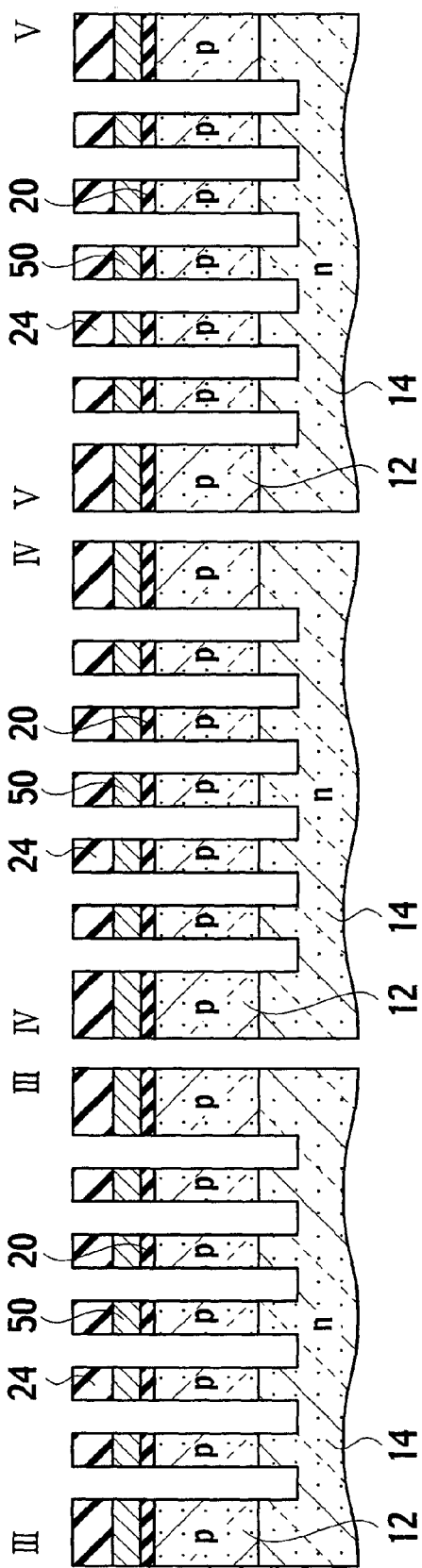

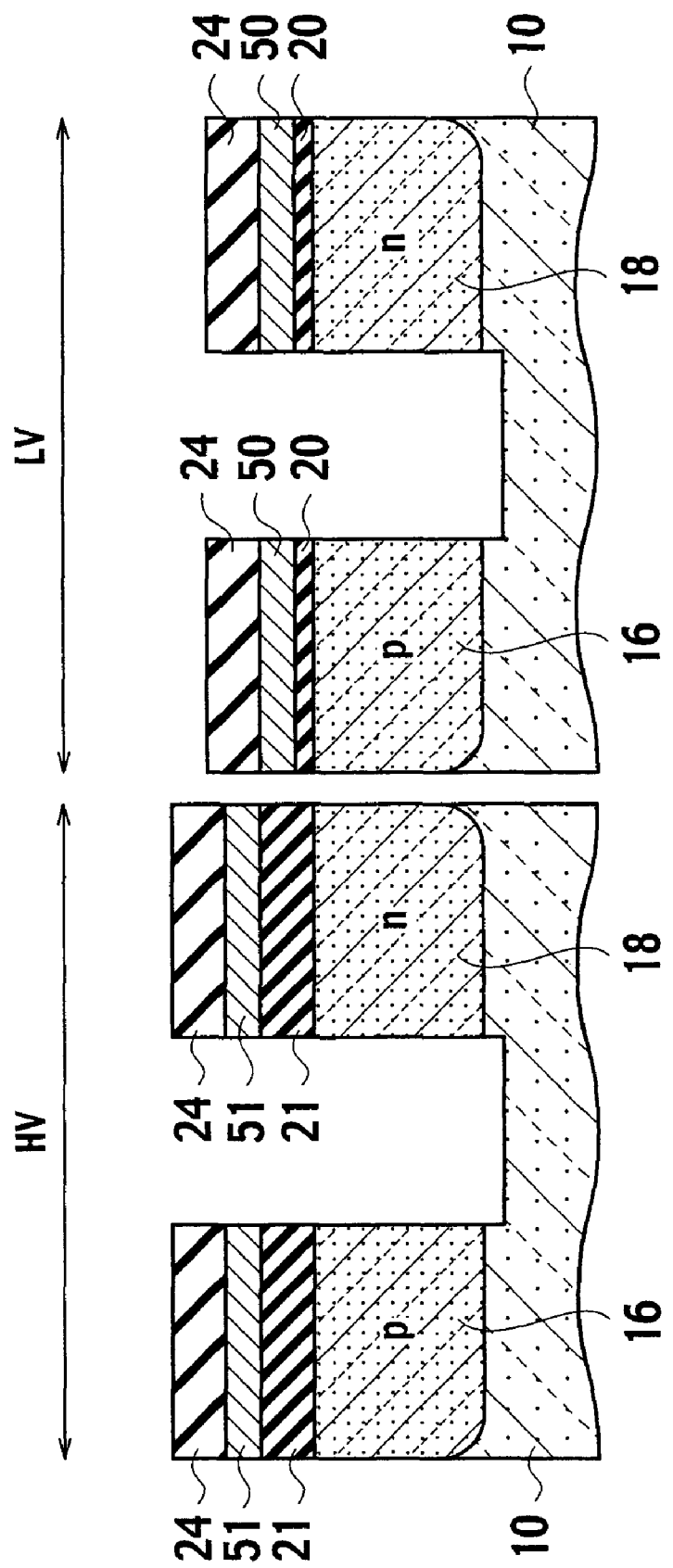

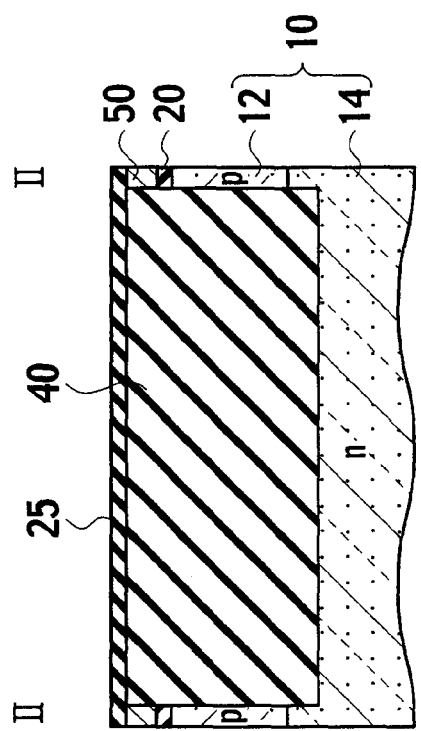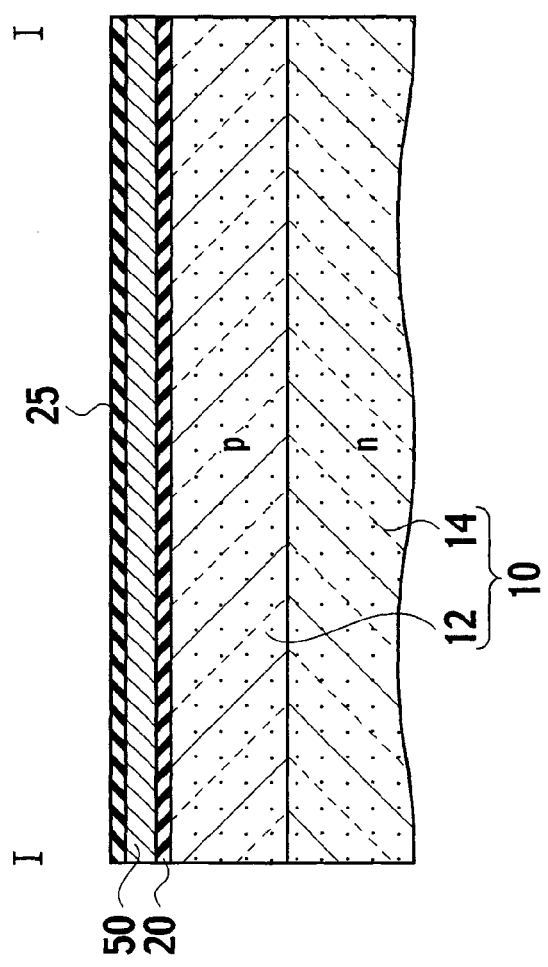
FIG. 11A
FIG. 11B

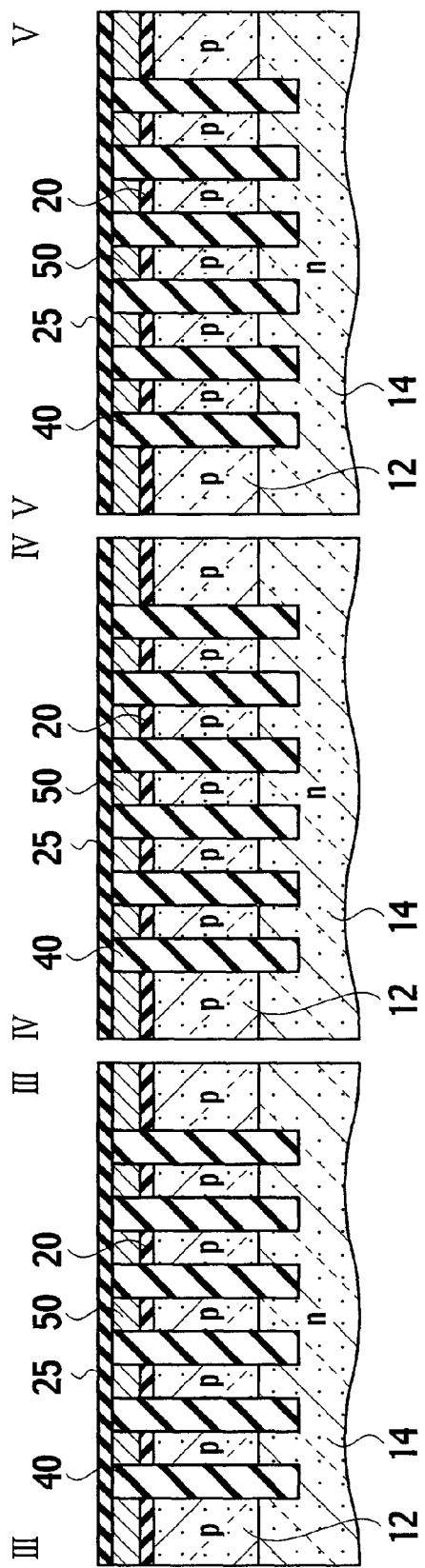

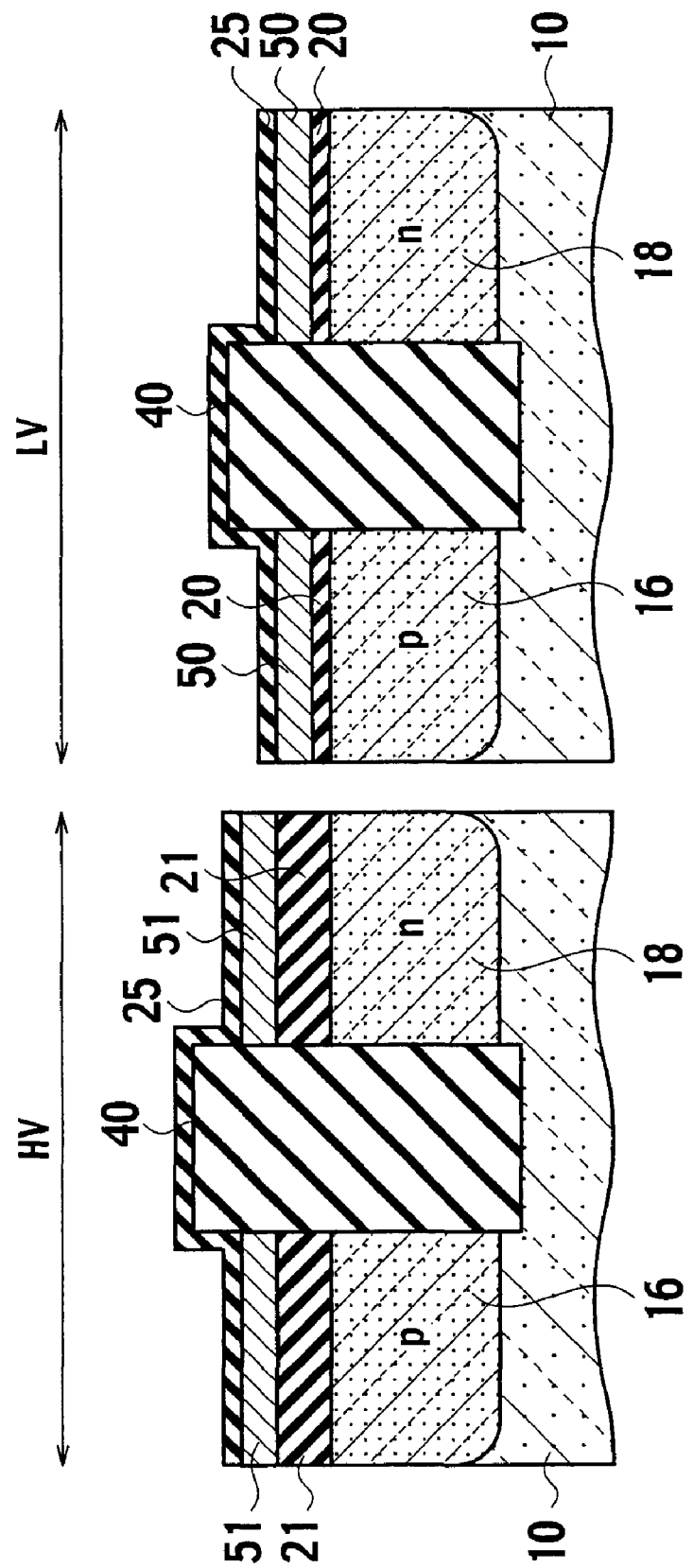

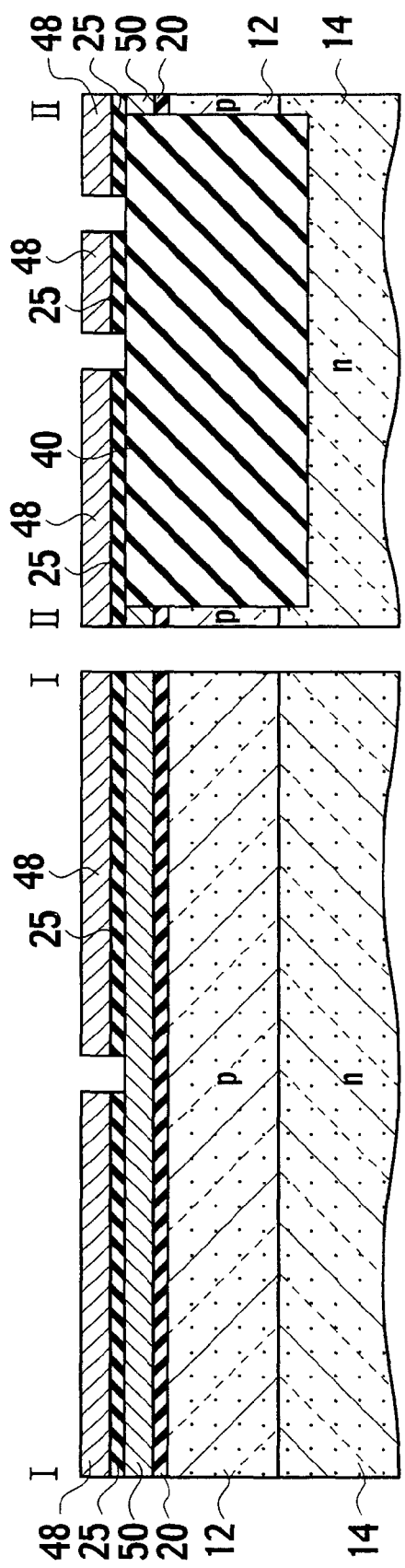

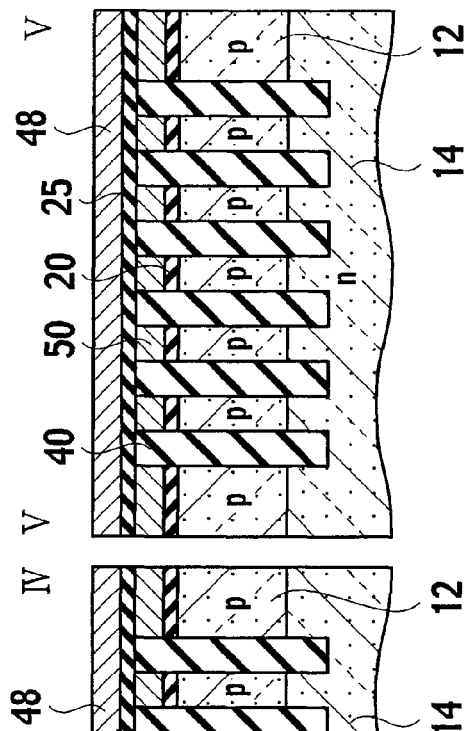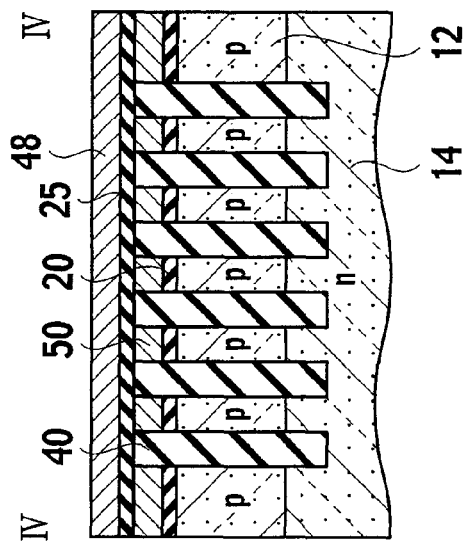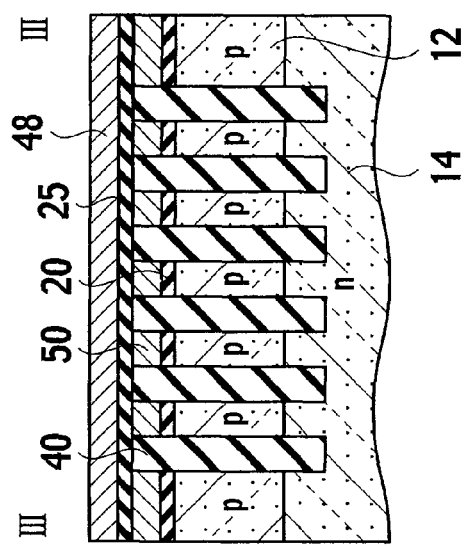

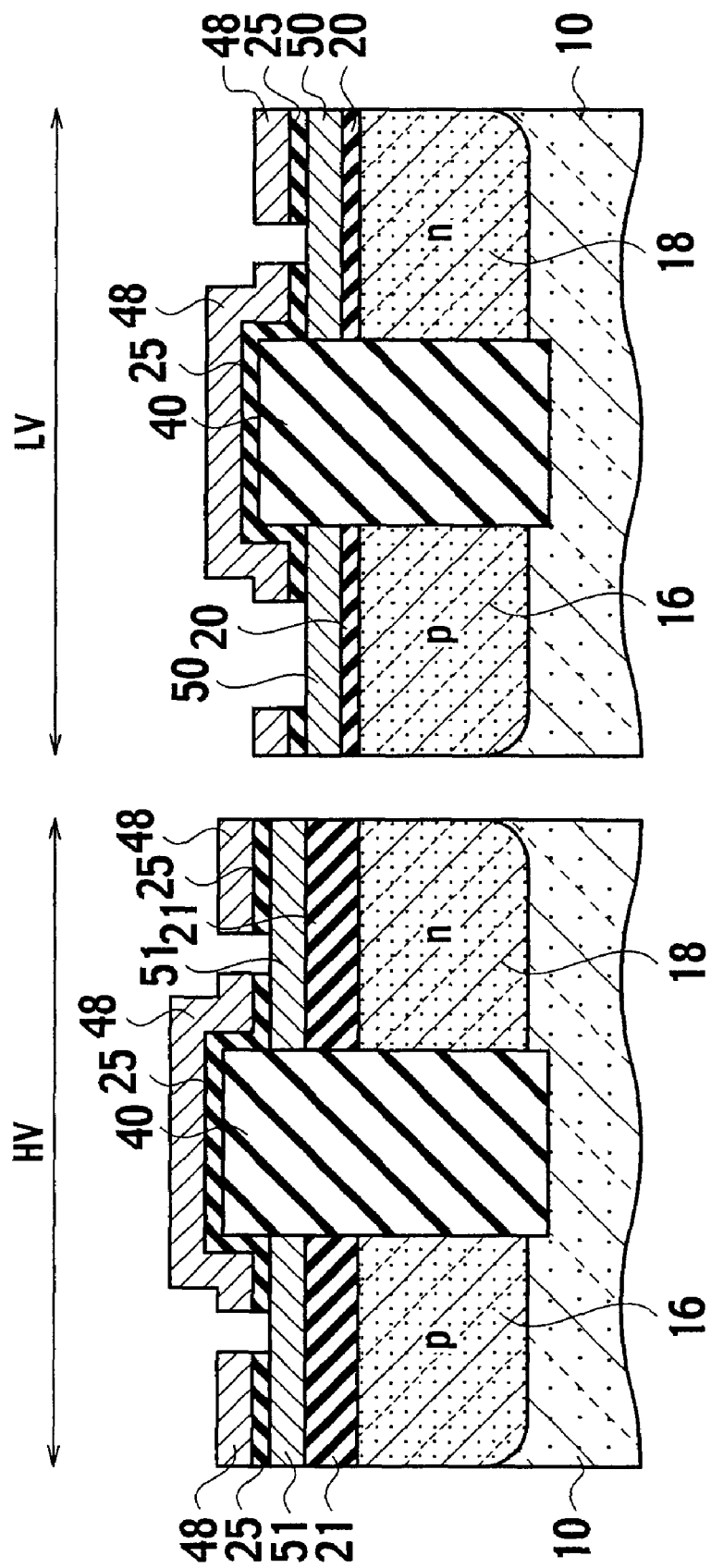

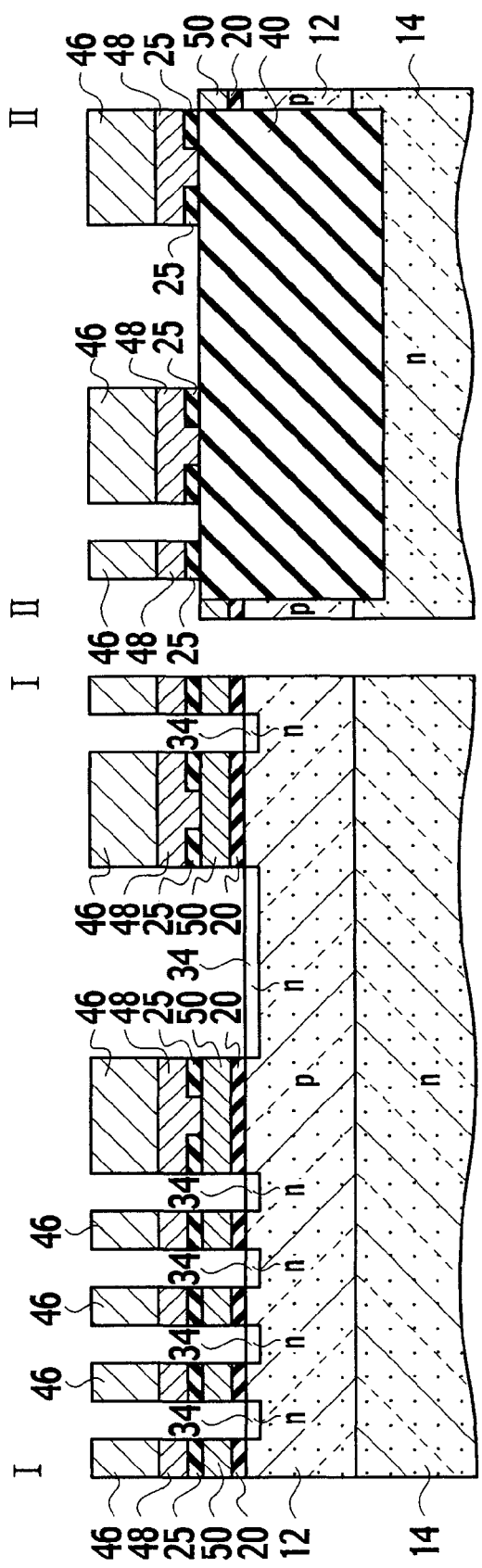

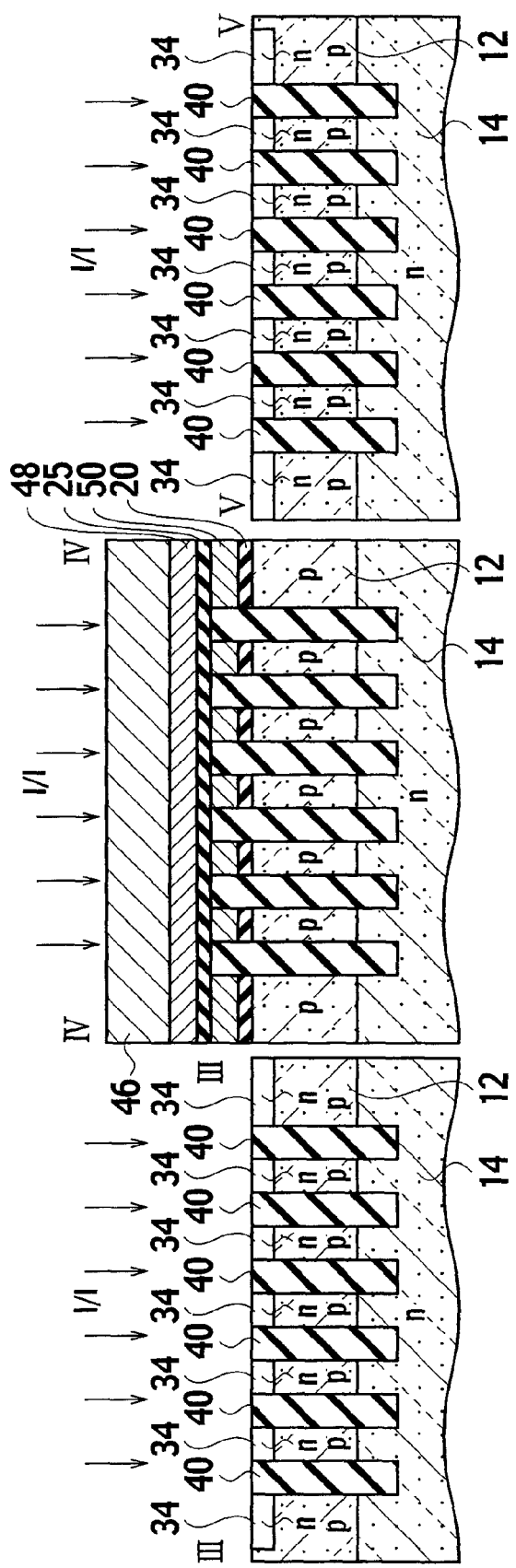

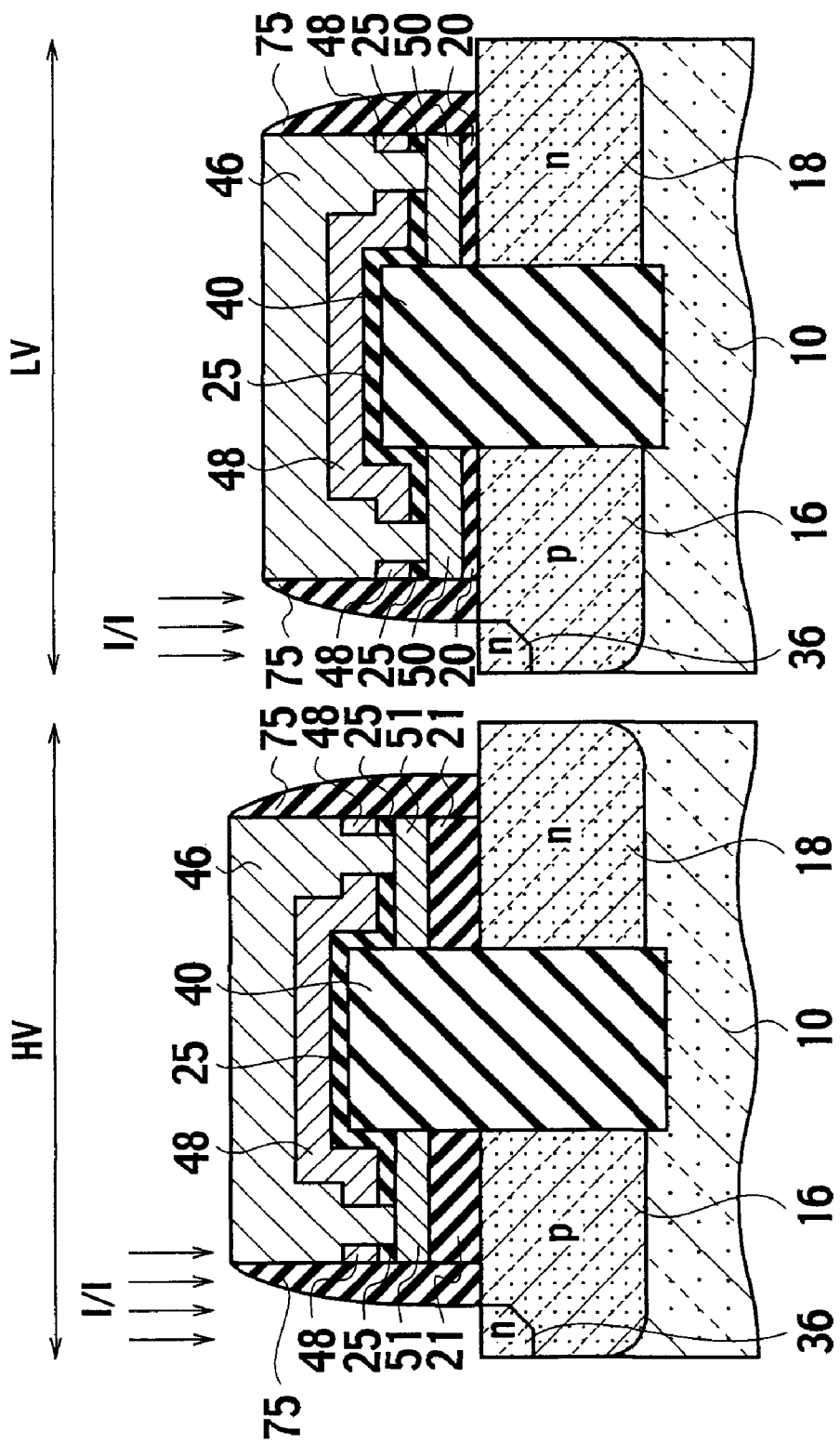

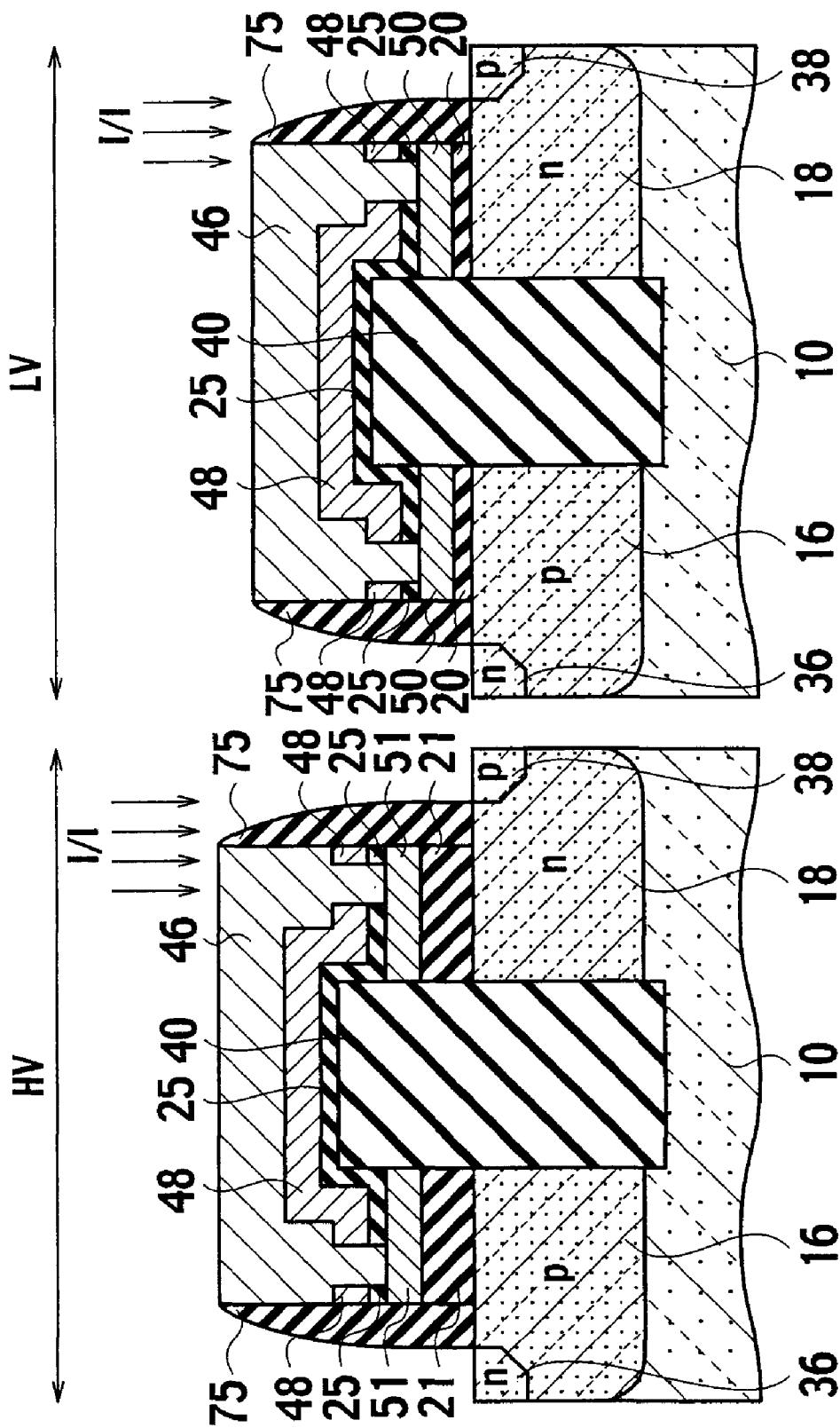

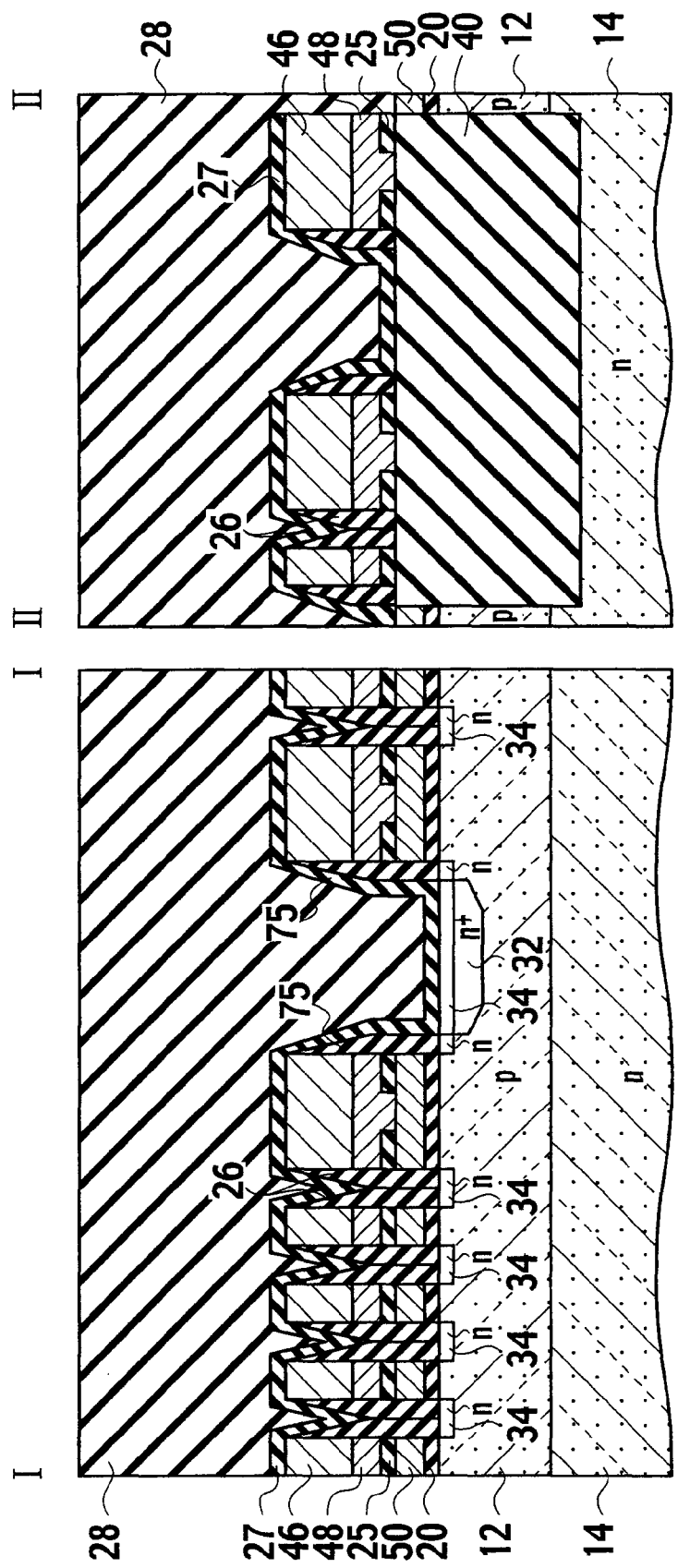

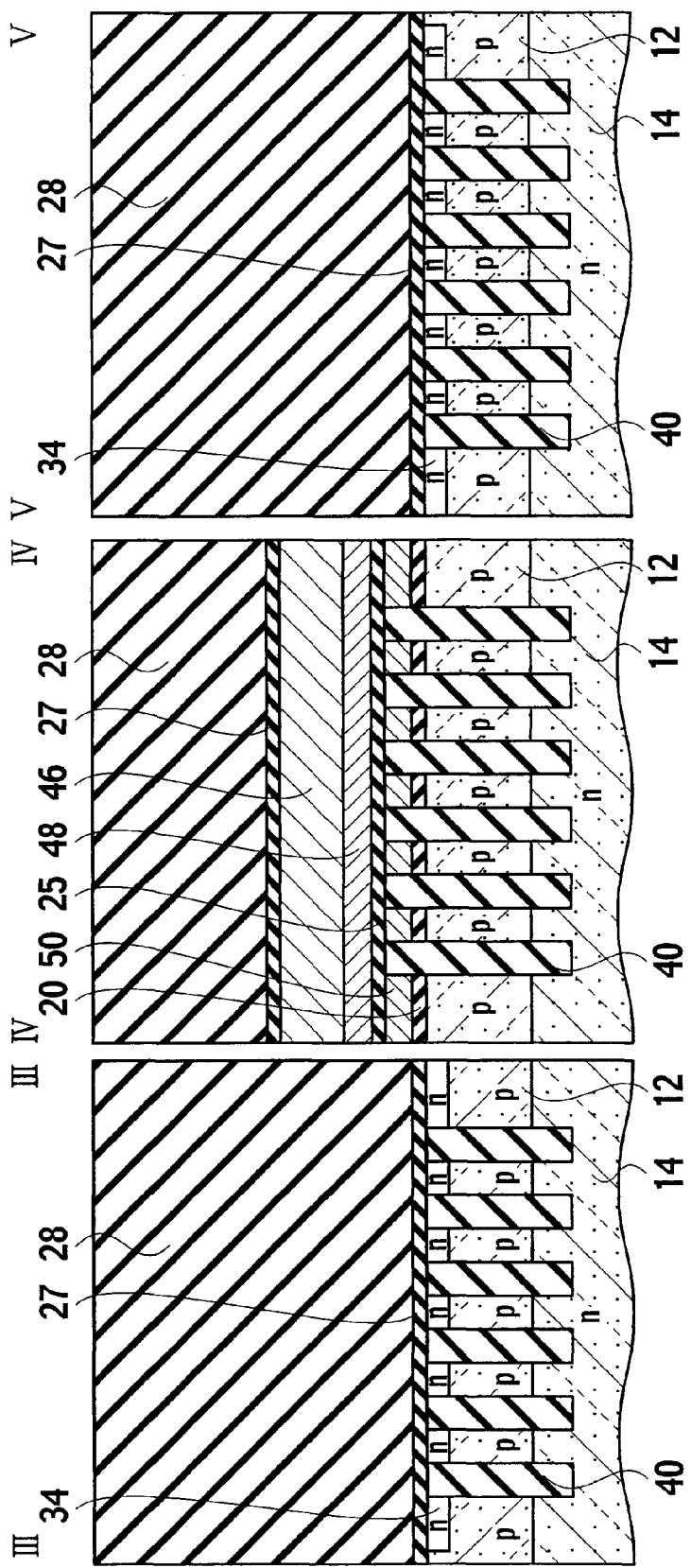

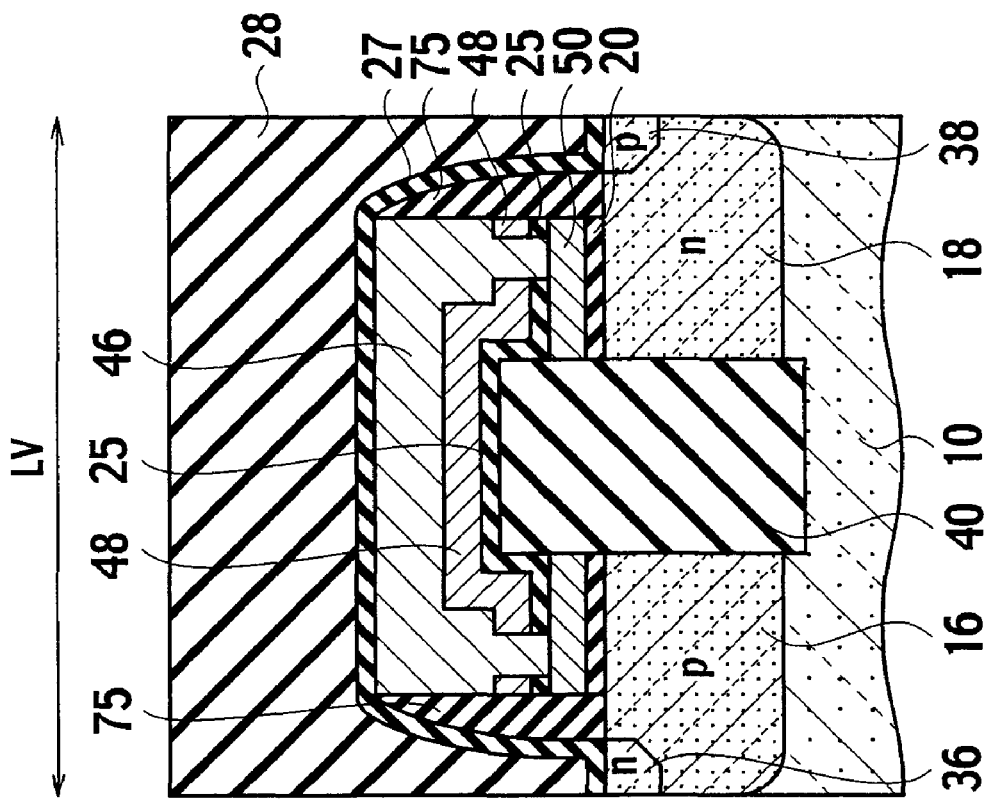
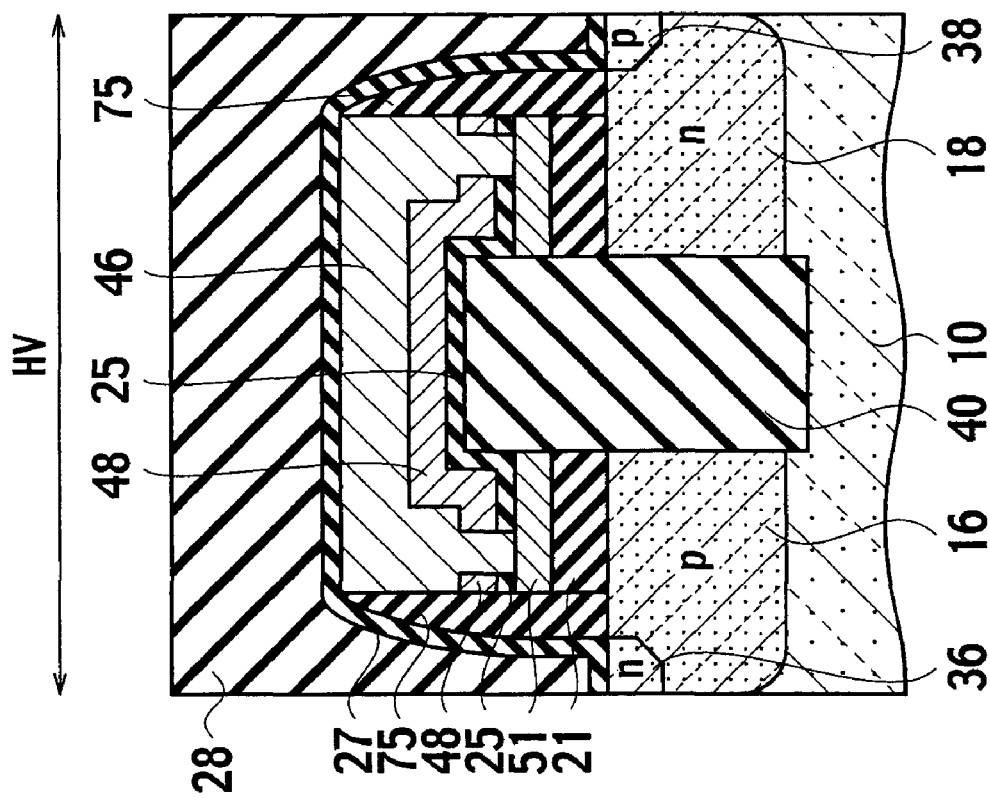
FIG. 26A
FIG. 26B

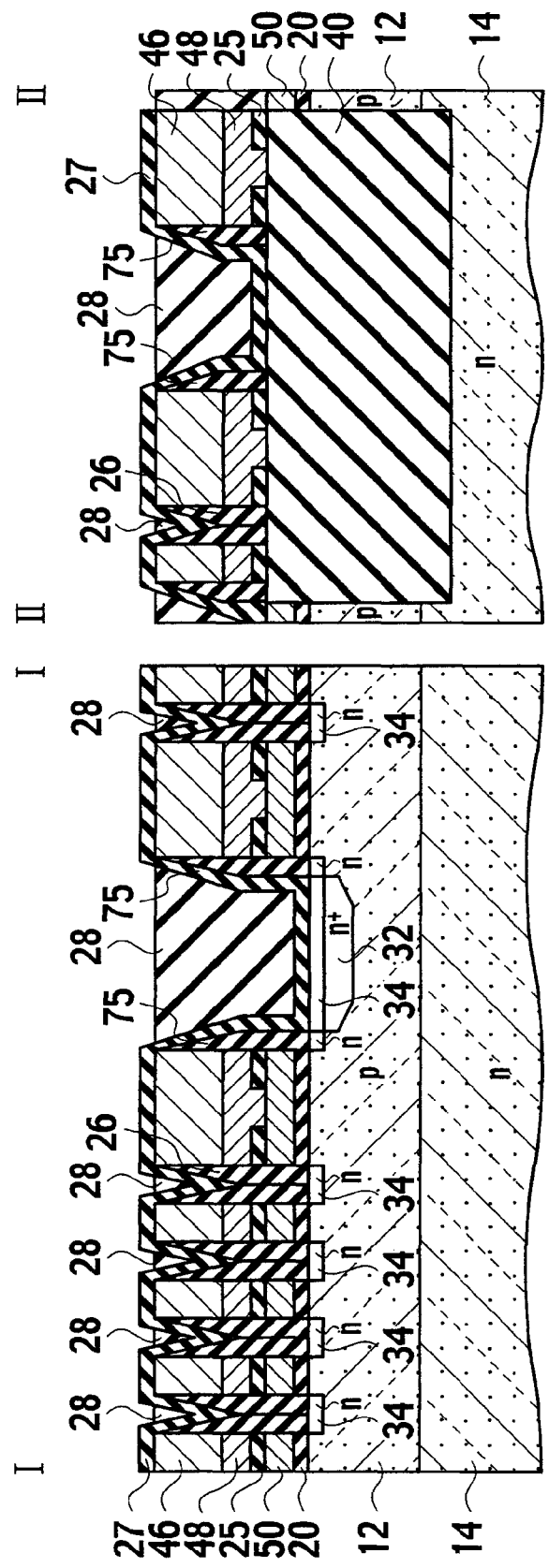

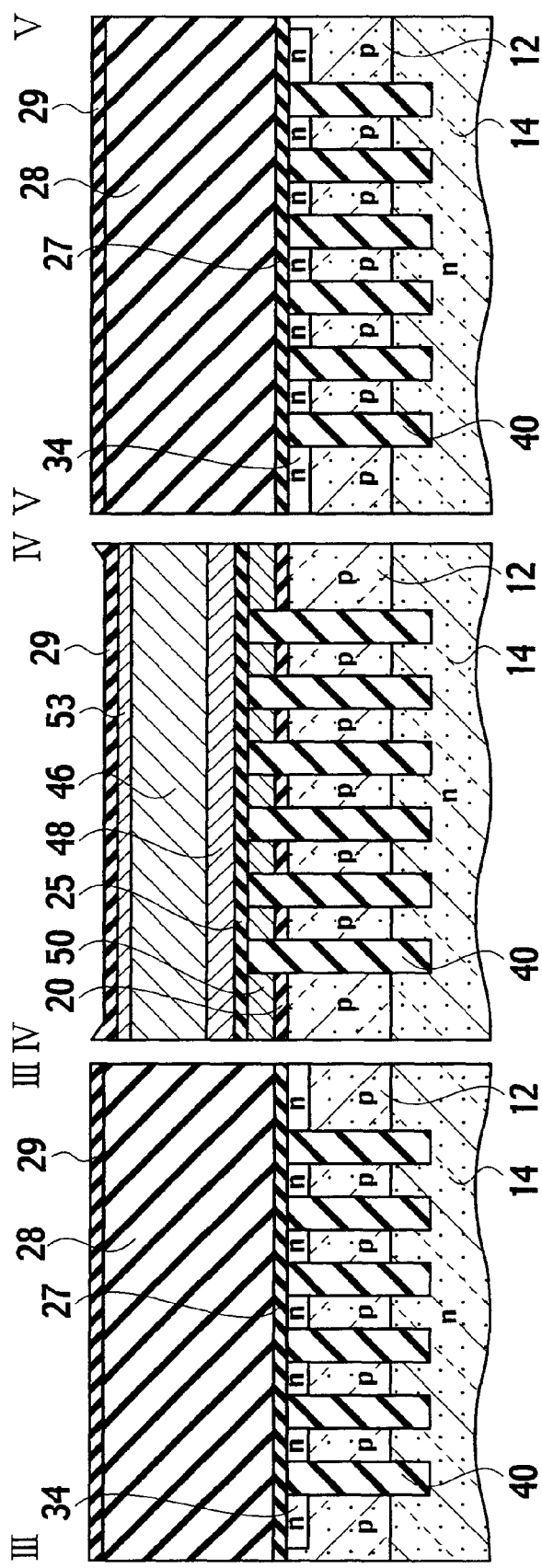

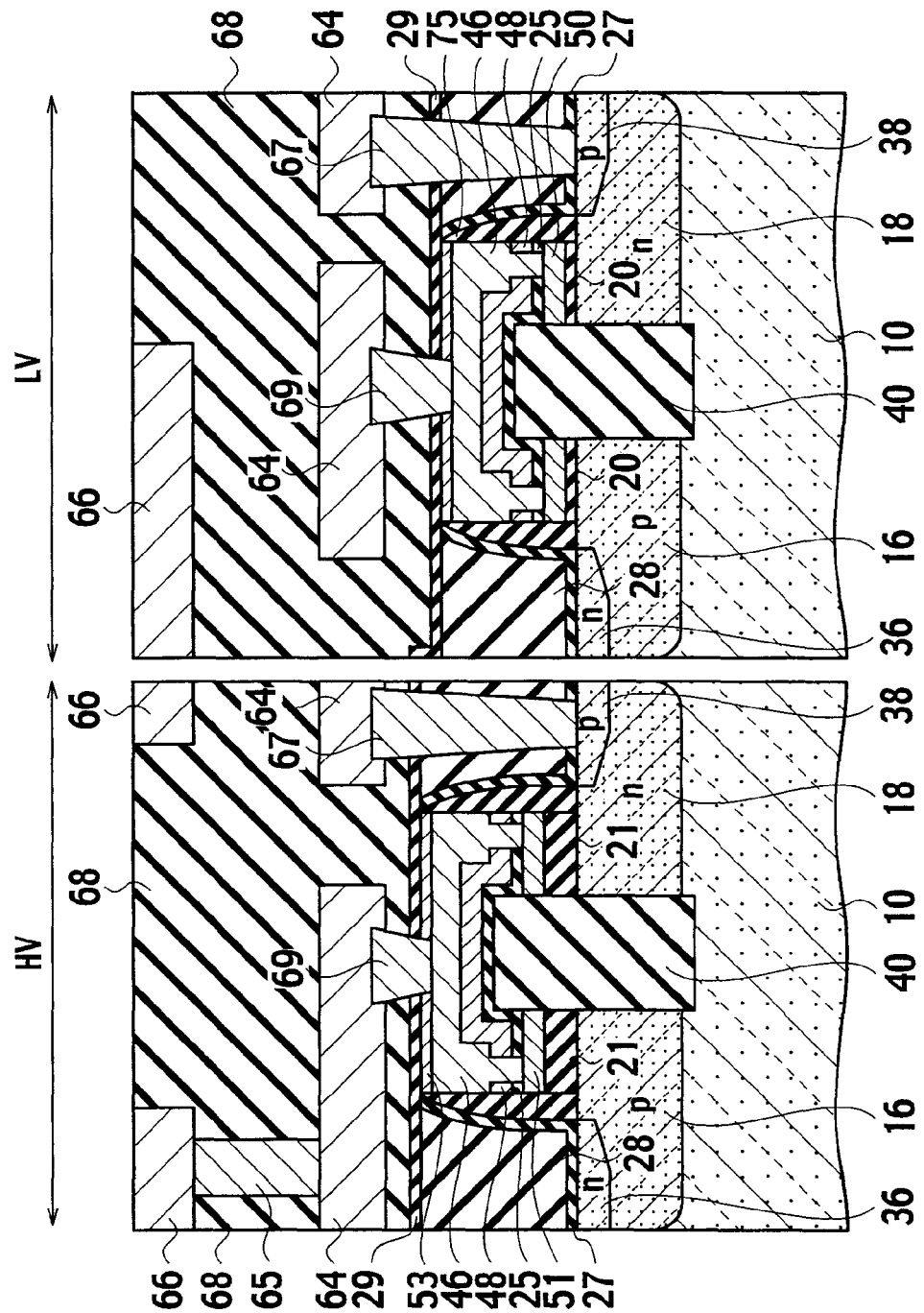

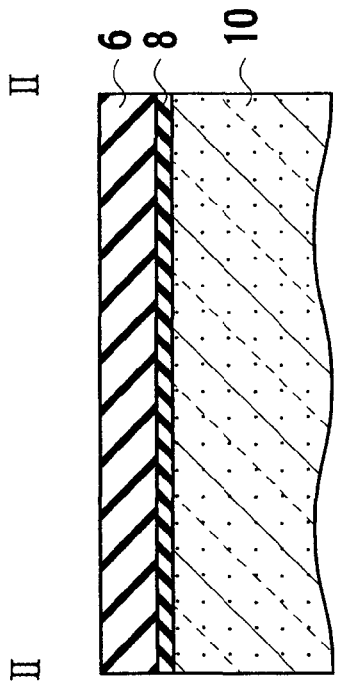
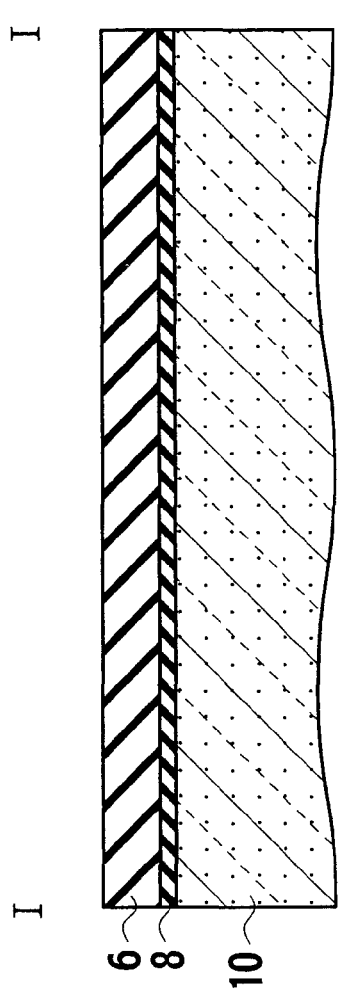

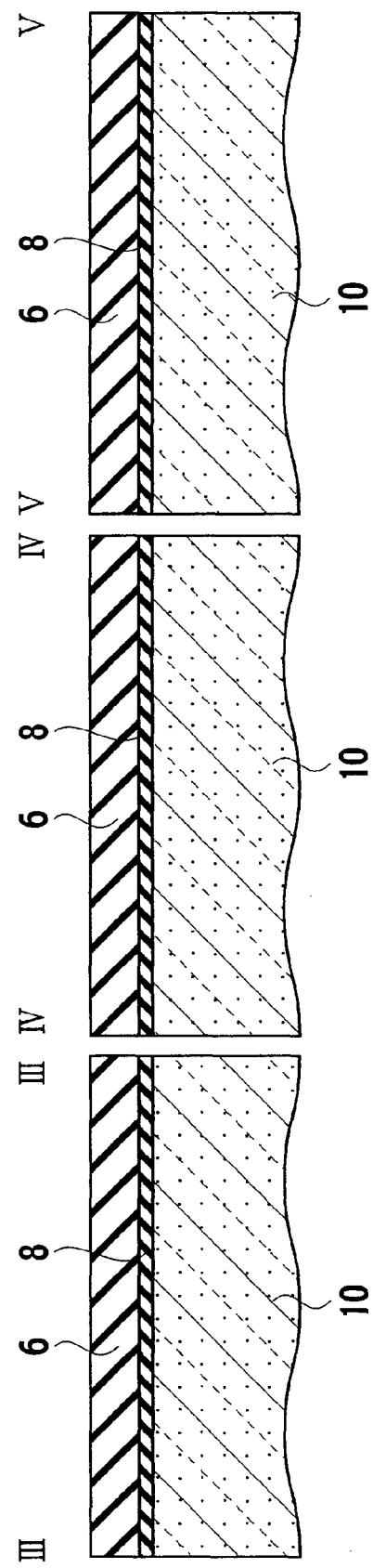

HV

LV

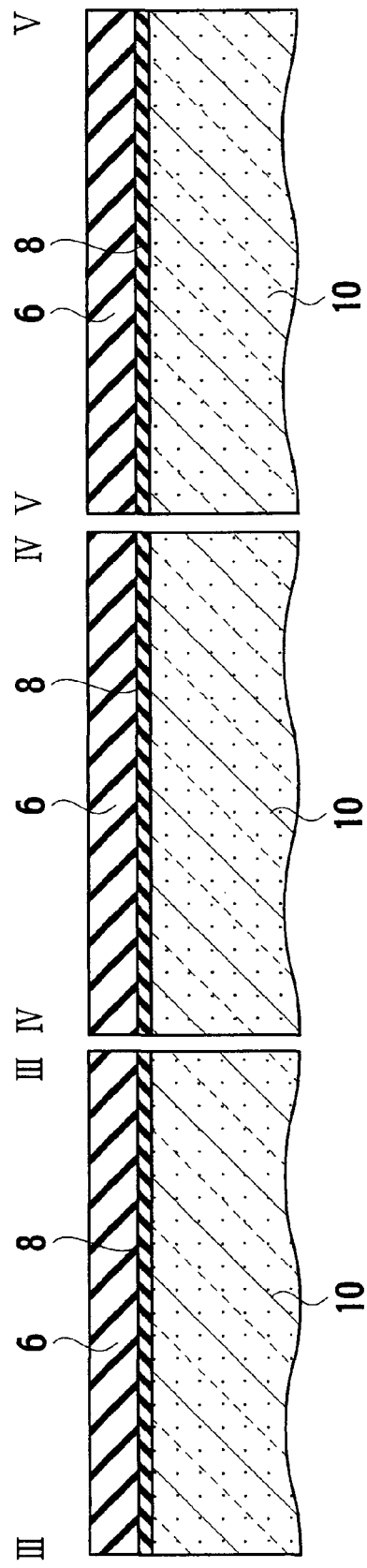

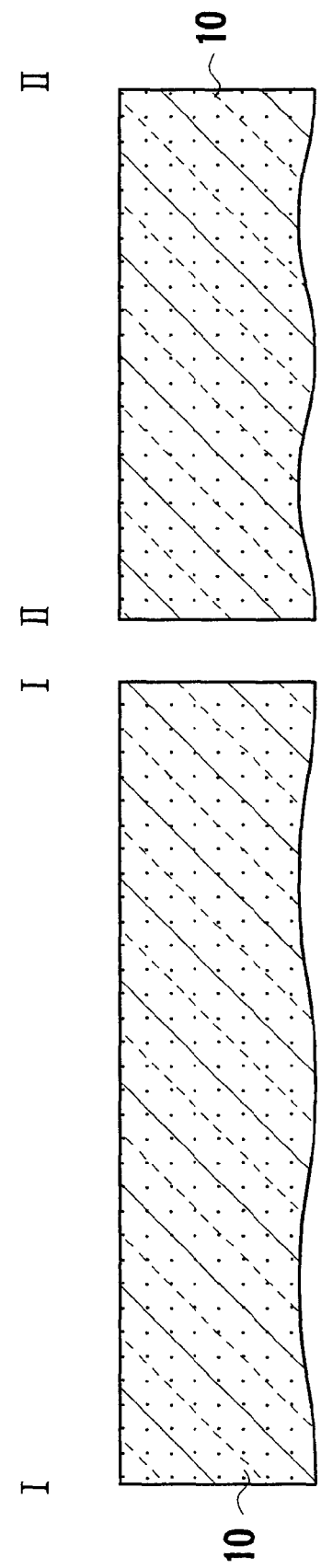

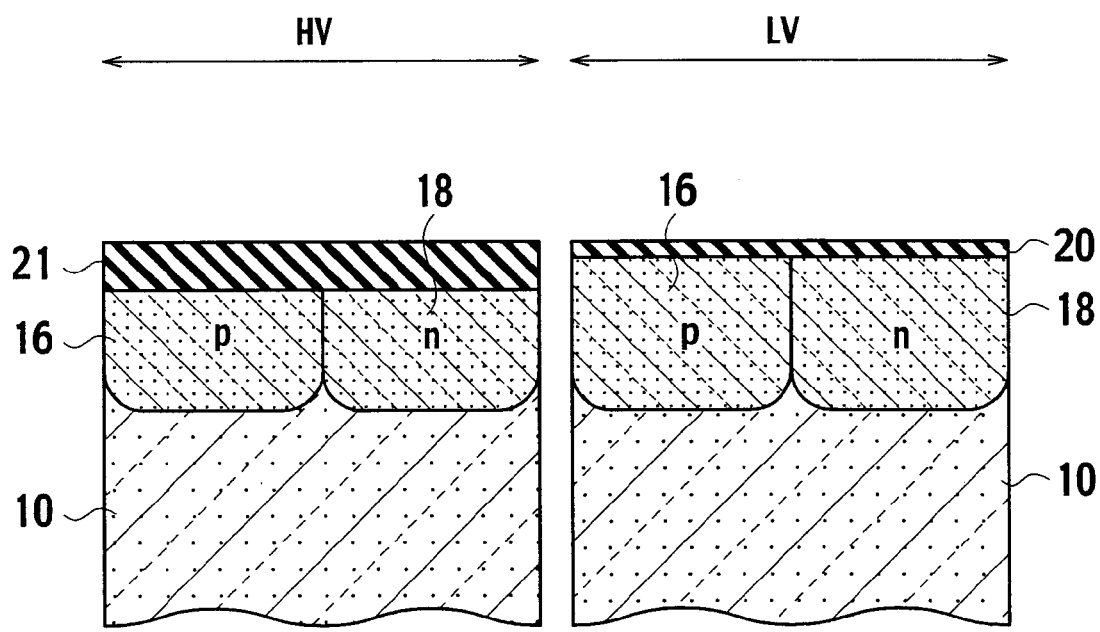

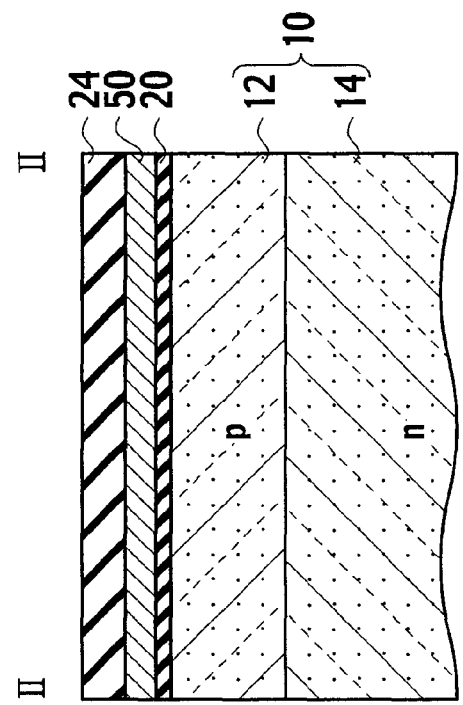
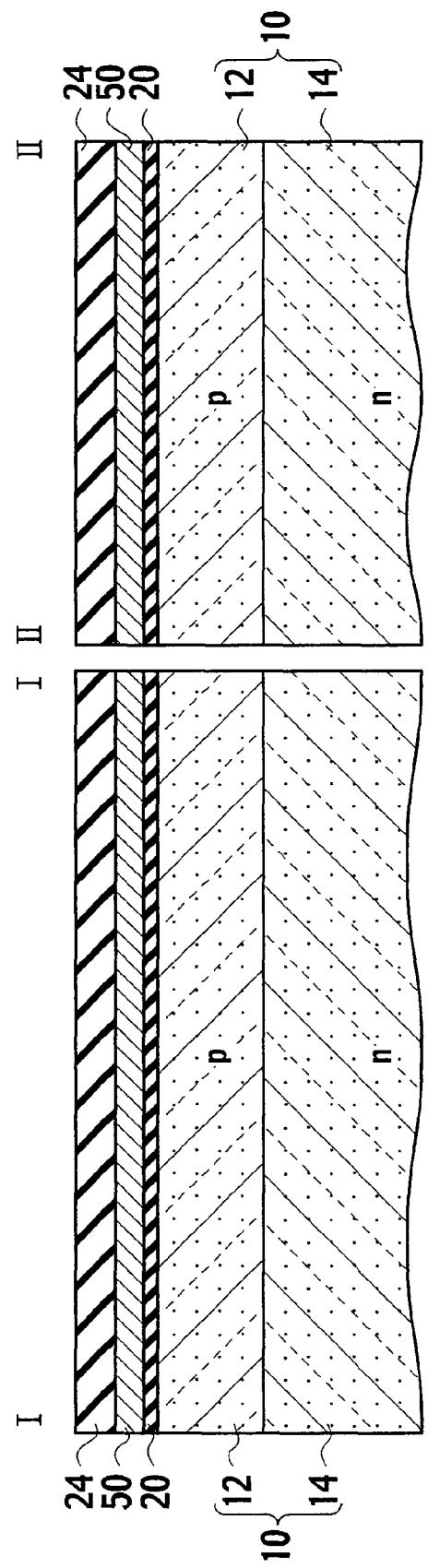

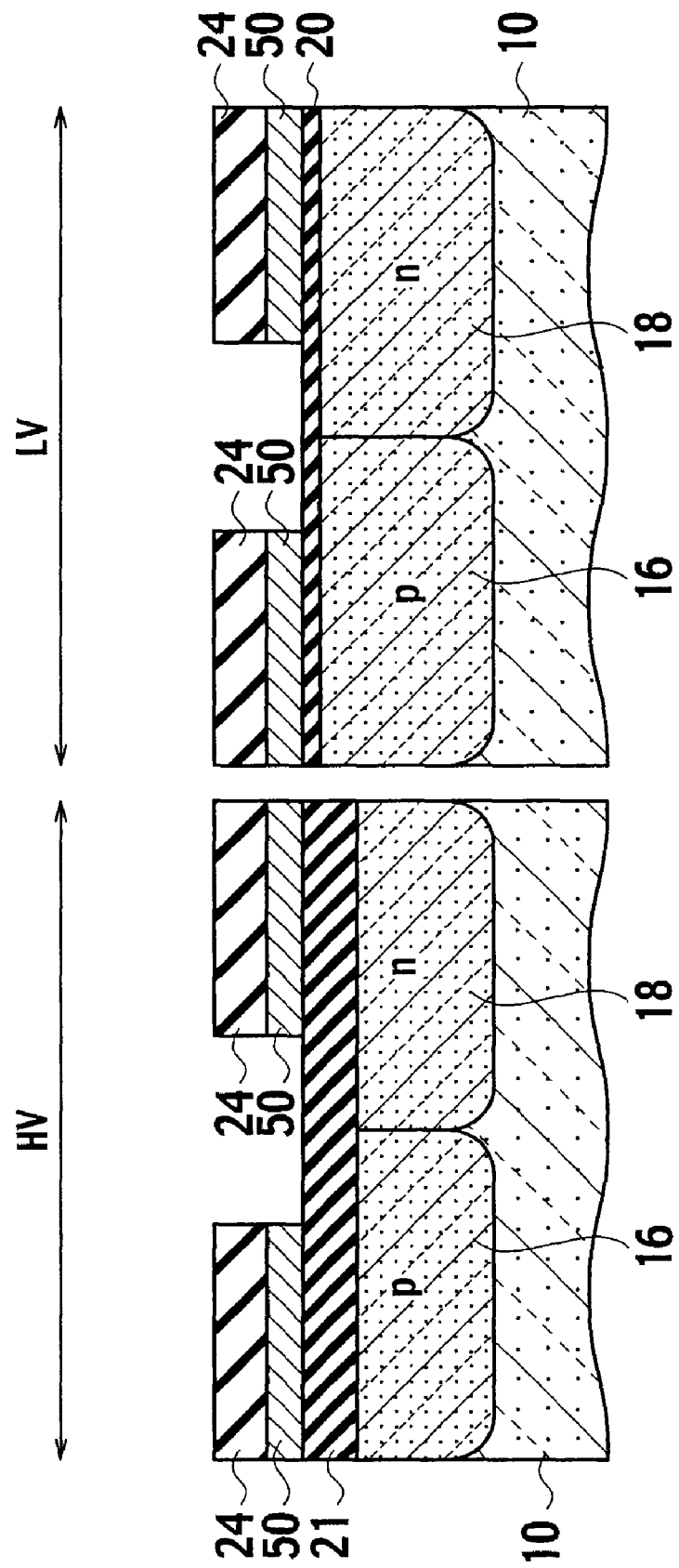
FIG. 51A / FIG. 51B

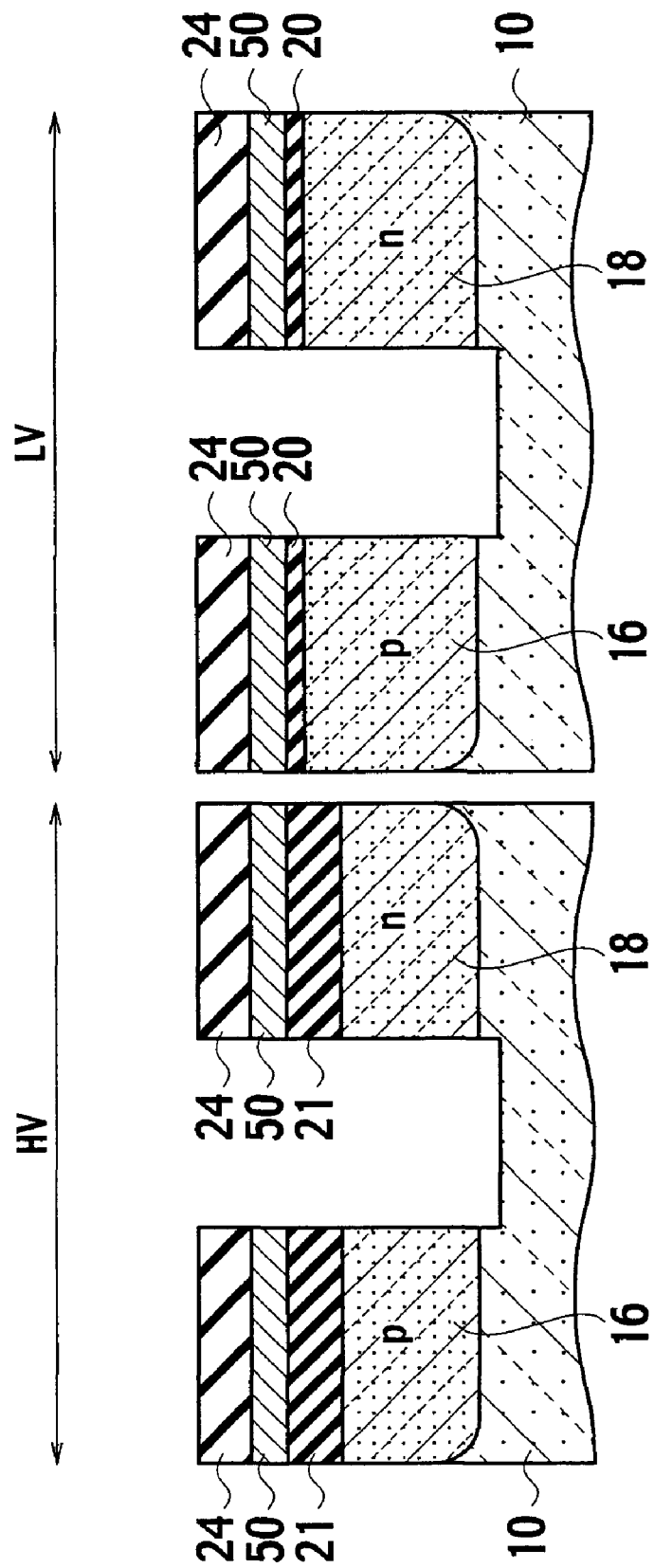

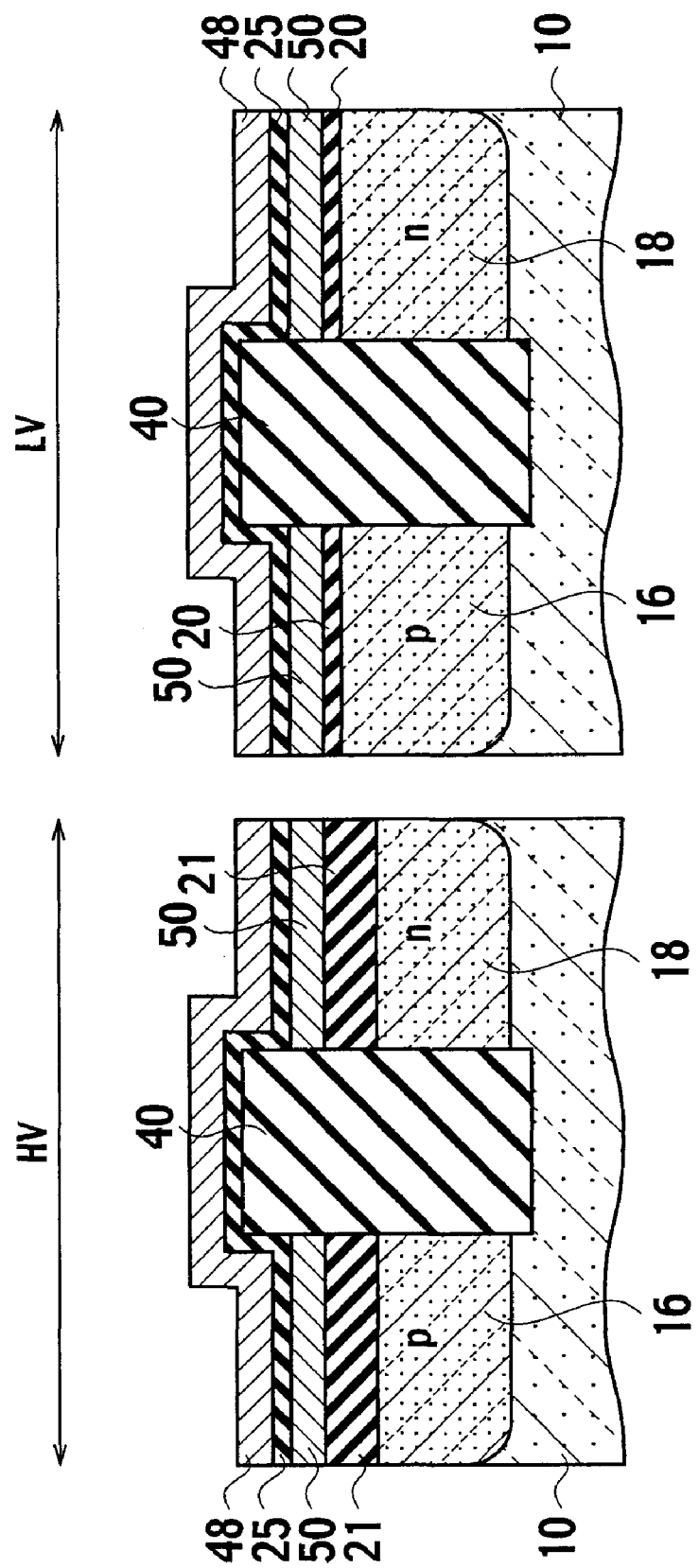

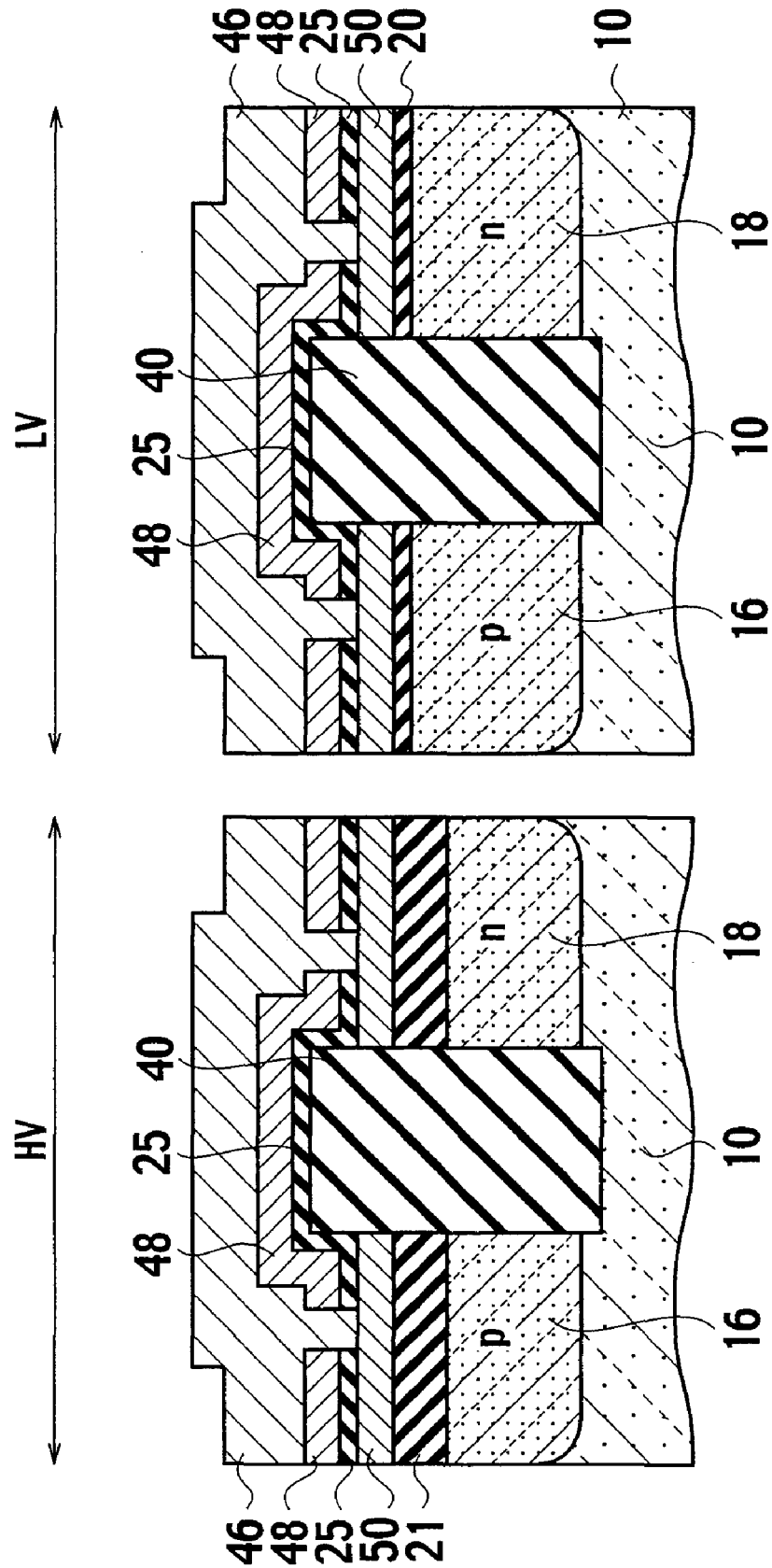

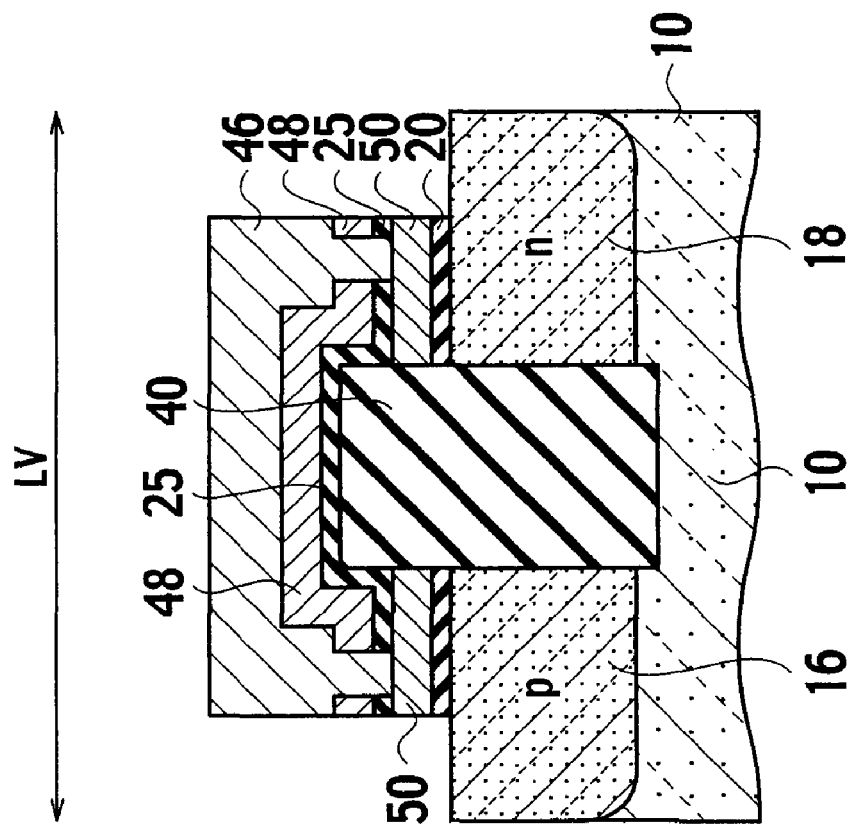
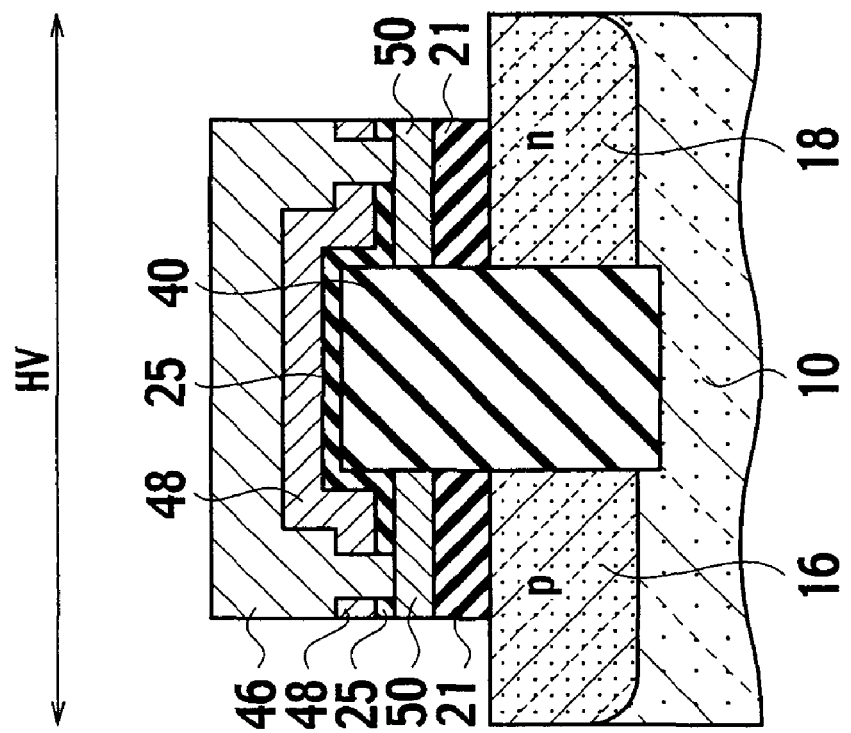

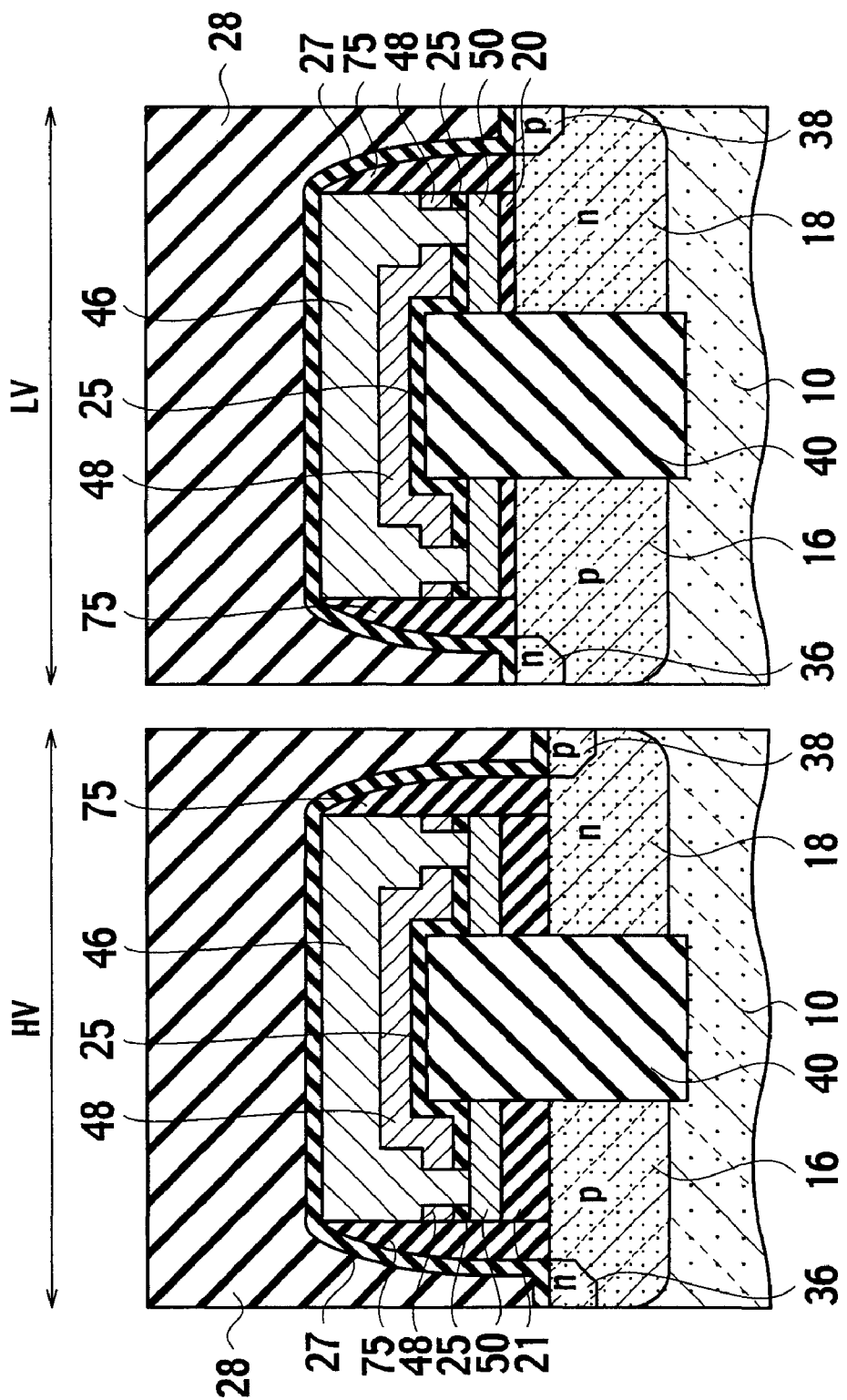

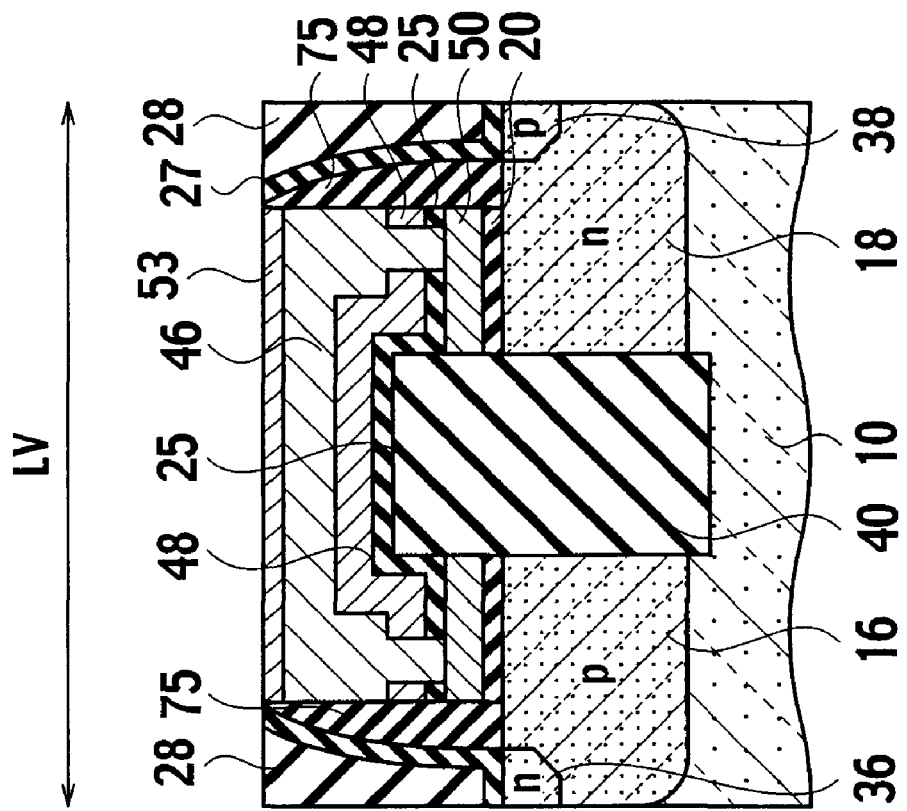
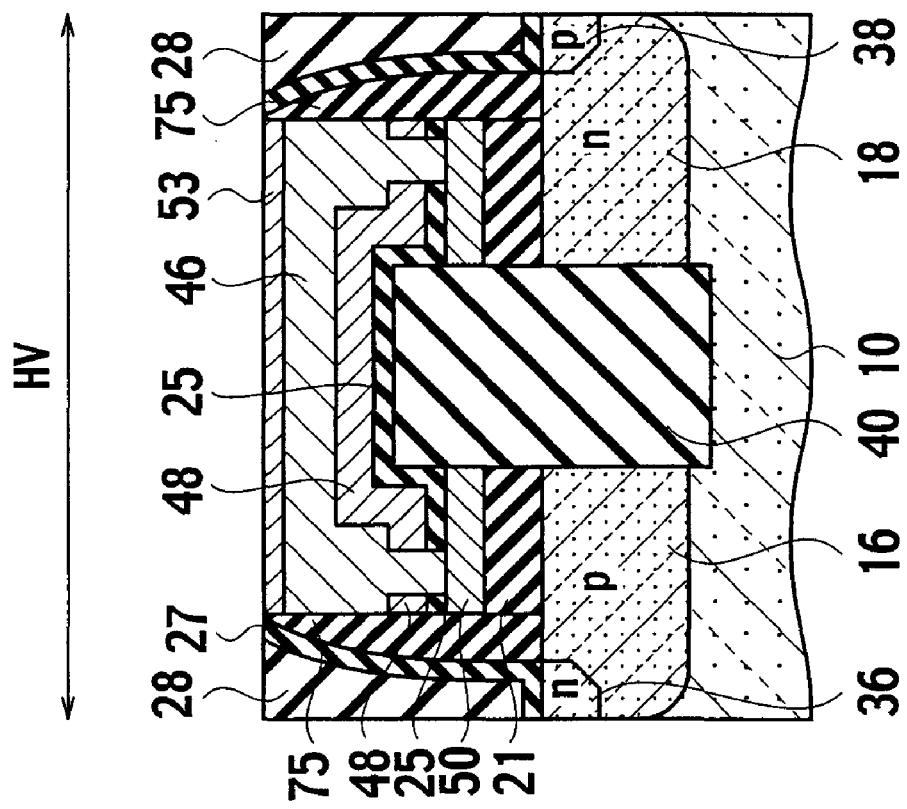

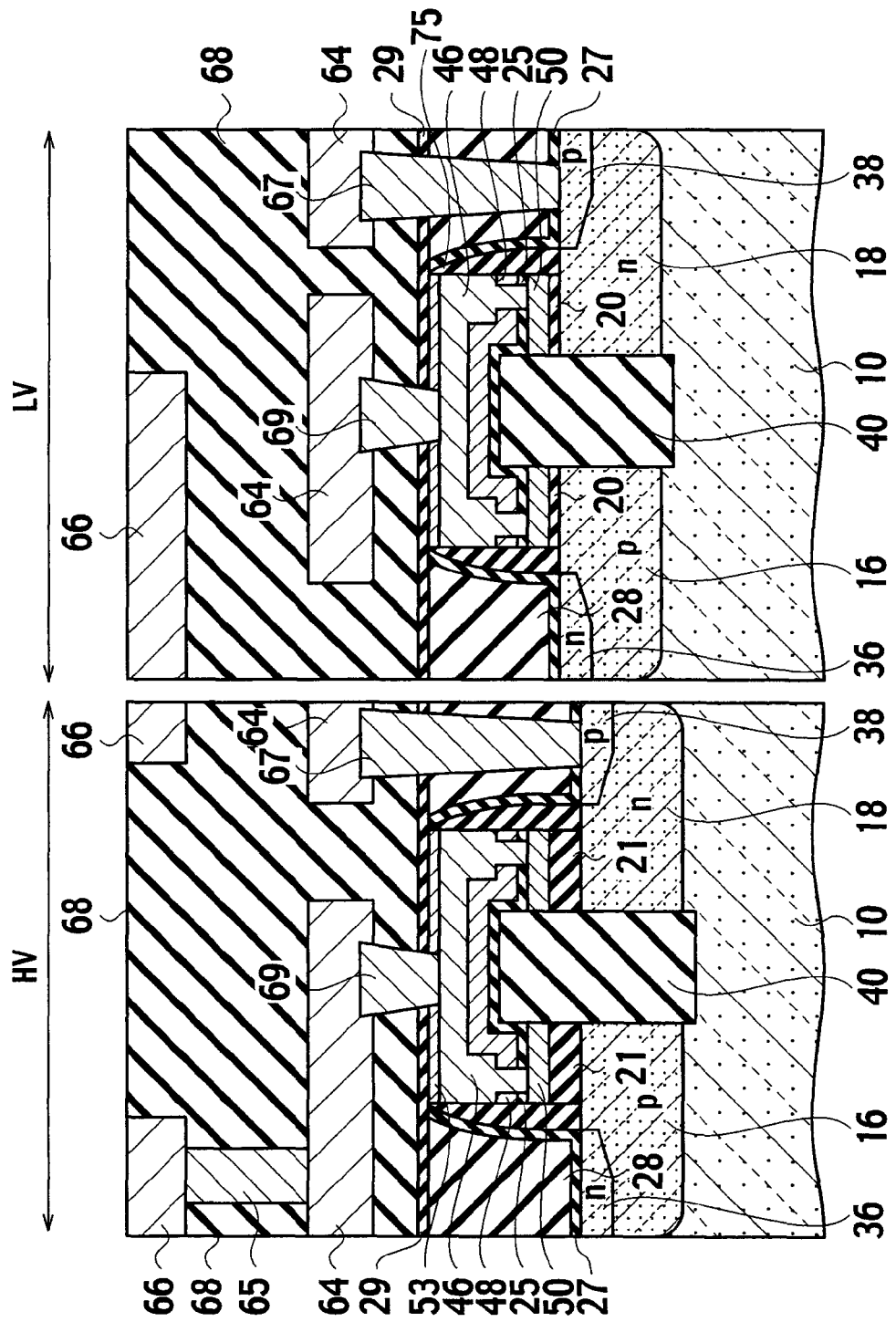

NONVOLATILE SEMICONDUCTOR MEMORY AND FABRICATION METHOD FOR THE SAME

CROSS REFERENCE TO RELATED APPLICATIONS AND INCORPORATION BY REFERENCE

This application is a divisional of U.S. application Ser. No. 11/553,661, filed Oct. 27, 2006 and is based upon and claims the benefit of priority from prior Japanese Patent Applications P2005-330405 filed on Nov. 15, 2005 and; the P2006-288876 filed on Oct. 24, 2006 the entire contents of each of which are incorporated by reference herein.

BACKGROUND OF THE INVENTION

1. Field of the Invention

The present invention relates to a nonvolatile semiconductor memory and fabrication methods for the same. In particular, it relates to the nonvolatile semiconductor memory used as a flash memory.

2. Description of the Related Art

An electrically erasable/writable read-only memory (EEPROM), for example, is known as a nonvolatile semiconductor memory. The EEPROM, more specifically NAND EEPROM, has a memory cell array including memory cells disposed on respective intersections of a plurality of word lines running along the row direction and a plurality of bit lines running along the column direction crossing to the word lines. The memory cells are generally made from stacked gate MOS transistors, each constructed by stacking a floating gate and a control gate, for example.

A NAND flash memory has a structure including a NAND string of a plurality of memory cell transistors connected in series and selector transistors disposed on both sides of the NAND string. Furthermore, element isolating regions are arranged in parallel to the column direction extending along the active regions of memory cells, configuring the memory cell array.

The nonvolatile semiconductor memory such as a flash EEPROM needs a high-voltage circuit region that provides high voltage pulses such as a write-in voltage, an intermediate voltage, and an erase voltage to a memory cell array region. Meanwhile, there is a low voltage circuit region required to operate at a high speed at a normal low voltage.

However, it is advantageous to use the low voltage transistors with enhanced driving capability operating at high-speed performance in the low voltage circuit region. In the low voltage circuit region of the flash EEPROM capable of operating at a low voltage, ensuring driving capability of transistors is particularly necessary.

Meanwhile, it is important to enhance the write-in and the read-out speed by lowering the resistance of word lines in a memory cell array region as the capacity of the memory cell array increases. A means for forming a metallic silicide film for word lines in the NAND flash memory may be used for suppressing delay in the word lines emanating from increased capacity of the memory and enhancing the operating speed.

In the low voltage circuit region, transistors with enhanced driving capability operating at high-speed performance are required. Furthermore, forming metallic salicide films on the gates and diffusion layers of the memory cell transistors is a method for decreasing the resistance of word lines in memory cell regions of a large capacity of memory cell array and thereby increasing write-in and read-out speed performance.

However, according to the nonvolatile semiconductor memory, such as a flash EEPROM, when metallic salicide films are formed on the gates and the diffusion layers of the transistors in all of the circuit regions as with CMOS logic circuits, suppression of increasing of a value of the junction leakage current and suppression of decreasing of a value of the junction breakdown voltage and the surface breakdown voltage is required for the high voltage transistors within the high voltage circuit region, which allows generation of the high voltage greater than the value of 15V, such as the write-in voltage $V_{pgm}$ or the erase voltage $V_{erase}$ and so on.

Moreover, when metallic salicide films are formed on the gates and the diffusion layers in all of the circuit regions as with CMOS logic circuits, the value of resistance in the resistor elements may decrease, the resistor element area may increase, and the value of the gate breakdown voltage for transistors in a high voltage peripheral circuit may decrease.

As a solution, a method for forming metallic salicide films in selected areas may be used. However, the method brings about a difficulty in processing due to two types of areas: an area with the metallic salicide film and an area without the metallic salicide film.

In particular, since the NAND type flash memory requires the higher operational voltage than the AND type flash memory and the NOR type flash memory, problems with the junction leakage current and the junction breakdown voltage are more remarkable.

A nonvolatile semiconductor memory with a lowered resistance of word lines and having a capability of reading out from the memory cell transistor in a shorter time, which is attained by forming grooves on control gates extending along the word line direction, forming metal interconnects on an interlayer insulating film, embedding metal interconnects in the grooves, and thereby decreasing the value of the resistance of polycide word lines, and a fabrication method thereof have been disclosed (e.g., see Japanese Patent Application Laid-open No. 2000-100975).

A semiconductor memory capable of operating at high speed performance, which is attained by forming a silicide layer on gate electrodes without forming a silicide layer on the impurity diffused layers of memory cell transistors and then forming a silicide layer on gate electrodes and diffusion layers of transistors in a logic circuit region, and a fabrication method thereof have been disclosed (e.g., see Japanese Patent Application Laid-open No. 2003-347511).

Furthermore, a nonvolatile semiconductor memory including peripheral transistors, each characteristic of lowered resistivity of the wirings for the gate electrodes and the source/drain electrodes in the peripheral transistors, and memory cells occupying a smaller area, which is attained by forming a metallic silicide layer on both the diffusion layer of memory cell transistors and peripheral transistors and also on the gate electrode of the peripheral transistors, and further by providing memory cell transistors with a self-aligned contact structure, is disclosed (e.g., see Japanese Patent Application Laid-open No. 2002-217319).

SUMMARY OF THE INVENTION

An aspect of the present invention inheres in a nonvolatile semiconductor memory which includes a cell array region including a memory cell transistor, which includes first source and drain regions, a first tunneling insulating film formed on a semiconductor region between the first source and drain regions, a first floating gate electrode layer formed on the first tunneling insulating film, a first inter-gate insulating film formed on the first floating gate electrode layer, a first control gate electrode layer formed on the first inter-gate insulating film, a second control gate electrode layer formed on the first control gate electrode layer, and a first metallic silicide film electrically connected to the second control gate electrode layer; a high voltage circuit region that is disposed around the cell array region and includes a high voltage transistor, which includes second source and drain regions, a high voltage gate insulating film formed on a semiconductor region between the second source and drain regions, a high voltage gate electrode layer formed on the high voltage gate insulating film, a second inter-gate insulating film having an aperture formed on the high voltage gate electrode layer, a third control gate electrode layer formed on the second inter-gate insulating film, a fourth control gate electrode layer formed on the third control gate electrode layer, and a second metallic silicide film electrically connected to the fourth control gate electrode layer; a low voltage circuit region that is disposed in a different area from the high voltage circuit region, which is around the cell array region, and includes a low voltage transistor that includes third source and drain regions, a second tunneling insulating film formed on a semiconductor region between the third source and drain regions, a second floating gate electrode layer formed on the second tunneling insulating film, a third inter-gate insulating film having an aperture formed on the second floating gate electrode layer, a fifth control gate electrode layer formed on the third inter-gate insulating film, a sixth control gate electrode layer formed on the fifth control gate electrode layer, and a third metallic silicide film electrically connected to the sixth control gate electrode layer; and a liner insulating film directly disposed on the first source and drain regions, the second source and drain regions, and the third source and drain regions.

Another aspect of the present invention inheres in a nonvolatile semiconductor memory which includes a cell array region including a memory cell transistor, which includes first source and drain regions, a first tunneling insulating film formed on a semiconductor region between the first source and drain regions, a first floating gate electrode layer formed on the first tunneling insulating film, a first inter-gate insulating film formed on the first floating gate electrode layer, a first control gate electrode layer formed on the first inter-gate insulating film, a second control gate electrode layer formed on the first control gate electrode layer, and a first metallic silicide film electrically connected to the second control gate electrode layer; a high voltage circuit region that is disposed around the cell array region, in a recessed semiconductor substrate having a lower surface than the semiconductor substrate disposing the first source and drain regions, and includes a high voltage transistor, which includes second source and drain regions, a high voltage gate insulating film formed on a semiconductor region between the second source and drain regions, a second floating gate electrode layer formed on the high voltage gate insulating film, a second inter-gate insulating film having an aperture formed on the second floating gate electrode layer, a third control gate electrode layer formed on the second inter-gate insulating film, a fourth control gate electrode layer formed on the third control gate electrode layer, and a second metallic silicide film electrically connected to the fourth control gate electrode layer; a low voltage circuit region that is disposed in a different area from the high voltage circuit region, which is around the cell array region, and includes a low voltage transistor that includes third source and drain regions, a second tunneling insulating film formed on a semiconductor region between the third source and drain regions, a third floating gate electrode layer formed on the second tunneling insulating film, a third inter-gate insulating film having an aperture formed on the third floating gate electrode layer, a fifth control gate electrode layer formed on the third inter-gate insulating film, a sixth control gate electrode layer formed on the fifth control gate electrode layer, and a third metallic silicide film electrically connected to the sixth control gate electrode layer; and a liner insulating film directly disposed on the first source and drain regions, the second source and drain regions, and the third source and drain regions. The thickness of the high voltage gate insulating film is greater than thickness of the first and the second tunneling insulating film, and the surface of the high voltage gate insulating film and surface of the first and the second tunneling insulating film are flat.

Another aspect of the present invention inheres in a fabrication method for a nonvolatile semiconductor memory, which includes a cell array region, a high-voltage circuit region, and a low-voltage circuit region. The fabrication method includes depositing a tunneling insulating film on a semiconductor substrate, a floating gate electrode layer on the tunneling insulating film, and a first stopper film on the floating gate electrode layer in the cell array region, the high-voltage circuit region, and the low-voltage circuit region; removing the first stopper film and the floating gate electrode layer in the high voltage region; depositing a high voltage gate insulating film on the semiconductor substrate, a high voltage gate electrode layer on the high voltage gate insulating film, and a second stopper film on the high voltage gate electrode layer in the high voltage region; removing the second stopper film, the floating gate electrode layer, and the high voltage gate electrode layer in a prospective region, in which element isolating regions are to be formed, in the cell array region, the high-voltage circuit region, and the low-voltage circuit region; removing the high voltage gate insulating film, and the tunneling insulating film in the prospective region in which element isolating regions are to be formed, in the cell array region, the high-voltage circuit region, and the low-voltage circuit region; etching the semiconductor substrate until a depth at which the element isolating regions are to be formed and forming etching grooves in the semiconductor substrate in the cell array region, the high-voltage circuit region, and the low-voltage circuit region; depositing an insulating film on the entire device surface including the cell array region, the high voltage transistor region, and the low voltage transistor region; and filling the insulating film in the etching grooves and forming element isolating regions.

BRIEF DESCRIPTION OF THE DRAWINGS

FIG. 3A schematically shows a cross section of the nonvolatile semiconductor memory, according to the first embodiment of the present invention, cut along a line III-III in FIG. 1, explaining a step of the fabrication process thereof;

FIG. 3B schematically shows a cross section of the nonvolatile semiconductor memory, according to the first embodiment of the present invention, cut along a line IV-IV in FIG. 1, explaining a step of the fabrication process thereof.

FIG. 3C schematically shows a cross section of the nonvolatile semiconductor memory, according to the first embodiment of the present invention, cut along a line V-V in FIG. 1, explaining a step of the fabrication process thereof.

FIG. 4A schematically shows a cross section of a high voltage transistor in a high voltage transistor region, explaining a step of the fabrication process for the nonvolatile semiconductor memory, according to the first embodiment of the present invention;

FIG. 4B schematically shows a cross section of a low voltage transistor in a low voltage transistor region, explaining a step of the fabrication process for the nonvolatile semiconductor memory, according to the first embodiment of the present invention;

FIG. 5A schematically shows a cross section of the nonvolatile semiconductor memory, according to the first embodiment of the present invention, cut along a line I-I in FIG. 1, explaining a step of the fabrication process thereof;

FIG. 5B schematically shows a cross section of the nonvolatile semiconductor memory, according to the first embodiment of the present invention, cut along a line II-II in FIG. 1, explaining a step of the fabrication process thereof;

FIG. 8A schematically shows a cross section of the nonvolatile semiconductor memory, according to the first embodiment of the present invention, cut along the line I-I in FIG. 1, explaining a step of the fabrication process thereof;

FIG. 8B schematically shows a cross section of the nonvolatile semiconductor memory, according to the first embodiment of the present invention, cut along the line II-II in FIG. 1, explaining a step of the fabrication process thereof;

FIG. 9A schematically shows a cross section of the nonvolatile semiconductor memory, according to the first embodiment of the present invention, cut along the line in FIG. 1, explaining a step of the fabrication process thereof;

FIG. 9B schematically shows a cross section of the nonvolatile semiconductor memory, according to the first embodiment of the present invention, cut along the line IV-IV in FIG. 1, explaining a step of the fabrication process thereof;

FIG. 9C schematically shows a cross section of the nonvolatile semiconductor memory, according to the first embodiment of the present invention, cut along the line V-V in FIG. 1, explaining a step of the fabrication process thereof;

FIG. 10A schematically shows a cross section of a high voltage transistor in a high voltage transistor region, explaining a step of the fabrication process for the nonvolatile semiconductor memory, according to the first embodiment of the present invention;

FIG. 10B schematically shows a cross section of a low voltage transistor in a low voltage transistor region, explaining a step of the fabrication process for the nonvolatile semiconductor memory, according to the first embodiment of the present invention;

FIG. 11A schematically shows a cross section of the nonvolatile semiconductor memory, according to the first embodiment of the present invention, cut along the line I-I in FIG. 1, explaining a step of the fabrication process thereof;

FIG. 11B schematically shows a cross section of the nonvolatile semiconductor memory, according to the first embodiment of the present invention, cut along the line II-II in FIG. 1, explaining a step of the fabrication process thereof;

FIG. 12A schematically shows a cross section of the nonvolatile semiconductor memory, according to the first embodiment of the present invention, cut along the line III-III in FIG. 1, explaining a step of the fabrication process thereof;

FIG. 12B schematically shows a cross section of the nonvolatile semiconductor memory, according to the first embodiment of the present invention, cut along a line IV-IV in FIG. 1, explaining a step of a fabrication process thereof;

FIG. 12C schematically shows a cross section of the nonvolatile semiconductor memory, according to the first embodiment of the present invention, cut along the line V-V in FIG. 1, explaining a step of the fabrication process thereof;

FIG. 13A schematically shows a cross section of a high voltage transistor in a high voltage transistor region, explaining a step of the fabrication process for the nonvolatile semiconductor memory, according to the first embodiment of the present invention;

FIG. 13B schematically shows a cross section of a low voltage transistor in a low voltage transistor region, explaining a step of the fabrication process for the nonvolatile semiconductor memory, according to the first embodiment of the present invention;

FIG. 14A schematically shows a cross section of the nonvolatile semiconductor memory, according to the first embodiment of the present invention, cut along the line I-I in FIG. 1, explaining a step of the fabrication process thereof;

FIG. 14B schematically shows a cross section of the nonvolatile semiconductor memory, according to the first embodiment of the present invention, cut along the line II-II in FIG. 1, explaining a step of the fabrication process thereof;

FIG. 15A schematically shows a cross section of the nonvolatile semiconductor memory, according to the first embodiment of the present invention, cut along the line III-III in FIG. 1, explaining a step of the fabrication process thereof;

FIG. 15B schematically shows a cross section of the nonvolatile semiconductor memory, according to the first embodiment of the present invention, cut along the line IV-IV in FIG. 1, explaining a step of the fabrication process thereof;

FIG. 15C schematically shows a cross section of the nonvolatile semiconductor memory, according to the first embodiment of the present invention, cut along the line V-V in FIG. 1, explaining a step of the fabrication process thereof;

FIG. 16A schematically shows a cross section of a high voltage transistor in a high voltage transistor region, explaining a step of the fabrication process for the nonvolatile semiconductor memory, according to the first embodiment of the present invention;

FIG. 16B schematically shows a cross section of a low voltage transistor in a low voltage transistor region, explaining a step of the fabrication process for the nonvolatile semiconductor memory, according to the first embodiment of the present invention;

FIG. 17A schematically shows a cross section of the nonvolatile semiconductor memory, according to the first embodiment of the present invention, cut along the line I-I in FIG. 1, explaining a step of the fabrication process thereof;

FIG. 17B schematically shows a cross section of the nonvolatile semiconductor memory, according to the first embodiment of the present invention, cut along the line II-II in FIG. 1, explaining a step of the fabrication process thereof;

FIG. 21A schematically shows a cross section of the nonvolatile semiconductor memory, according to the first embodiment of the present invention, cut along a line in FIG. 1, explaining a step of a fabrication process thereof;

FIG. 21B schematically shows a cross section of the nonvolatile semiconductor memory, according to the first embodiment of the present invention, cut along the line IV-IV in FIG. 1, explaining a step of the fabrication process thereof;

FIG. 21C schematically shows a cross section of the nonvolatile semiconductor memory, according to the first embodiment of the present invention, cut along the line V-V in FIG. 1, explaining a step of the fabrication process thereof;

FIG. 22A schematically shows a cross section of a high voltage transistor in a high voltage transistor region, explaining a step of the fabrication process for the nonvolatile semiconductor memory, according to the first embodiment of the present invention;

FIG. 22B schematically shows a cross section of a low voltage transistor in a low voltage transistor region, explaining a step of the fabrication process for the nonvolatile semiconductor memory, according to the first embodiment of the present invention;

FIG. 23A schematically shows a cross section of a high voltage transistor in a high voltage transistor region, explaining a step of the fabrication process for the nonvolatile semiconductor memory, according to the first embodiment of the present invention;

FIG. 23B schematically shows a cross section of a low voltage transistor in a low voltage transistor region, explaining a step of the fabrication process for the nonvolatile semiconductor memory, according to the first embodiment of the present invention;

FIG. 24A schematically shows a cross section of the nonvolatile semiconductor memory, according to the first embodiment of the present invention, cut along the line I-I in FIG. 1, explaining a step of the fabrication process thereof;

FIG. 24B schematically shows a cross section of the nonvolatile semiconductor memory, according to the first embodiment of the present invention, cut along the line II-II in FIG. 1, explaining a step of the fabrication process thereof;

FIG. 25A schematically shows a cross section of the nonvolatile semiconductor memory, according to the first embodiment of the present invention, cut along the line III-III in FIG. 1, explaining a step of the fabrication process thereof;

FIG. 25B schematically shows a cross section of the nonvolatile semiconductor memory, according to the first embodiment of the present invention, cut along a line IV-IV in FIG. 1, explaining a step of a fabrication process thereof;

FIG. 25C schematically shows a cross section of the nonvolatile semiconductor memory, according to the first embodiment of the present invention, cut along the line V-V in FIG. 1, explaining a step of the fabrication process thereof;

FIG. 26A schematically shows a cross section of a high voltage transistor in a high voltage transistor region, explaining a step of the fabrication process for the nonvolatile semiconductor memory, according to the first embodiment of the present invention;

FIG. 26B schematically shows a cross section of a low voltage transistor in a low voltage transistor region, explaining a step of the fabrication process for the nonvolatile semiconductor memory, according to the first embodiment of the present invention;

FIG. 27A schematically shows a cross section of the nonvolatile semiconductor memory, according to the first embodiment of the present invention, cut along the line I-I in FIG. 1, explaining a step of the fabrication process thereof;

FIG. 27B schematically shows a cross section of the nonvolatile semiconductor memory, according to the first embodiment of the present invention, cut along the line II-II in FIG. 1, explaining a step of the fabrication process thereof;

FIG. 31A schematically shows a cross section of the nonvolatile semiconductor memory, according to the first embodiment of the present invention, cut along the line III-III in FIG. 1, explaining a step of the fabrication process thereof.

FIG. 31B schematically shows a cross section of the nonvolatile semiconductor memory, according to the first embodiment of the present invention, cut along the line IV-IV in FIG. 1, explaining a step of the fabrication process thereof;

FIG. 31C schematically shows a cross section of the nonvolatile semiconductor memory, according to the first embodiment of the present invention, cut along a line V-V in FIG. 1, explaining a step of a fabrication process thereof;

FIG. 35A schematically shows a cross section of a high voltage transistor in a high voltage transistor region, explaining a step of the fabrication process for the nonvolatile semiconductor memory, according to the first embodiment of the present invention;

FIG. 35B schematically shows a cross section of a low voltage transistor in a low voltage transistor region, explaining a step of the fabrication process for the nonvolatile semiconductor memory, according to the first embodiment of the present invention;

FIG. 36A schematically shows a cross section of the nonvolatile semiconductor memory, according to the second embodiment of the present invention, cut along the line I-I in FIG. 1, explaining a step of a fabrication process thereof;

FIG. 36B schematically shows a cross section of the nonvolatile semiconductor memory, according to the second embodiment of the present invention, cut along the limit-II in FIG. 1, explaining a step of the fabrication process thereof;

FIG. 37A schematically shows a cross section of the nonvolatile semiconductor memory, according to the second embodiment of the present invention, cut along the line III-III in FIG. 1, explaining a step of the fabrication process thereof;

FIG. 37B schematically shows a cross section of the nonvolatile semiconductor memory, according to the second embodiment of the present invention, cut along the line IV-IV in FIG. 1, explaining a step of the fabrication process thereof;

FIG. 37C schematically shows a cross section of the nonvolatile semiconductor memory, according to the second embodiment of the present invention, cut along the line V-V in FIG. 1, explaining a step of the fabrication process thereof;

FIG. 40A schematically shows a cross section of the nonvolatile semiconductor memory, according to the second embodiment of the present invention, cut along the line III-III in FIG. 1, explaining a step of the fabrication process thereof;

FIG. 40B schematically shows a cross section of the nonvolatile semiconductor memory, according to the second embodiment of the present invention, cut along the line IV-IV in FIG. 1, explaining a step of the fabrication process thereof;

FIG. 40C schematically shows a cross section of the nonvolatile semiconductor memory, according to the second embodiment of the present invention, cut along the line V-V in FIG. 1, explaining a step of the fabrication process thereof;

FIG. 42A schematically shows a cross section of the nonvolatile semiconductor memory, according to the second embodiment of the present invention, cut along the line I-I in FIG. 1, explaining a step of the fabrication process thereof;

FIG. 42B schematically shows a cross section of the nonvolatile semiconductor memory, according to the second embodiment of the present invention, cut along the line II-II in FIG. 1, explaining a step of the fabrication process thereof;

FIG. 47A schematically shows a cross section of a high voltage transistor in a high voltage transistor region, explaining a step of the fabrication process for the nonvolatile semiconductor memory, according to the second embodiment of the present invention;

FIG. 47B schematically shows a cross section of a low voltage transistor in a low voltage transistor region, explaining a step of the fabrication process for the nonvolatile semiconductor memory, according to the second embodiment of the present invention;

FIG. 48A schematically shows a cross section of the nonvolatile semiconductor memory, according to the second embodiment of the present invention, cut along the line I-I in FIG. 1, explaining a step of the fabrication process thereof;

FIG. 48B schematically shows a cross section of the nonvolatile semiconductor memory, according to the second embodiment of the present invention, cut along the line II-II in FIG. 1, explaining a step of the fabrication process thereof;

FIG. 51A schematically shows a cross section of a high voltage transistor in a high voltage transistor region, explaining a step of the fabrication process for the nonvolatile semiconductor memory, according to the second embodiment of the present invention;

FIG. 51B schematically shows a cross section of a low voltage transistor in a low voltage transistor region, explaining a step of the fabrication process for the nonvolatile semiconductor memory, according to the second embodiment of the present invention;

FIG. 52A schematically shows a cross section of a high voltage transistor in a high voltage transistor region, explaining a step of the fabrication process for the nonvolatile semiconductor memory, according to the second embodiment of the present invention;

FIG. 52B schematically shows a cross section of a low voltage transistor in a low voltage transistor region, explaining a step of the fabrication process for the nonvolatile semiconductor memory, according to the second embodiment of the present invention;

FIG. 53A schematically shows a cross section of a high voltage transistor in a high voltage transistor region, explaining a step of the fabrication process for the nonvolatile semiconductor memory, according to the second embodiment of the present invention;

FIG. 53B schematically shows a cross section of a low voltage transistor in a low voltage transistor region, explaining a step of the fabrication process for the nonvolatile semiconductor memory, according to the second embodiment of the present invention;

Figure 54A:
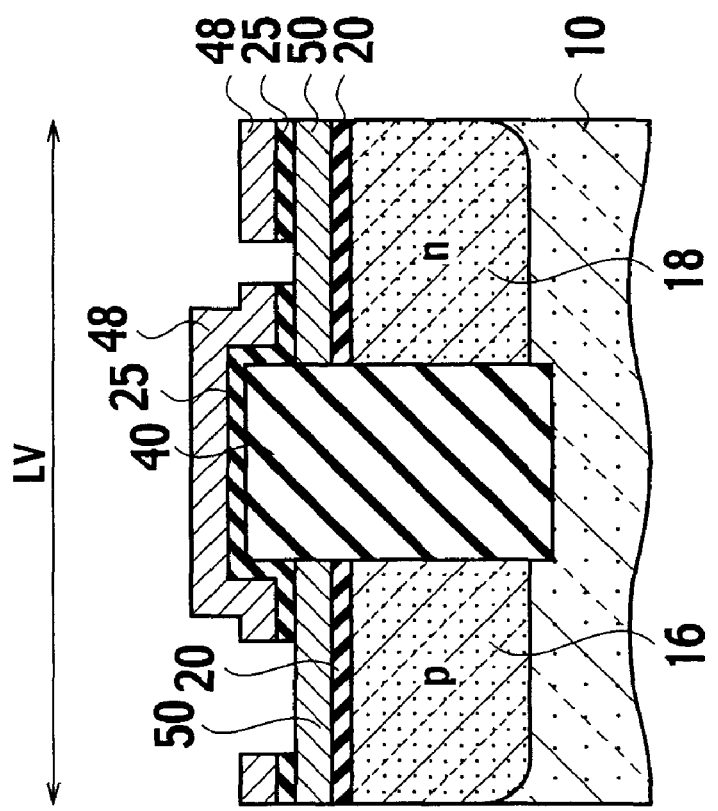
FIG. 54A schematically shows a cross section of a high voltage transistor in a high voltage transistor region, explaining a step of the fabrication process for the nonvolatile semiconductor memory, according to the second embodiment of the present invention.
Figure 54B:
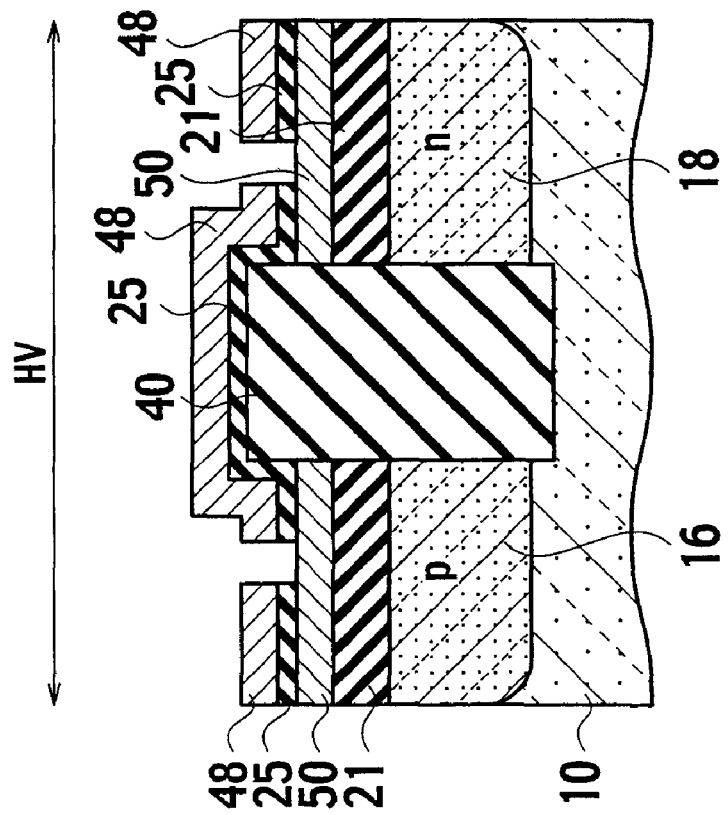
Figure 57A:
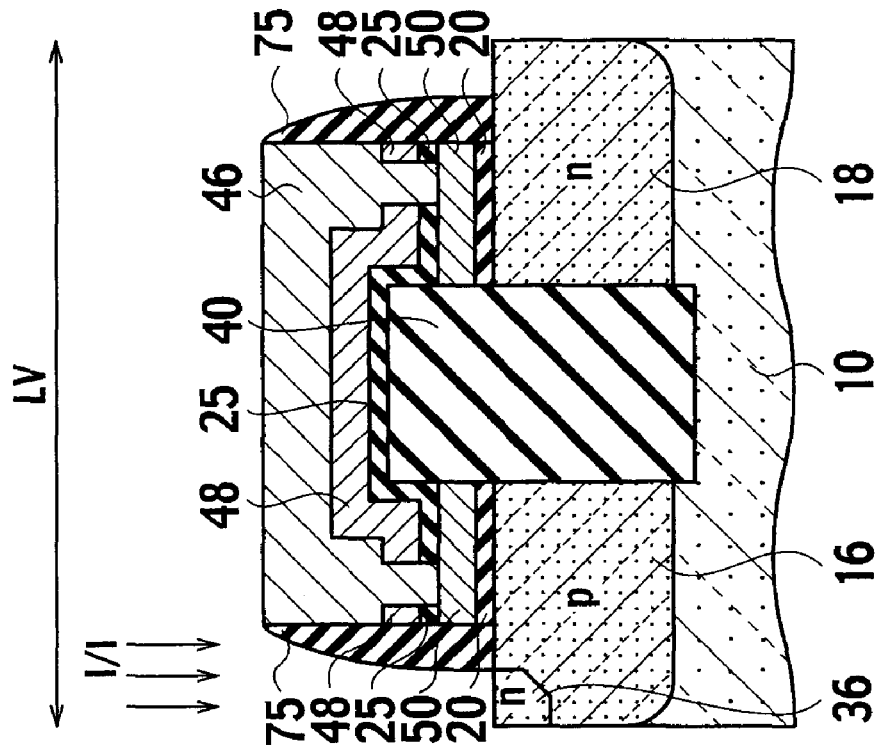
Figure 57B:
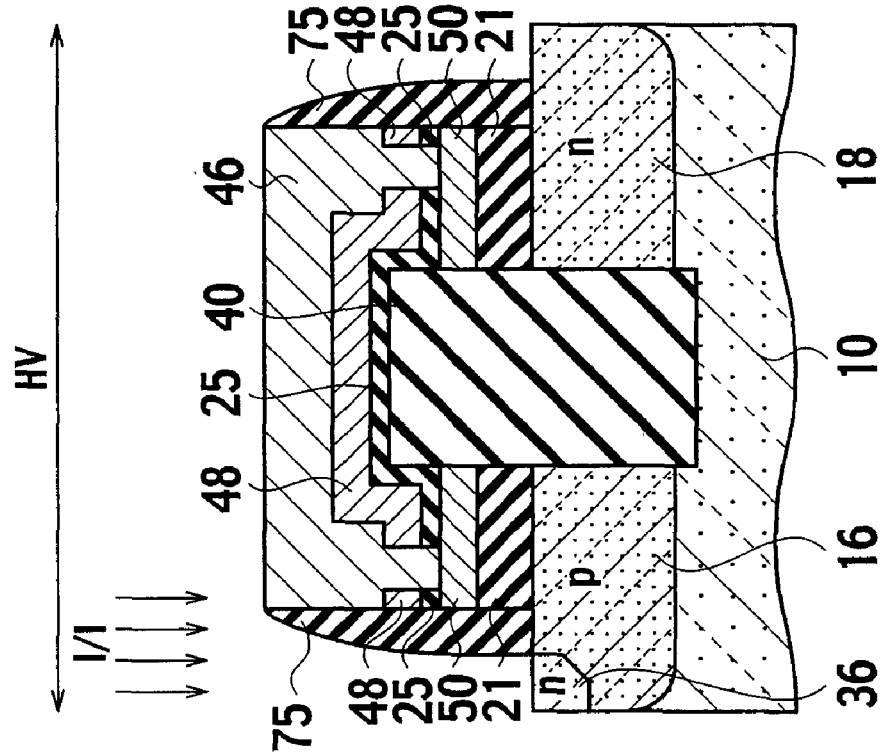
Figures 58A, 58B:
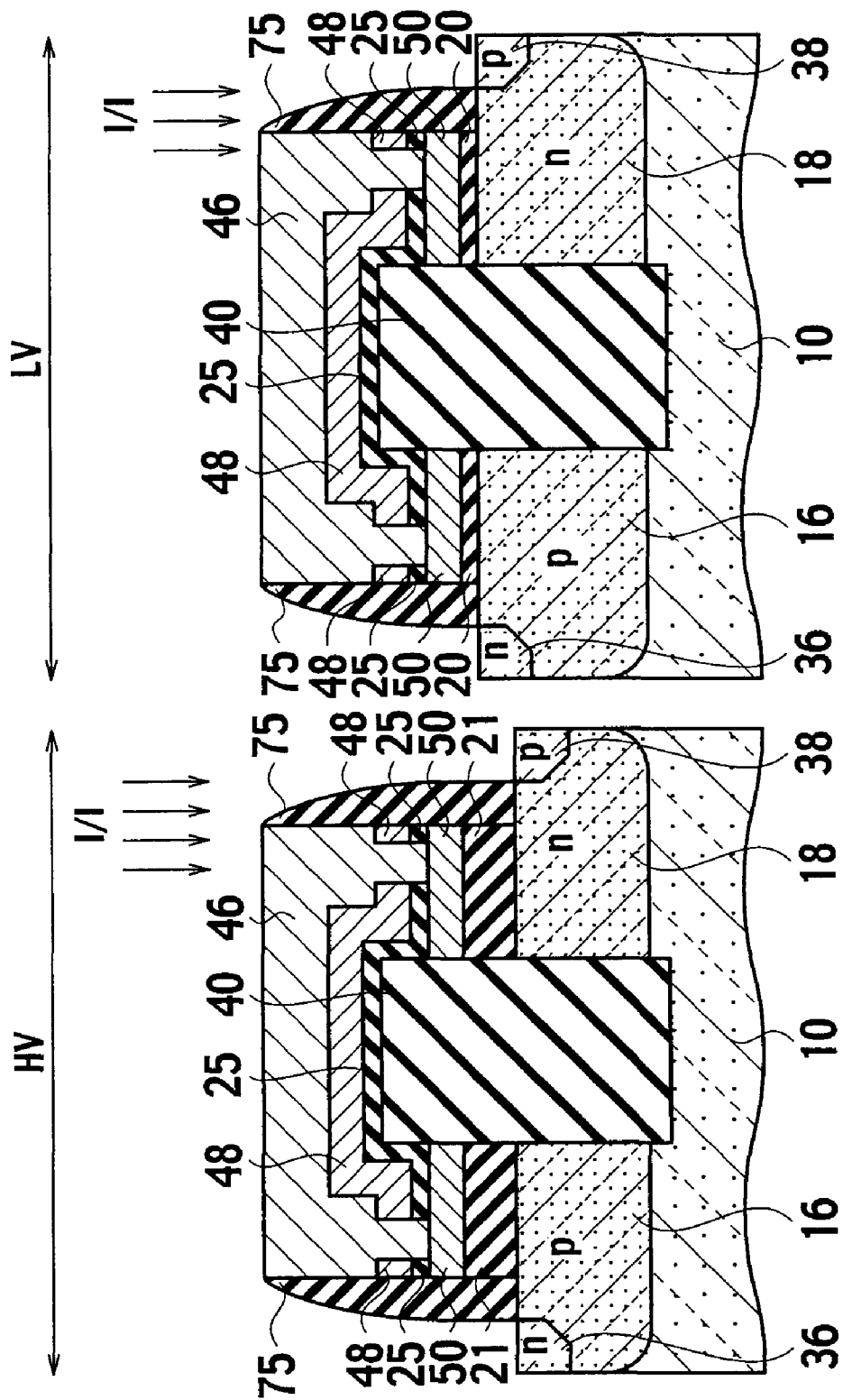
Figure 60A:
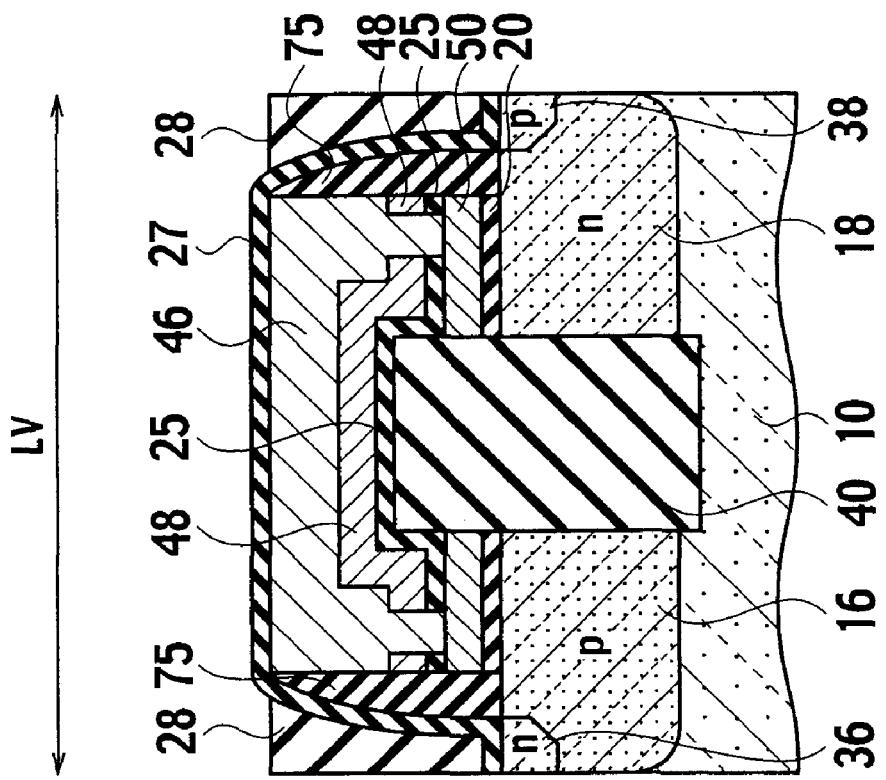
Figure 60B:
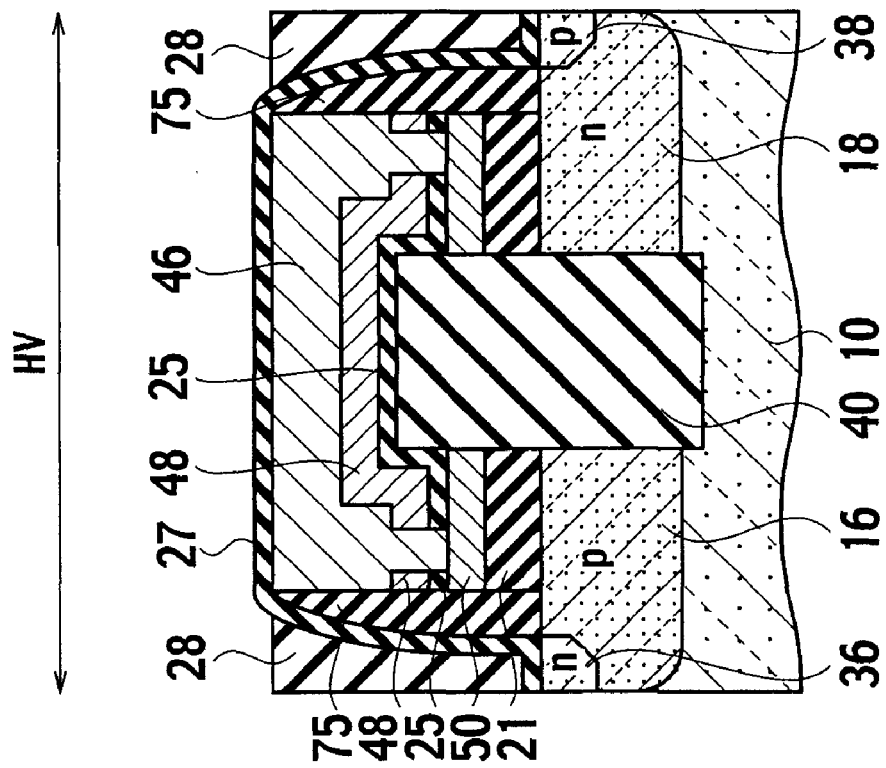
Figure 62A:
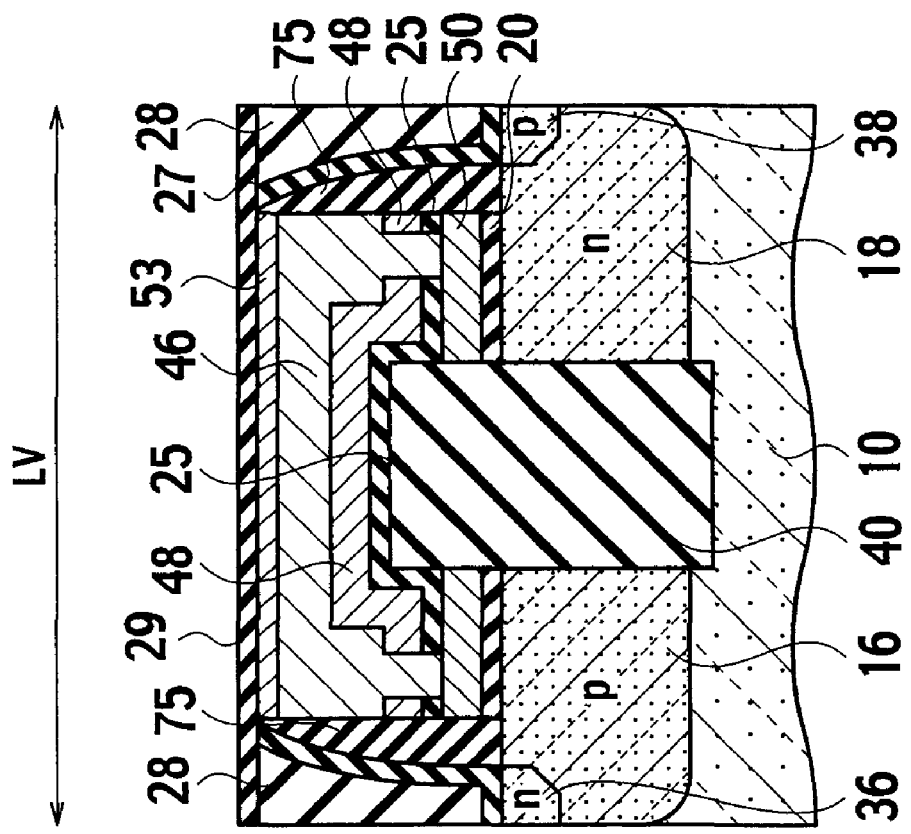
Figure 62B:
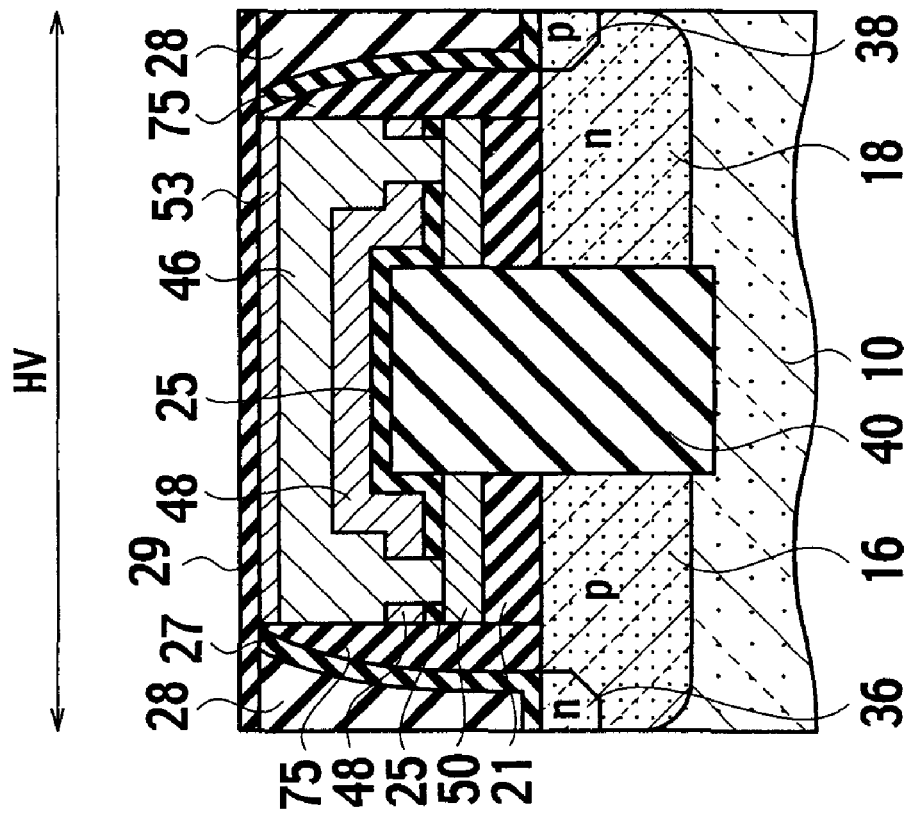
Figure 64:
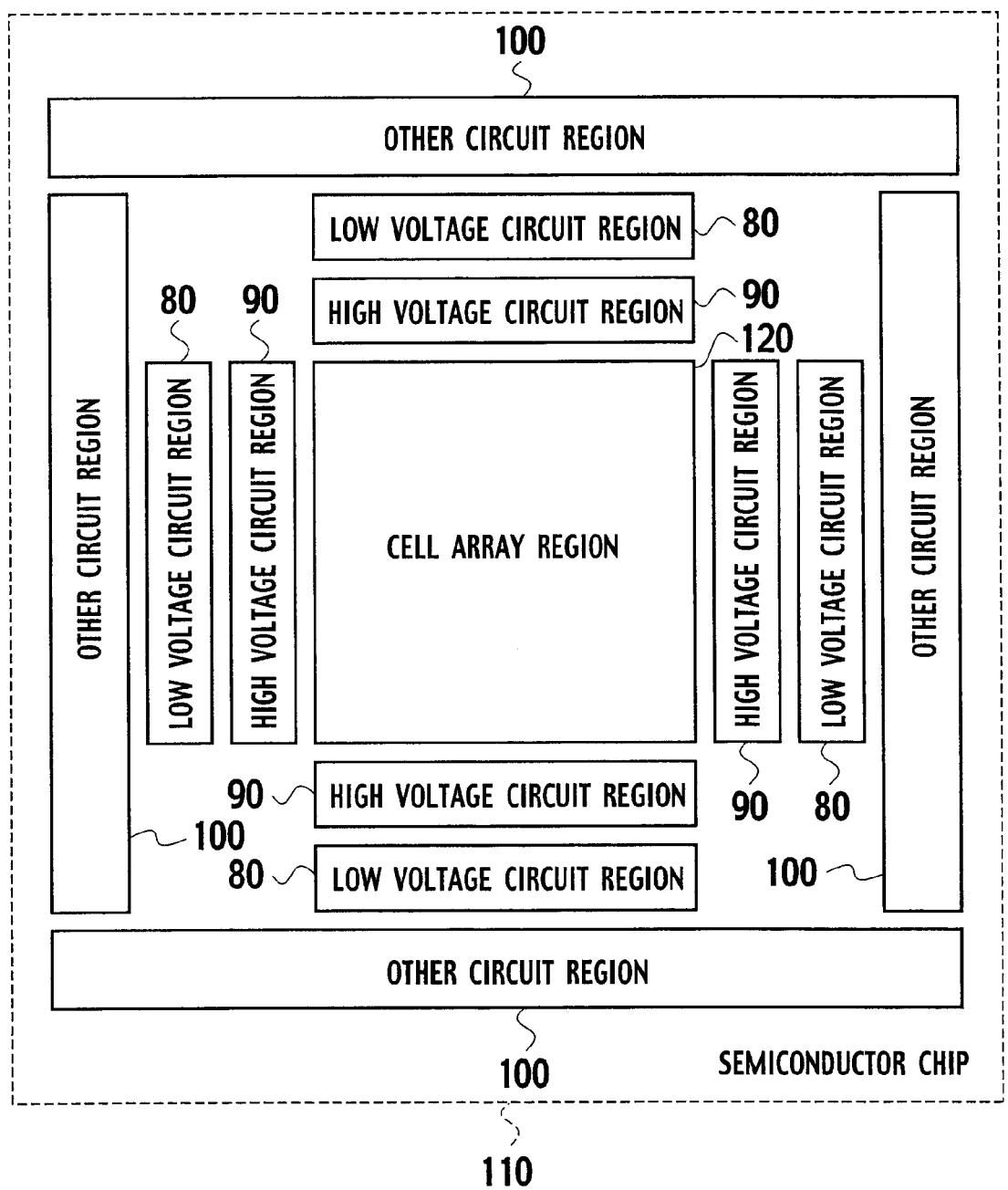
Figure 65:
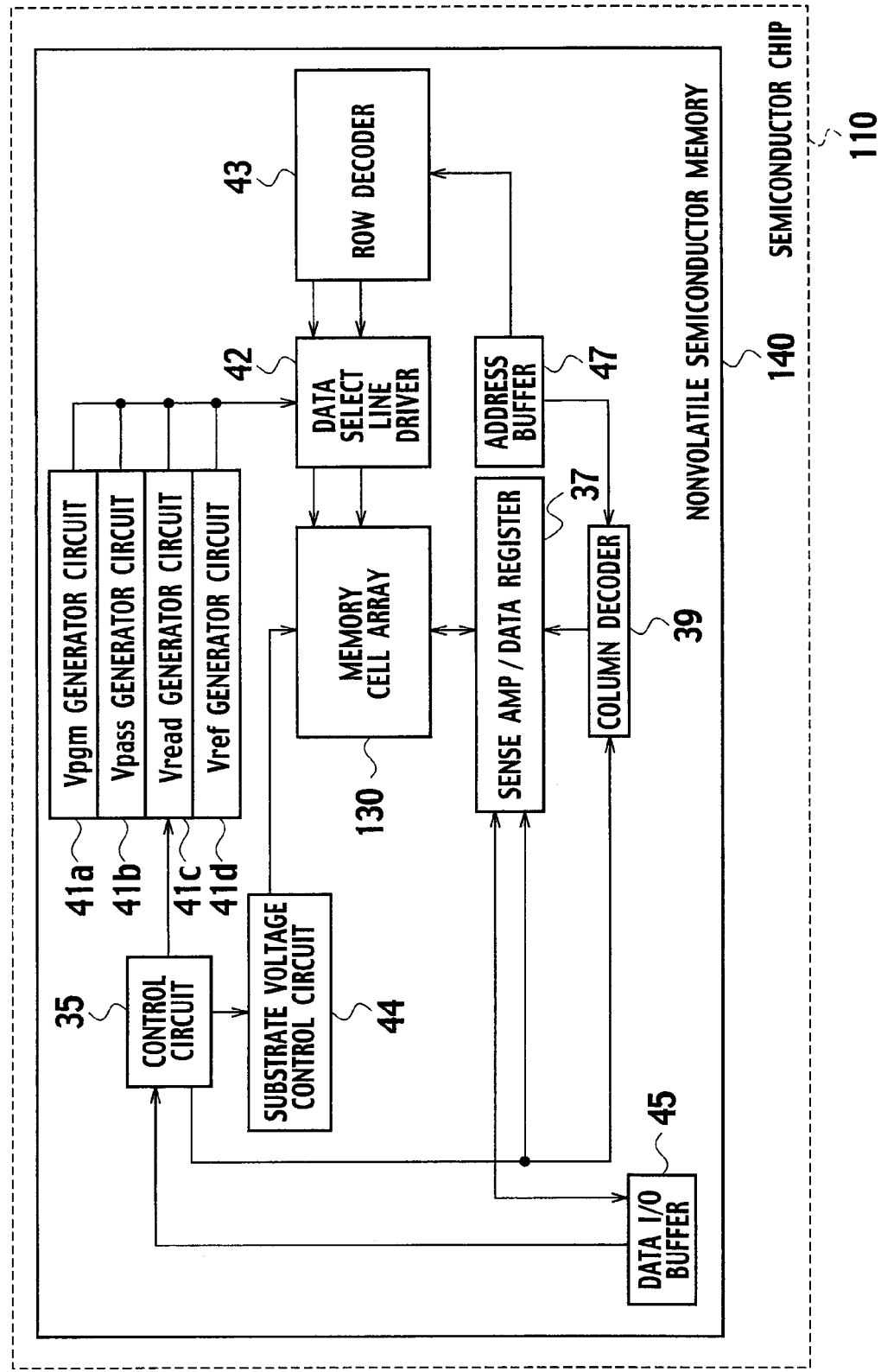
Figure 66:
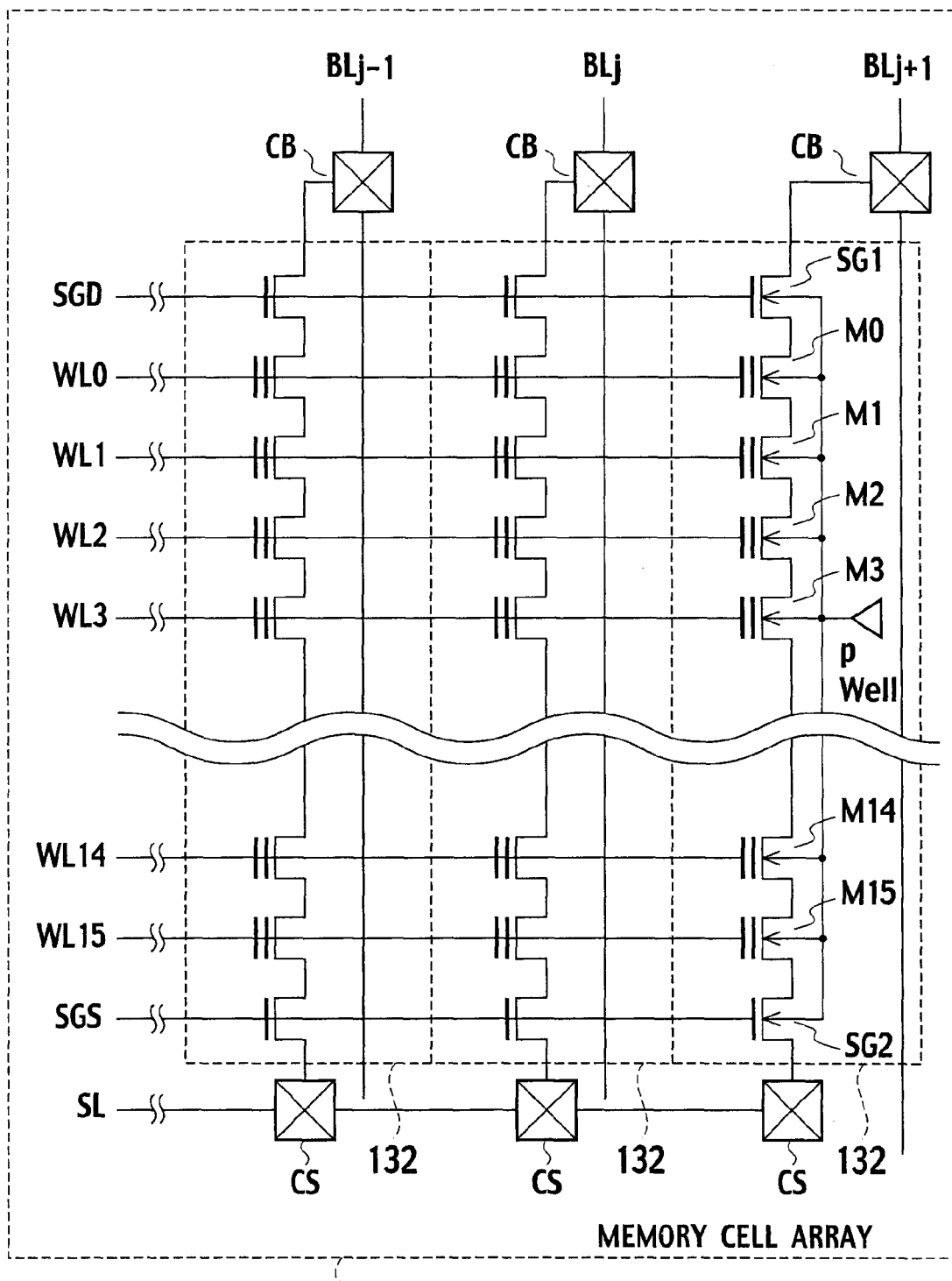
Figure 67:
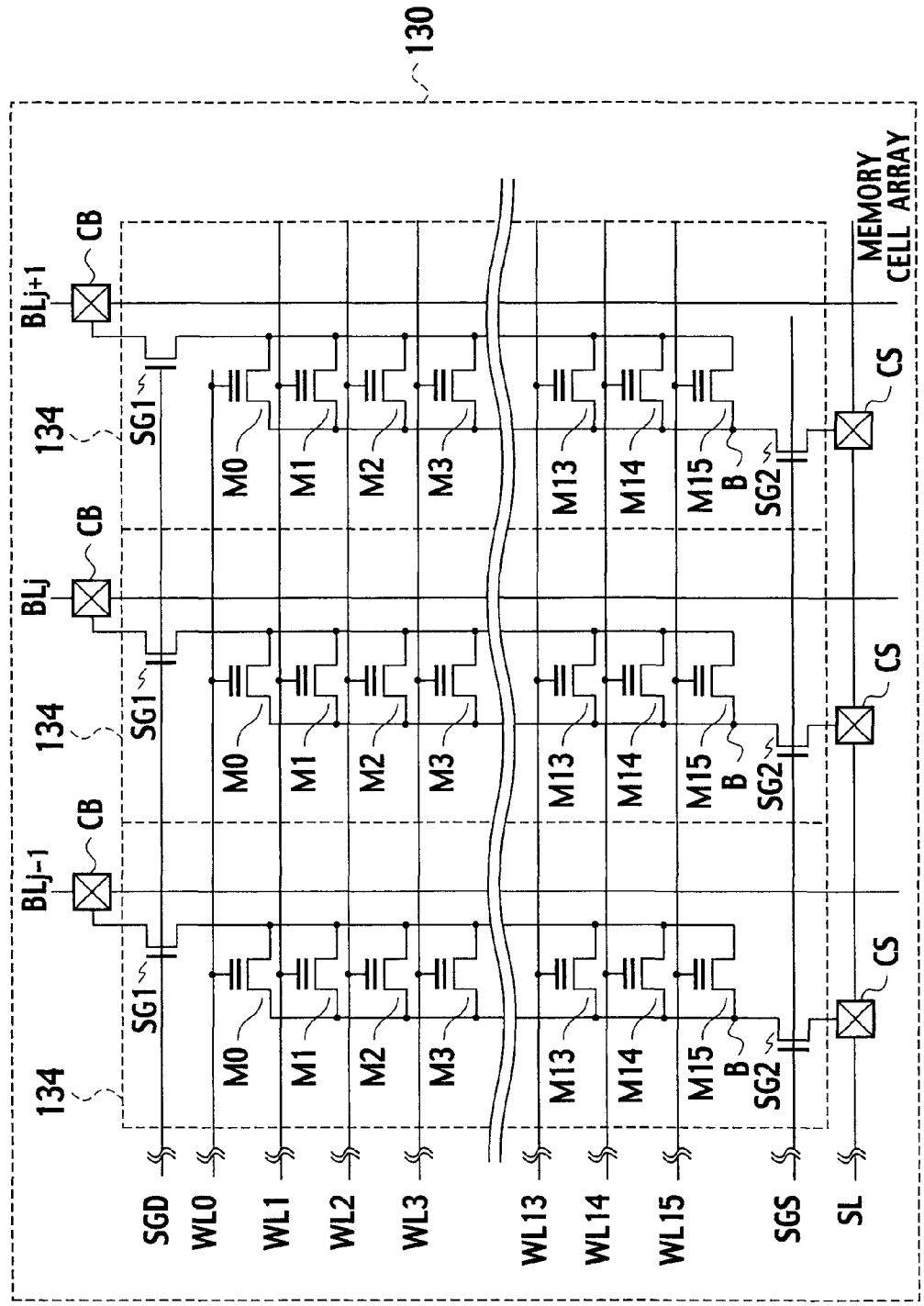
Figure 68:
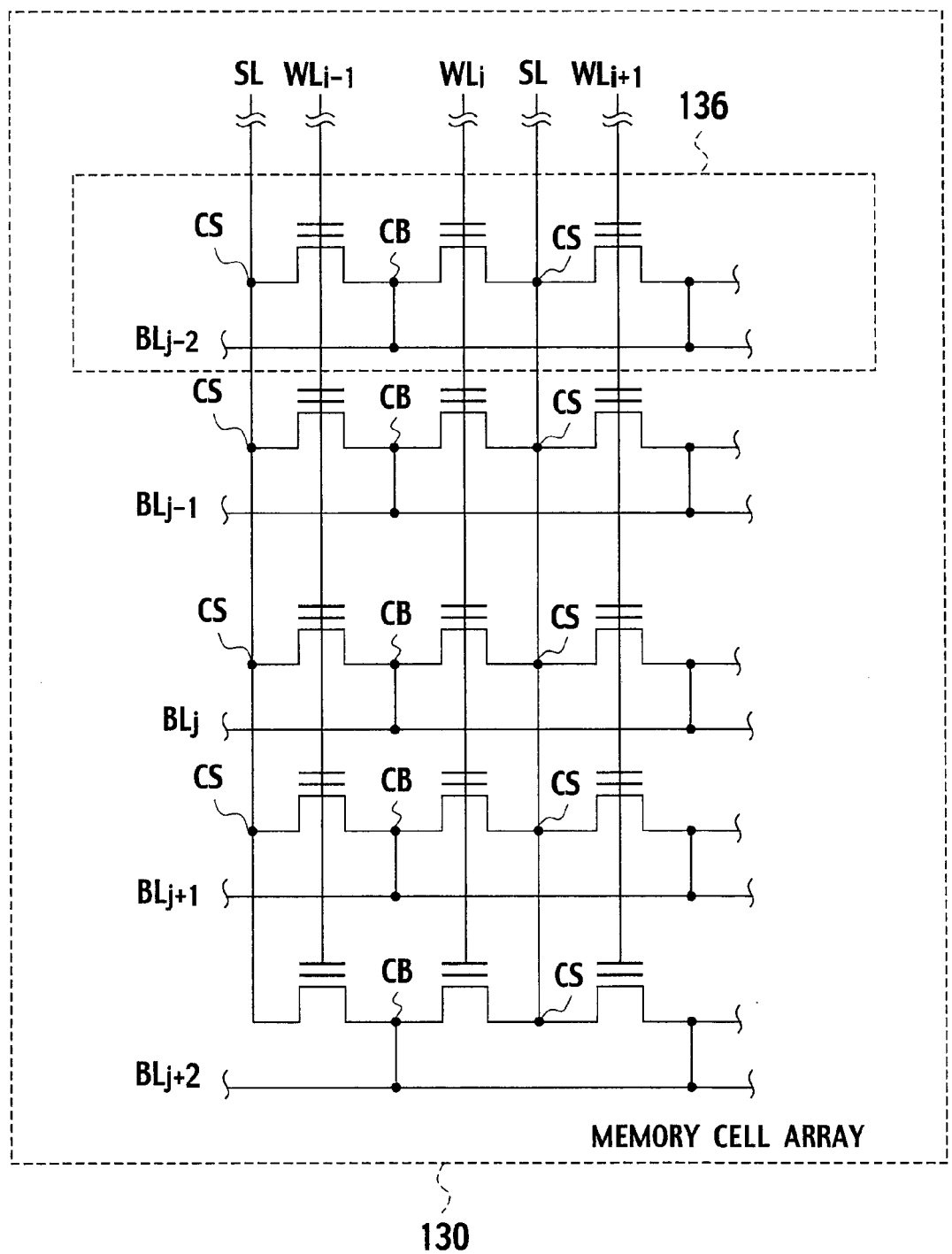
Figure 69:
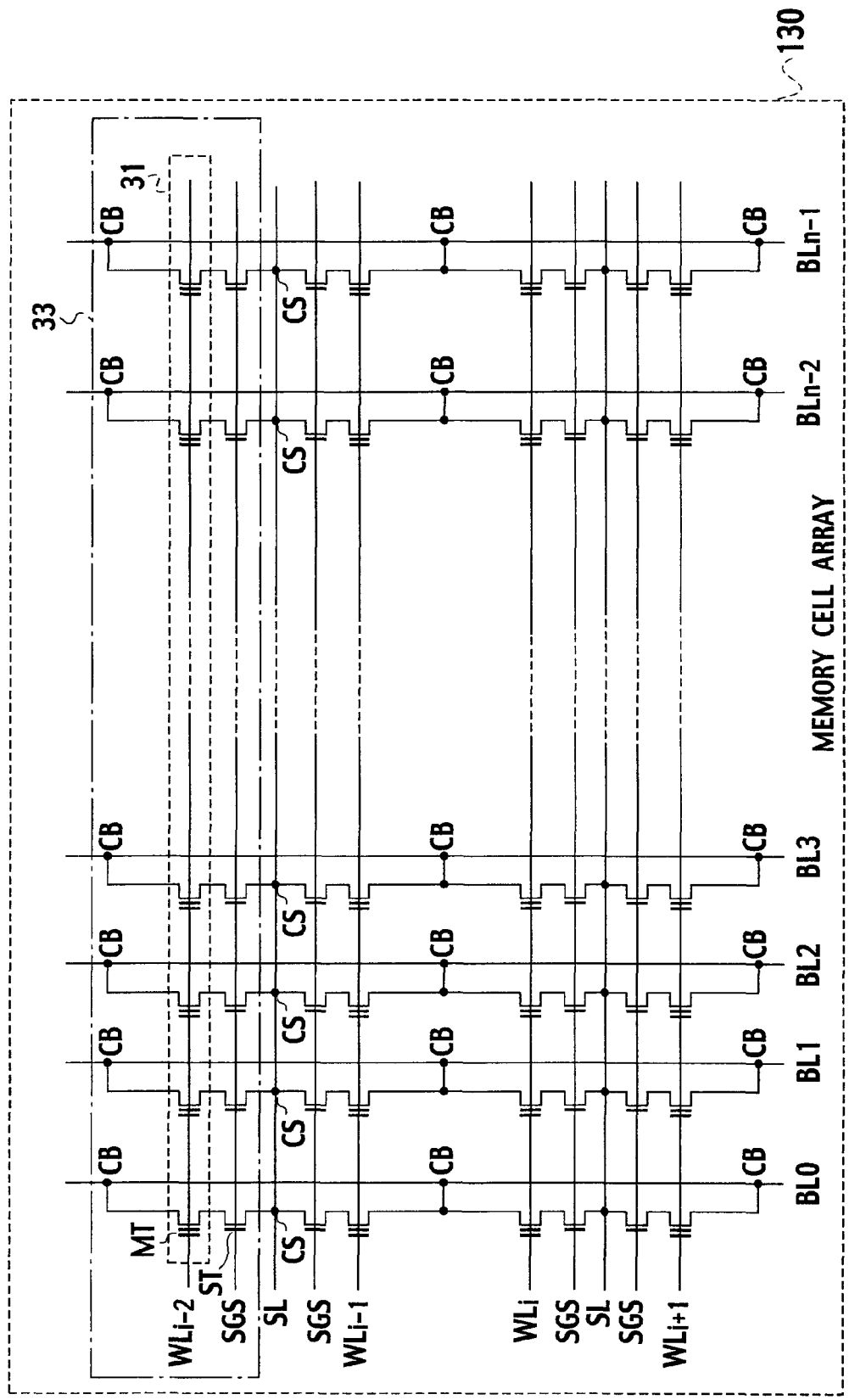
Figure 70:
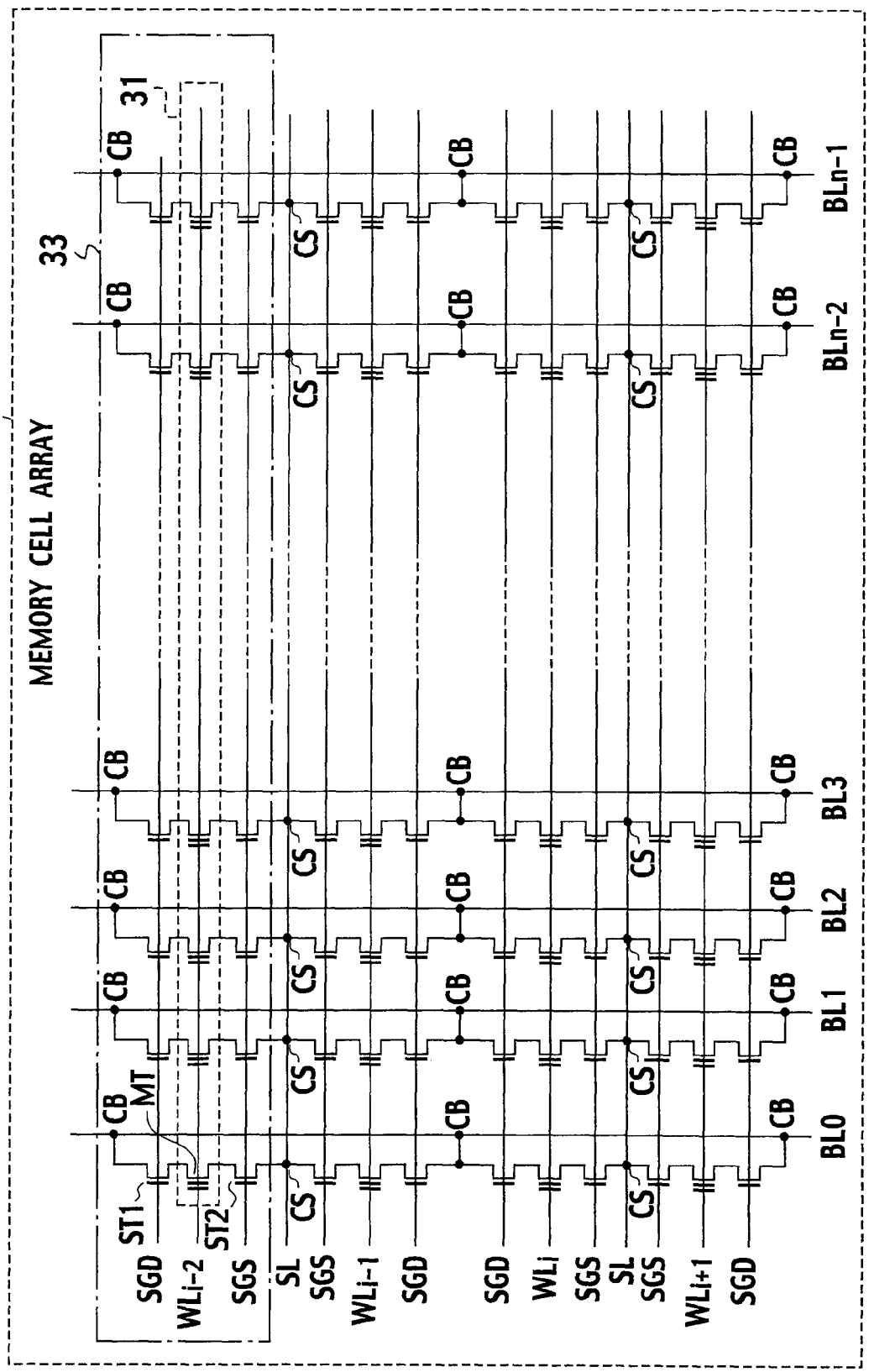
Figure 71:
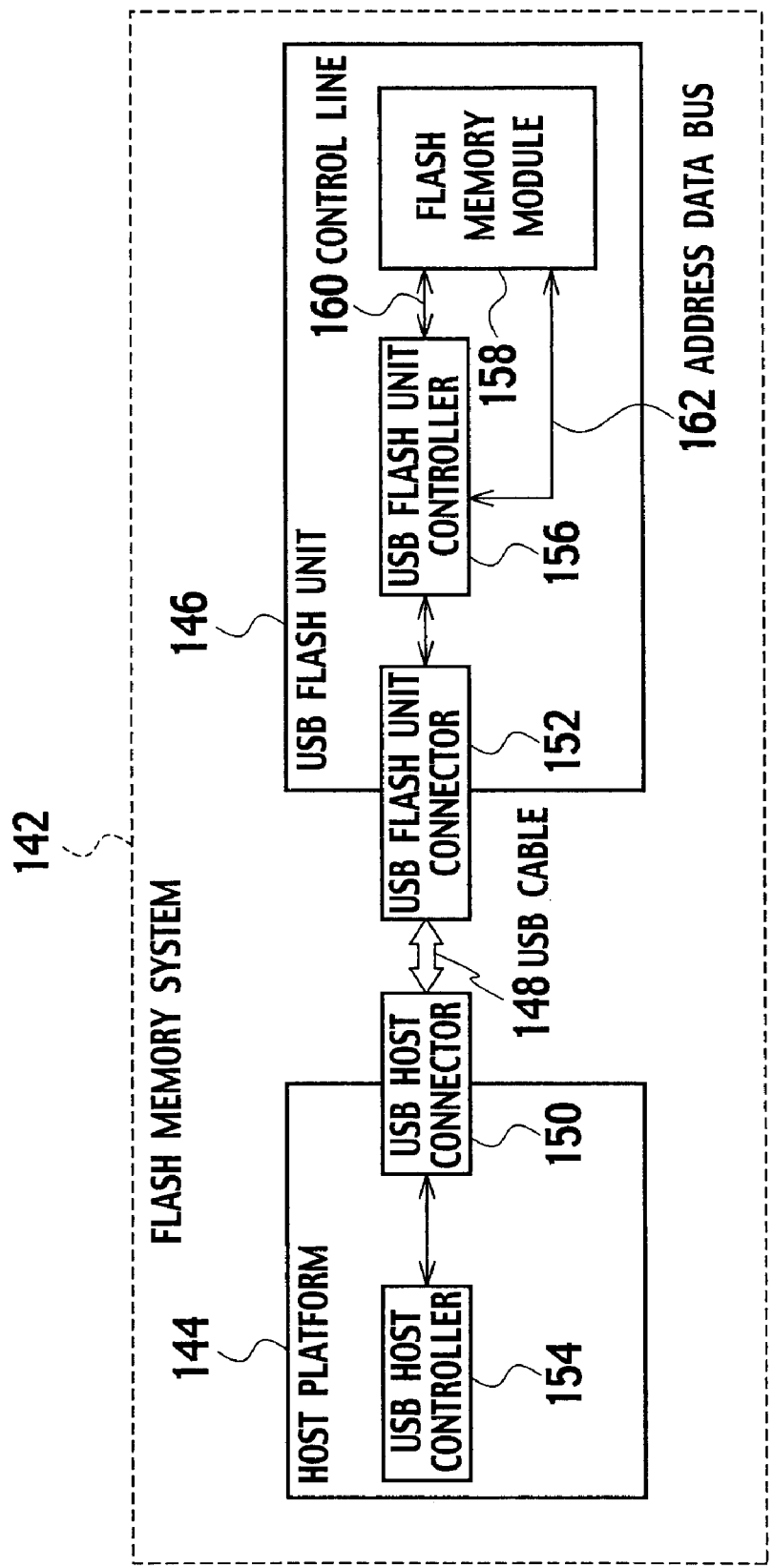
Figure 72:
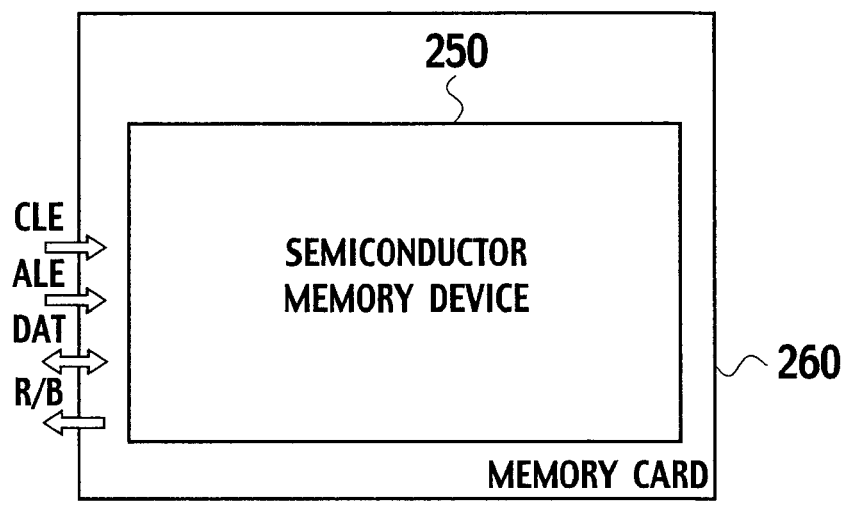
Figure 73:
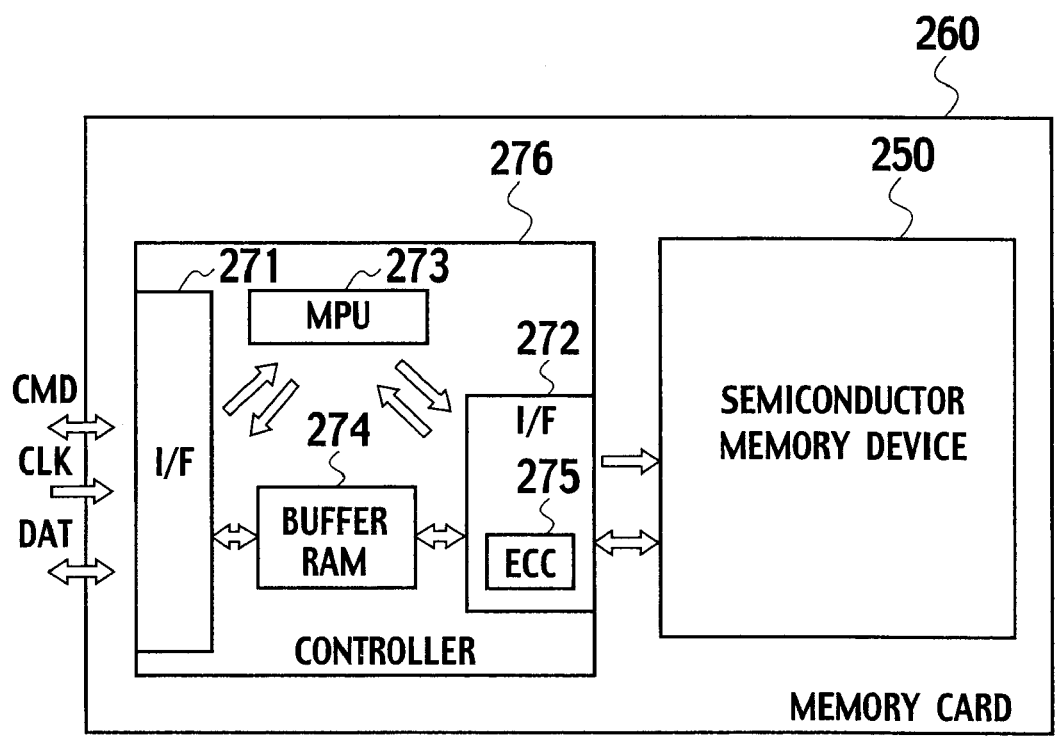
Figure 74:
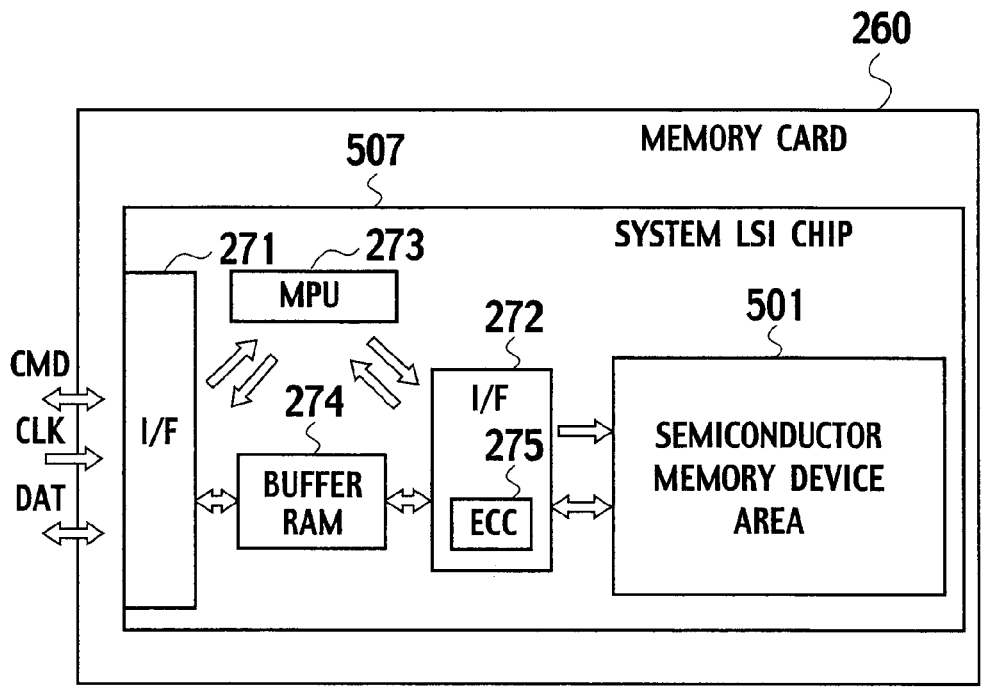
Figure 75:
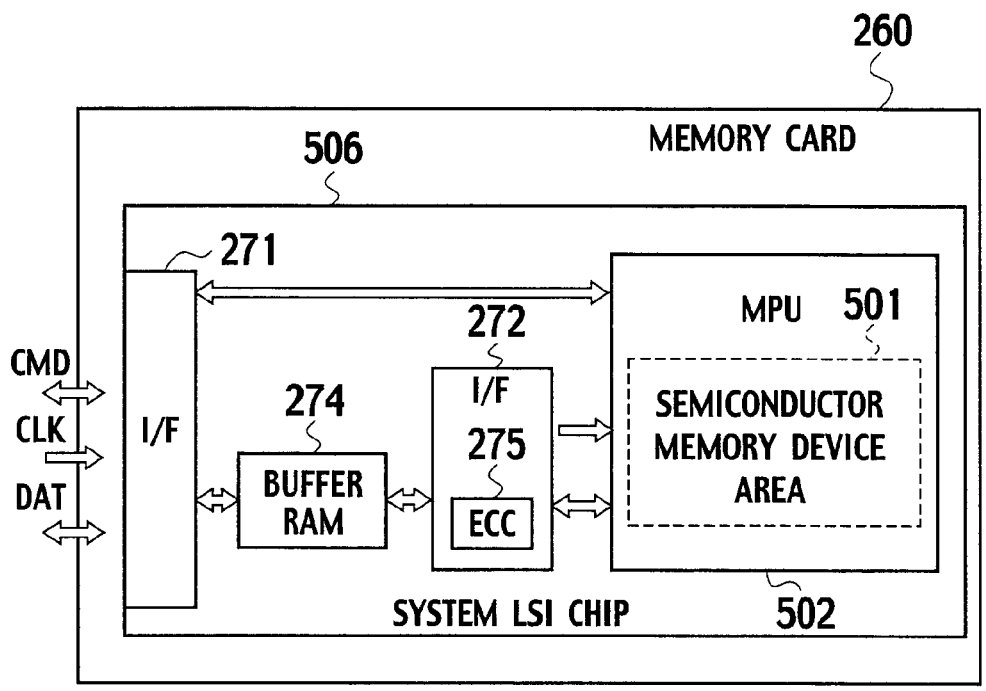
Figure 76:
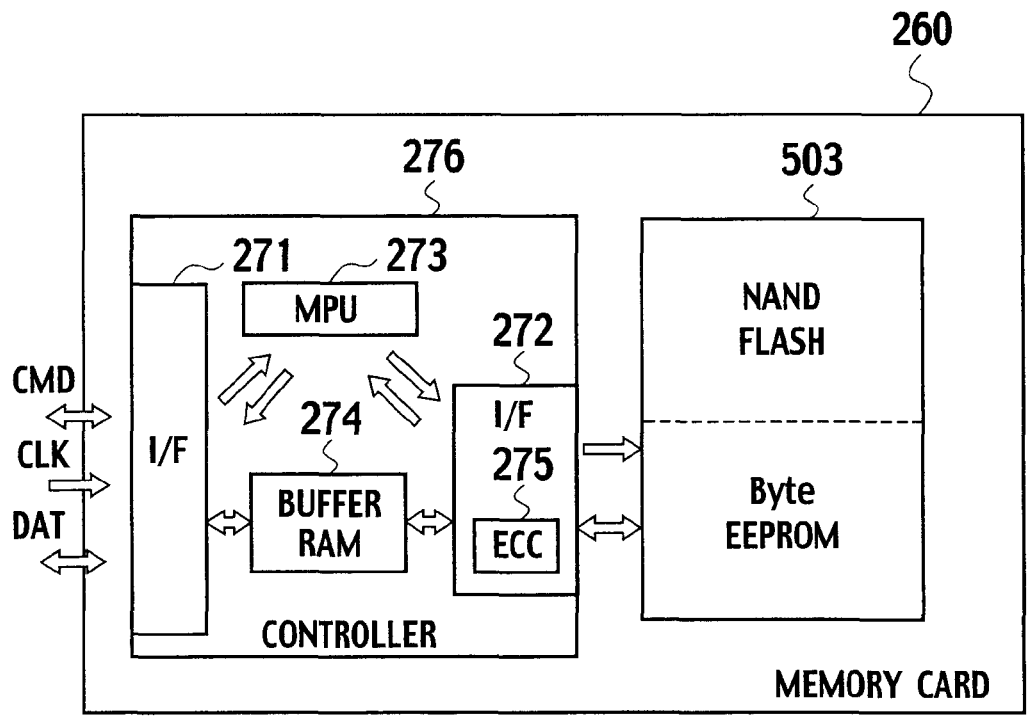
Figure 77:
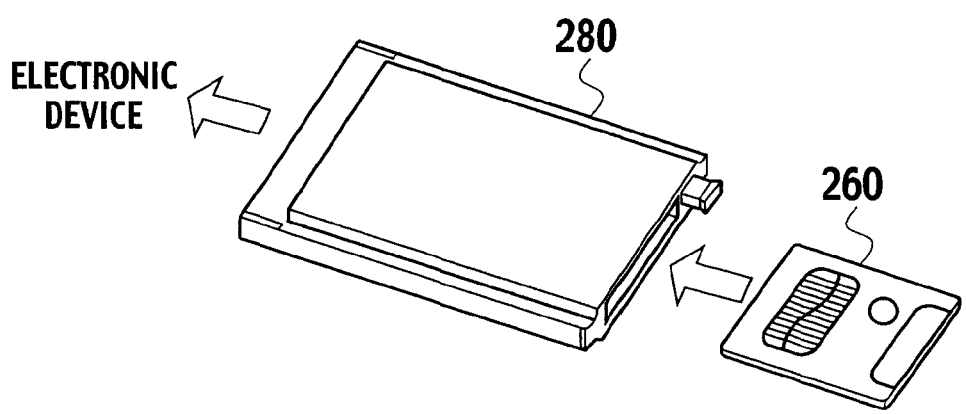
Figure 78:
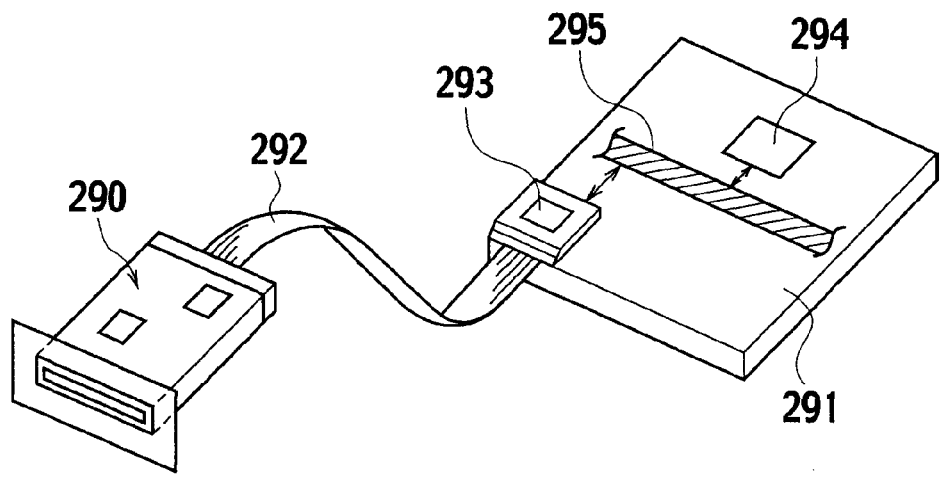
Figure 79:
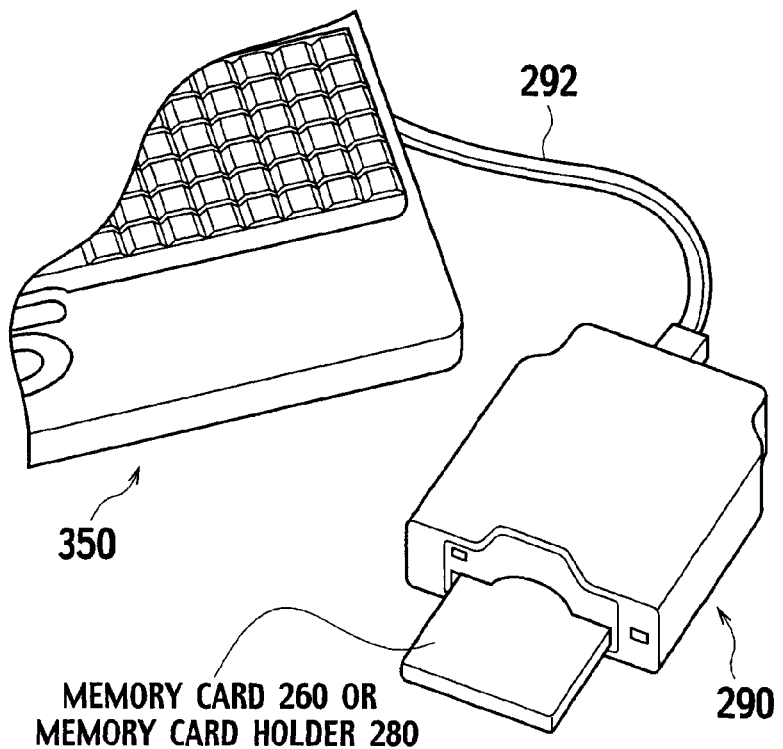
Figure 80:
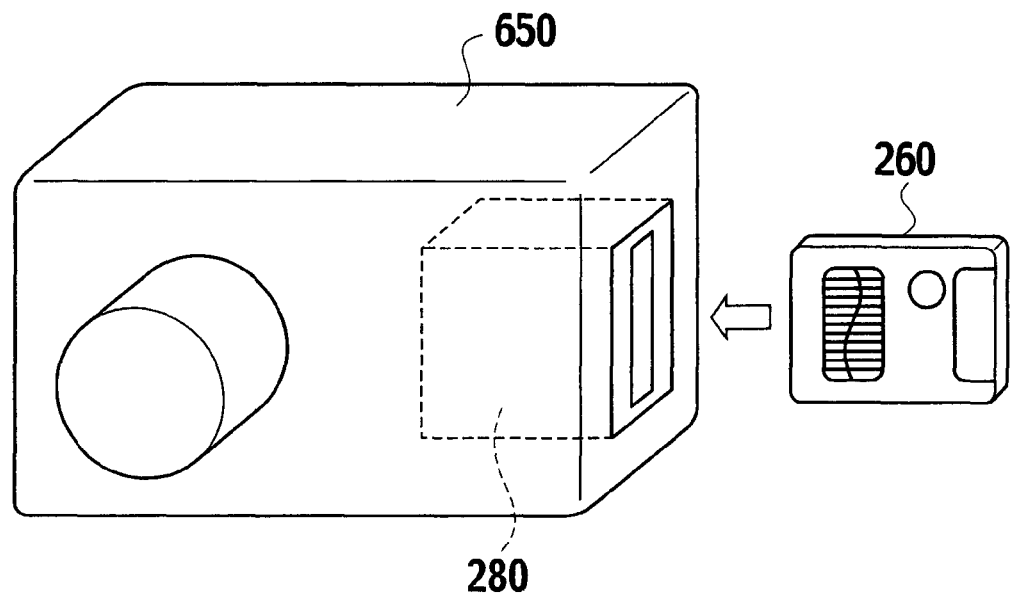
Figure 81:
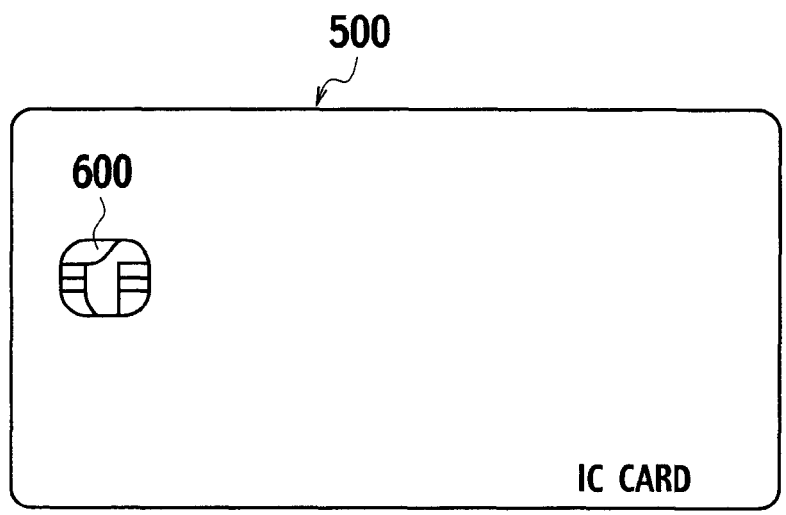
Figure 82:
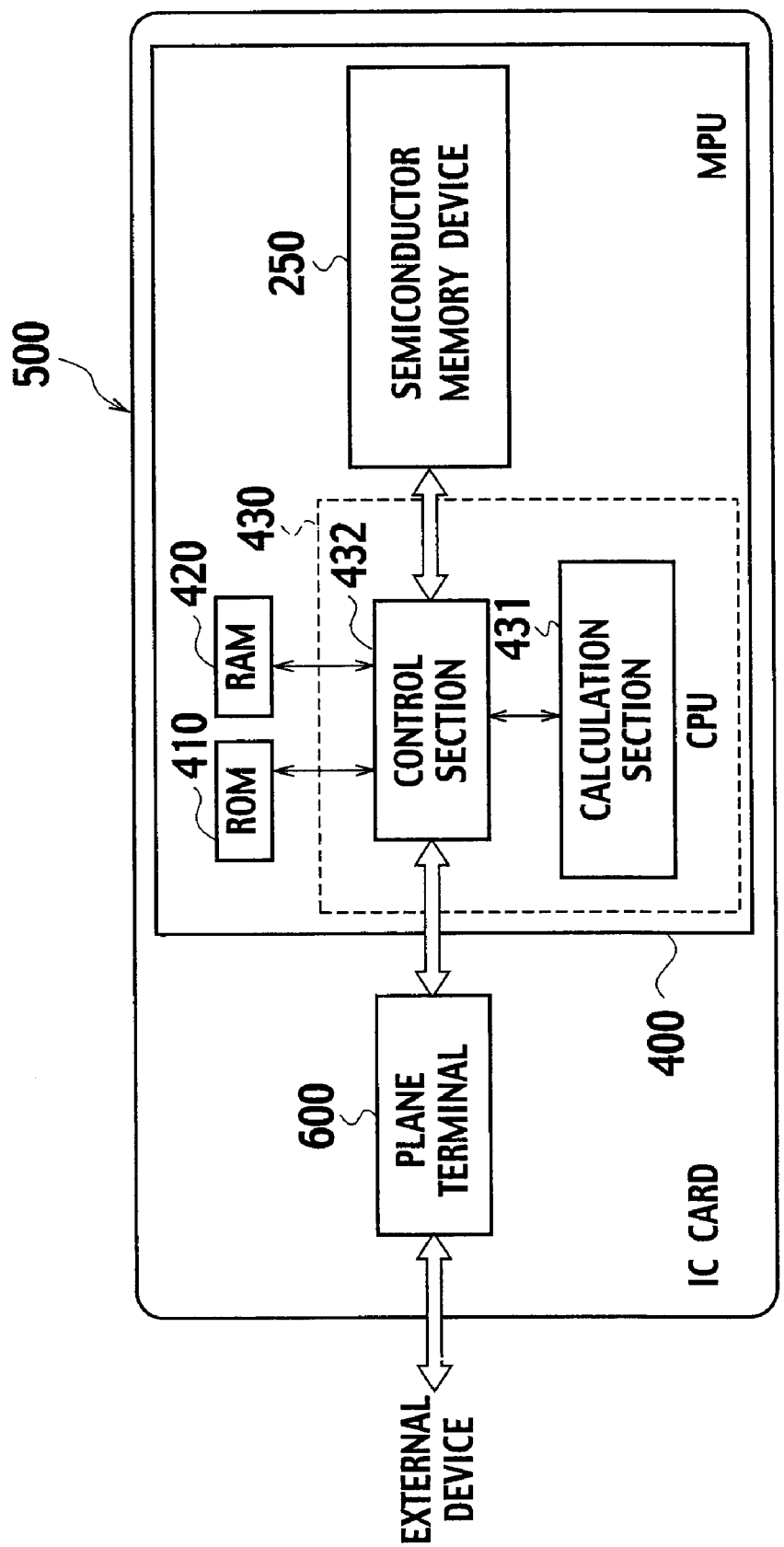
Figure 83:
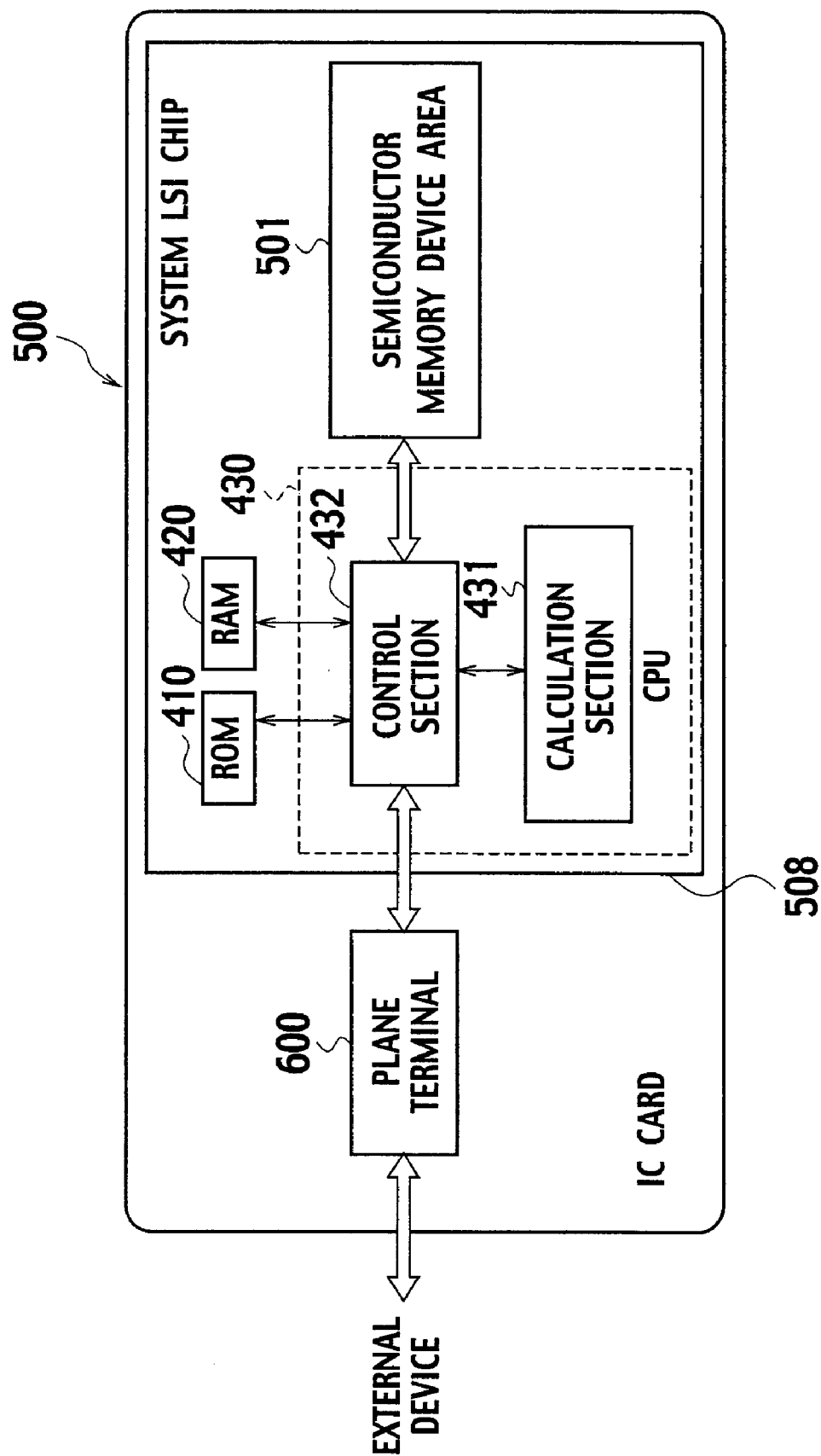
Figure 84:
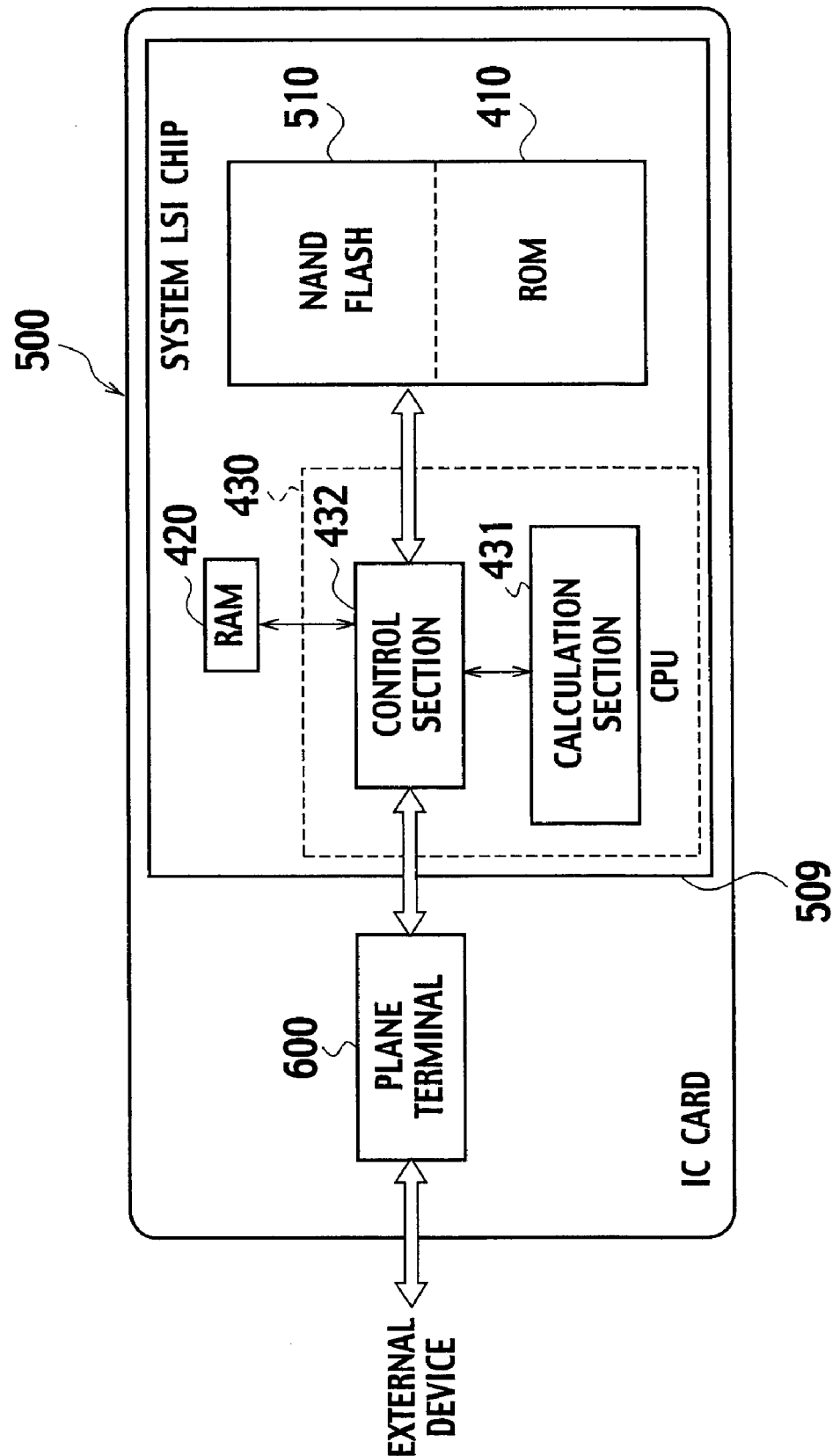
Figure 85:
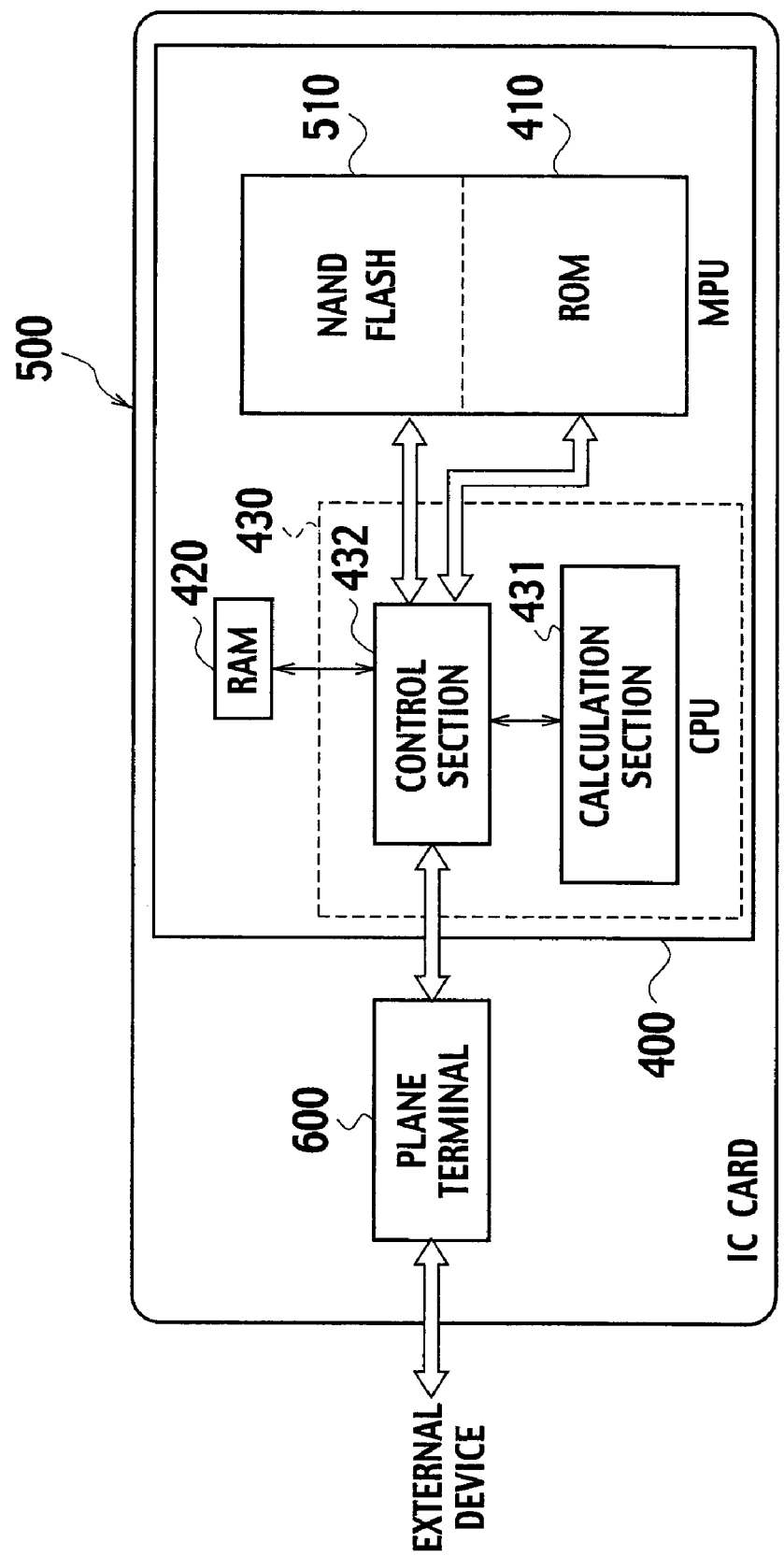

FIG. 54B schematically shows a cross section of a low voltage transistor in a low voltage transistor region, explaining a step of the fabrication process for the nonvolatile semiconductor memory, according to the second embodiment of the present invention;

FIG. 55A schematically shows a cross section of a high voltage transistor in a high voltage transistor region, explaining a step of the fabrication process for the nonvolatile semiconductor memory, according to the second embodiment of the present invention;

FIG. 55B schematically shows a cross section of a low voltage transistor in a low voltage transistor region, explaining a step of the fabrication process for the nonvolatile semiconductor memory, according to the second embodiment of the present invention;

FIG. 56A schematically shows a cross section of a high voltage transistor in a high voltage transistor region, explaining a step of the fabrication process for the nonvolatile semiconductor memory, according to the second embodiment of the present invention;

FIG. 56B schematically shows a cross section of a low voltage transistor in a low voltage transistor region, explaining a step of the fabrication process for the nonvolatile semiconductor memory, according to the second embodiment of the present invention;

FIG. 57A schematically shows a cross section of a high voltage transistor in a high voltage transistor region, explaining a step of the fabrication process for the nonvolatile semiconductor memory, according to the second embodiment of the present invention;

FIG. 57B schematically shows a cross section of a low voltage transistor in a low voltage transistor region, explaining a step of the fabrication process for the nonvolatile semiconductor memory, according to the second embodiment of the present invention;

FIG. 58A schematically shows a cross section of a high voltage transistor in a high voltage transistor region, explaining a step of the fabrication process for the nonvolatile semiconductor memory, according to the second embodiment of the present invention;

FIG. 58B schematically shows a cross section of a low voltage transistor in a low voltage transistor region, explaining a step of the fabrication process for the nonvolatile semiconductor memory, according to the second embodiment of the present invention;

FIG. 59A schematically shows a cross section of a high voltage transistor in a high voltage transistor region, explaining a step of the fabrication process for the nonvolatile semiconductor memory, according to the second embodiment of the present invention;

FIG. 59B schematically shows a cross section of a low voltage transistor in a low voltage transistor region, explaining a step of the fabrication process for the nonvolatile semiconductor memory, according to the second embodiment of the present invention;

FIG. 60A schematically shows a cross section of a high voltage transistor in a high voltage transistor region, explaining a step of the fabrication process for the nonvolatile semiconductor memory, according to the second embodiment of the present invention;

FIG. 60B schematically shows a cross section of a low voltage transistor in a low voltage transistor region, explaining a step of the fabrication process for the nonvolatile semiconductor memory, according to the second embodiment of the present invention;

FIG. 61A schematically shows a cross section of a high voltage transistor in a high voltage transistor region, explaining a step of the fabrication process for the nonvolatile semiconductor memory, according to the second embodiment of the present invention;

FIG. 61B schematically shows a cross section of a low voltage transistor in a low voltage transistor region, explaining a step of the fabrication process for the nonvolatile semiconductor memory, according to the second embodiment of the present invention;

FIG. 62A schematically shows a cross section of a high voltage transistor in a high voltage transistor region, explaining a step of the fabrication process for the nonvolatile semiconductor memory, according to the second embodiment of the present invention;

FIG. 62B schematically shows a cross section of a low voltage transistor in a low voltage transistor region, explaining a step of the fabrication process for the nonvolatile semiconductor memory, according to the second embodiment of the present invention;

FIG. 63A schematically shows a cross section of a high voltage transistor in a high voltage transistor region, explaining a step of the fabrication process for the nonvolatile semiconductor memory, according to the second embodiment of the present invention;

FIG. 63B schematically shows a cross section of a low voltage transistor in a low voltage transistor region, explaining a step of the fabrication process for the nonvolatile semiconductor memory, according to the second embodiment of the present invention;

FIG. 64 schematically shows a block diagram of the nonvolatile semiconductor memory, according to the first embodiment of the present invention;

FIG. 65 schematically shows a detailed block diagram of the nonvolatile semiconductor memory, according to the first embodiment of the present invention;

FIG. 66 schematically shows a circuit diagram of a NAND memory cell array in the nonvolatile semiconductor memory, according to the first embodiment of the present invention;

FIG. 67 schematically shows a circuit diagram of a NAND memory cell array in the nonvolatile semiconductor memory, according to the second embodiment of the present invention;

FIG. 68 schematically shows a circuit diagram of a NOR memory cell array in nonvolatile semiconductor memory, according to a third embodiment of the present invention;

FIG. 69 schematically shows a circuit diagram of a two-transistor/cell memory cell array in nonvolatile semiconductor memory, according to a fourth embodiment of the present invention;

FIG. 70 schematically shows a circuit diagram of a three-transistor/cell memory cell array in nonvolatile semiconductor memory, according to a fifth embodiment of the present invention;

FIG. 71 schematically shows a block diagram of an application example of the nonvolatile semiconductor memories, according to the first through the sixth embodiment of the present invention, more specifically the flash memory device and the flash memory system thereof;

FIG. 72 schematically shows the internal structure of a memory card to which is applied the nonvolatile semiconductor memories, according to the first through the sixth embodiment of the present invention;

FIG. 73 schematically shows the internal structure of the memory card to which is applied the nonvolatile semiconductor memories, according to the first through the sixth embodiment of the present invention;

FIG. 74 schematically shows the internal structure of the memory card to which is applied the nonvolatile semiconductor memories, according to the first through the sixth embodiment of the present invention;

FIG. 75 schematically shows the internal structure of the memory card to which is applied the nonvolatile semiconductor memories, according to the first through the sixth embodiment of the present invention;

FIG. 76 schematically shows the internal structure of the memory card to which is applied the nonvolatile semiconductor memories, according to the first to the sixth embodiment of the present invention;

FIG. 77 schematically shows a structure of the memory card and a card holder to which is applied the nonvolatile semiconductor memories, according to the first through the sixth embodiment of the present invention;

FIG. 78 schematically shows a structure of the connecting equipment capable of accommodating the memory card and the card holder thereof to which is applied the nonvolatile semiconductor memories, according to the first through the sixth embodiment of the present invention;

FIG. 79 schematically shows a structure of the connecting equipment, which houses a memory card to which is applied the nonvolatile semiconductor memories, according to the first through the sixth embodiment of the present invention, and is used to connect to a personal computer via a connecting wire;

FIG. 80 schematically shows a digital camera system capable of housing the memory card to which is applied the nonvolatile semiconductor memories, according to the first through the sixth embodiment of the present invention;

FIG. 81 schematically shows a structure of an IC card to which is applied the nonvolatile semiconductor memories, according to the first to the sixth embodiment of the present invention;

FIG. 82 schematically shows the internal structure of the IC card to which is applied the nonvolatile semiconductor memories, according to the first through the sixth embodiment of the present invention;

FIG. 83 schematically shows the internal structure of the IC card to which is applied the nonvolatile semiconductor memories, according to the first through the sixth embodiment of the present invention;

FIG. 84 schematically shows the internal structure of the IC card to which is applied the nonvolatile semiconductor memories, according to the first through the sixth embodiment of the present invention; and FIG. 85 schematically shows the internal structure of the IC card to which is applied the nonvolatile semiconductor memories, according to the first through the sixth embodiment of the present invention.

DETAILED DESCRIPTION OF THE INVENTION

Referencing the drawings, the first to the sixth embodiment according to the present invention are explained forthwith. The same or similar symbols are applied to the same or similar parts throughout the appended drawings. However, it should be noted that the drawings are merely schematics and that the relationship between thickness and planar dimension, and the ratio of respective layer thicknesses and the like differ from those of the actual invention.

Accordingly, specific thicknesses and dimensions should be determined while considering the following description. Furthermore, needless to say that parts with differing dimensions and/or differing ratios among the drawings may be included.

In addition, the first to the sixth embodiments given forthwith illustrate devices and methods for embodying the technical idea of the present invention, and that technical idea of the present invention is not limited to the following materials, shapes, structures, arrangements or the like. The technical idea of the present invention may be modified into various modifications within the scope of the appended claims.

A process for forming a NAND nonvolatile semiconductor memory includes a method for 'all gate pre-fabrication' process of forming all of gate insulating films before formation of element isolating regions (STI). The method for 'all gate pre-fabrication' process is advantageous to the simplification of fabrication processes since it provides gate insulating films in low voltage circuit regions having the same thickness as those of gate insulating films in the memory cell array regions.

Meanwhile, there is also a method for 'post-fabrication' process of forming a gate insulating film (tunneling oxide film) in a high voltage circuit region and a low voltage circuit region, which comprises a peripheral circuit region of the memory cell array region, independently.

The method for 'post-fabrication' process forms a gate insulating film in the peripheral low voltage circuit region and the high voltage circuit region while separately adjusting the thickness thereof. In particular, it is possible to form extremely thinner-thickness gate insulating films of low voltage transistors in the low voltage circuit region than the thickness of the gate insulating films of memory cell transistors. This allows increase the value of the mutual conductance $g_m$ for the low voltage transistors, providing transistors having excellent driving capability, which is advantageous.

The nonvolatile semiconductor memory according to the embodiments of the present invention is fabricated through the 'all gate pre-fabrication' process through which all of gate insulating films are formed before formation of element insulating regions STI.

According to the embodiments of the nonvolatile semiconductor memories of the present invention, formation of metallic silicide films on gate electrode layers of a variety of elements and word lines allows provision of higher-speed operability, higher integration, and simpler processing of memory cell transistors; higher-speed operability and simpler processing of low voltage transistors; and higher breakdown voltage capability, higher-speed operability, and simpler processing of high voltage transistors at the same time.

First Embodiment (Entire Plan View of Pattern Block Structure)

The schematically shown pattern block diagram of entire plan view of the nonvolatile semiconductor memory according to the first embodiment of the present invention includes a cell array region 120 arranged on a semiconductor chip 110, high voltage circuit regions 90, low voltage circuit regions 80, and other circuit regions 100, which include a low and a high voltage circuit and resistor element regions, as shown in FIG. 64, for example. The high voltage circuit regions 90 include circuits for applying higher voltage pulses than the value of power supply voltages such as a write-in voltage $V_{pgm}$, an erase voltage $V_{erase}$ or the like to the cell array region 120. The low voltage circuit regions 80 include logic circuits such as CMOS, which are required to operate at a higher speed with low power consumption. The other circuit regions 100 include low voltage circuits and high voltage circuits other than the circuits disposed in the high voltage circuit regions 90 and the low voltage circuit regions 80, and resistor element regions for generating reference voltages.

In the nonvolatile semiconductor memory according to the first embodiment of the present invention, the cell array region 120, the high voltage circuit regions 90, and the low voltage circuit regions 80 relate to one another. Furthermore, the cell array region 120, the low and the high voltage circuits in the other circuit regions 100, and the resistor element regions used to generate reference voltages also relate to one another. Yet furthermore, the cell array region 120, the high voltage circuits 90, the low voltage circuits 80, and interconnect wiring regions in the other circuit regions 100 also relate to one another.

The nonvolatile semiconductor memory 140, fabricated on a semiconductor chip 110, according to the first embodiment of the present invention is explained in detail forthwith; as shown in FIG. 65, it is constructed by a memory cell array 130, a data select line driver 42, a row decoder 43, an address buffer 47, a column decoder 39, a sense amplifier/data register 37, a data input/output buffer 45, a substrate voltage control circuit 44, a control circuit 35, a $V_{pgm}$ generating circuit 41*a*, a $V_{pass}$ generating circuit 41*b*, a $V_{read}$ generating circuit 41*c*, and a $V_{ref}$ generating circuit 41*d*.

The memory cell array 130, as is described later, is constructed by arranging memory cell blocks in a matrix, each including nonvolatile memory cell transistors and select transistors connected to one another in series or in parallel. The sense amplifier/data register 37 is disposed so as to either sense data transferred through a data transfer line in the memory cell array 130 or hold write-in data. The sense amplifier/data register 37 also works as a data latch and is mainly made up of flip-flop circuits, for example. The sense amplifier/data register 37 is connected to the data input/output buffer 45. These connections are controlled in conformity with the output of the column decoder 39, which receives an address signal from the address buffer 47. Data provided to the data input/output buffer 45 can be written in the memory cell array 130, and data stored in the memory cell array 130 can be read out to the data input/output buffer 45. The row decoder 43, which includes an address selecting circuit used to select a memory cell element, more specifically to control the data select line and block select line, is disposed for the memory cell array 130.

The substrate voltage control circuit 44 is prepared for controlling the voltage applied on a p-type semiconductor substrate (or p-type well region) in which the memory cell array 130 is formed and is preferable to be constructed so that the voltage is boosted u to an erase voltage of 10V or greater when erasing. Furthermore, the $V_{pgm}$ generating circuit 41a, which generates the boosted write-in voltage $V_{pgm}$ higher than the value of the power supply voltage when writing data in a memory cell transistor selected from the memory cell array 130, is disposed. In addition to the $V_{pgm}$ generating circuit 41a, the $V_{pass}$ generating circuit 41b, which generates an intermediate voltage $V_{pass}$ applied to non-selected memory cells when writing in data, and the $V_{read}$ generating circuit 41c, which generates an intermediate voltage $V_{read}$ applied to non-selected memory cells when reading out data, are provided. The circuits 41a, 41b, 41c, 41d are controlled by the control circuit 35 so that an appropriate voltage output can be applied to the data select line driver 42 in each of a write-in, an erase, and a read-out state.

The write-in voltage $V_{pgm}$ is between 6 V and 30 V while the intermediate voltage $V_{pass}$ is between 3 V and 15 V. The intermediate voltage $V_{read}$ used for reading out is between 1 V and 9 V, and is preferably higher than a write-in threshold voltage limit by approximately 1 V so that a NAND memory cell array can ensure a sufficient amount of read-out current and that the read disturb characteristics can be degraded. The data select line driver 42 is a switch circuit, which applies an output voltage to the control gate electrode of a memory cell transistor to be read out or written in or to the gate electrode of a select transistor in conformity with the output of the row decoder 43.

The high voltage circuit regions 90 include the row decoder 43 and the data select line driver 42 in FIG. 65 while the low voltage circuit regions 80 include the sense amplifier/data register 37 and the column decoder 39. The high voltage transistors denote transistors arranged in the high voltage circuit regions 90 or transistors to which 15 V or greater are applied, while the low voltage transistors denote transistors arranged in the low voltage circuit regions 80 or transistors to which less than 15 V are applied.

(NAND Circuit Structure)

As shown in FIG. 66, the schematically shown circuit structure of a memory cell array 130, according to the nonvolatile semiconductor memory of the first embodiment of the present invention, comprises a circuit structure of a NAND memory cell array.

Each of NAND cell units 132 includes memory cell transistors M0 to M15 and select gate transistors SG1 and SG2, as shown in detail in FIG. 66. The drain of the select gate transistor SG1 is connected to bit lines $BL_{j-1}$, $BL_j$, $BL_{j+1}$, ... via bit line contacts CB, while the source of the select gate transistor SG2 is connected to a source line SL via source line contacts CS.

The plurality of memory cell transistors M0 to M15 are connected in series along the column direction extending along the bit lines $BL_{j-1}$, $BL_j$, $BL_{j+1}$, ... via n-type source/drain regions of respective memory cell transistors M0 to M15. At both ends thereof, the select gate transistors SG1 and SG2 are disposed.

Both ends of the plurality of memory cell transistors M0 to M15 connected in series are connected to the bit line contacts CB and the source line contacts CS via the select gate transistors SG1 and SG2. As a result, each NAND cell unit 132 is configured. These NAND cell units 132 are arranged in parallel to the row direction extending along the plurality of word lines WL0, WL1, WL2, WL3, ..., WL14, and WL15 perpendicular to the column direction extending along the plurality of bit lines $BL_{j-1}$, $BL_j$, $BL_{j+1}$, ....

(Device Structure)

As shown in FIGS. 1, 33, 34, 35A, 35B and 64, the nonvolatile semiconductor memory according to the first embodiment of the present invention includes: a cell array region 120, which includes memory cell transistors, each constructed by first source/drain diffusion layers 34, a first tunneling insulating film 20 on the semiconductor region between adjacent first source/drain diffusion layers 34, a first floating gate electrode layer 50 on the first tunneling insulating film 20, a first inter-gate insulating film 25 on the first floating gate electrode layer 50, a first control gate electrode layer 48 on the first inter-gate insulating film 25, a second control gate electrode layer 46 on the first control gate electrode layer 48, a first metallic silicide film 53 electrically connected to the second control gate electrode layer 46; high voltage circuit regions 90, which include high voltage transistors, each constructed by second source/drain regions 36 or 38, a high voltage gate insulating film 21 disposed around the cell array region 120 and on the semiconductor region between the second source/drain regions 36 or 38, a high voltage gate electrode layer 51 on the high voltage gate insulating film 21, a second inter-gate insulating film 25 with an aperture on the high voltage gate electrode layer 51, a third control gate electrode layer 48 on the second inter-gate insulating film 25, a fourth control gate electrode layer 46 on the third control gate electrode layer 48, and a second metallic silicide film 53 electrically connected to the fourth control gate electrode layer 46; and low voltage circuit regions 80, which are arranged in different areas from the high voltage circuit regions 90 arranged around the cell array region 120 and include low voltage transistors, each constructed by third source/drain regions 36 or 38, a second tunneling insulating film 20 on the semiconductor region between the third source/drain regions 36 or 38, a second floating gate electrode layer 50 on the second tunneling insulating film 20, a third inter-gate insulating film 25 with an aperture on the second floating gate electrode layer 50, a fifth control gate electrode layer 48 on the third inter-gate insulating film 25, a sixth control gate electrode layer 46 on the fifth control gate electrode layer 48, and a third metallic silicide film 53 electrically connected to the sixth control gate electrode layer 46; and further including a liner insulating film 27 directly disposed on the first source/drain diffusion layers 34, the second source/drain regions 36 or 38, and the third source/drain regions 36 or 38.

Alternatively, the nonvolatile semiconductor memory according to the first embodiment of the present invention may include a barrier insulating film 29 on a first source/drain diffusion layer 34, a second source/drain region 36 or 38, and a third source/drain region 36 or 38; wherein a part of the barrier insulating film 29 makes contact with a liner insulating film 27.

Alternatively, in the nonvolatile semiconductor memory according to the first embodiment of the present invention, the barrier insulating film 29 may also be formed on the first, the second, and the third metallic silicide film 53.

Alternatively, in the nonvolatile semiconductor memory according to the first embodiment of the present invention, the height from the surface of the semiconductor substrate in which the first through third source/drain regions are formed to the barrier insulating film 29 may be greater than that to the first through third inter-gate insulating films 25.

In the nonvolatile semiconductor memory according to the first embodiment of the present invention, each of the memory transistors and the transistors formed in the peripheral low voltage circuit regions 80 and the high voltage circuit regions 90 have a stacked gate structure.

Figure 33:
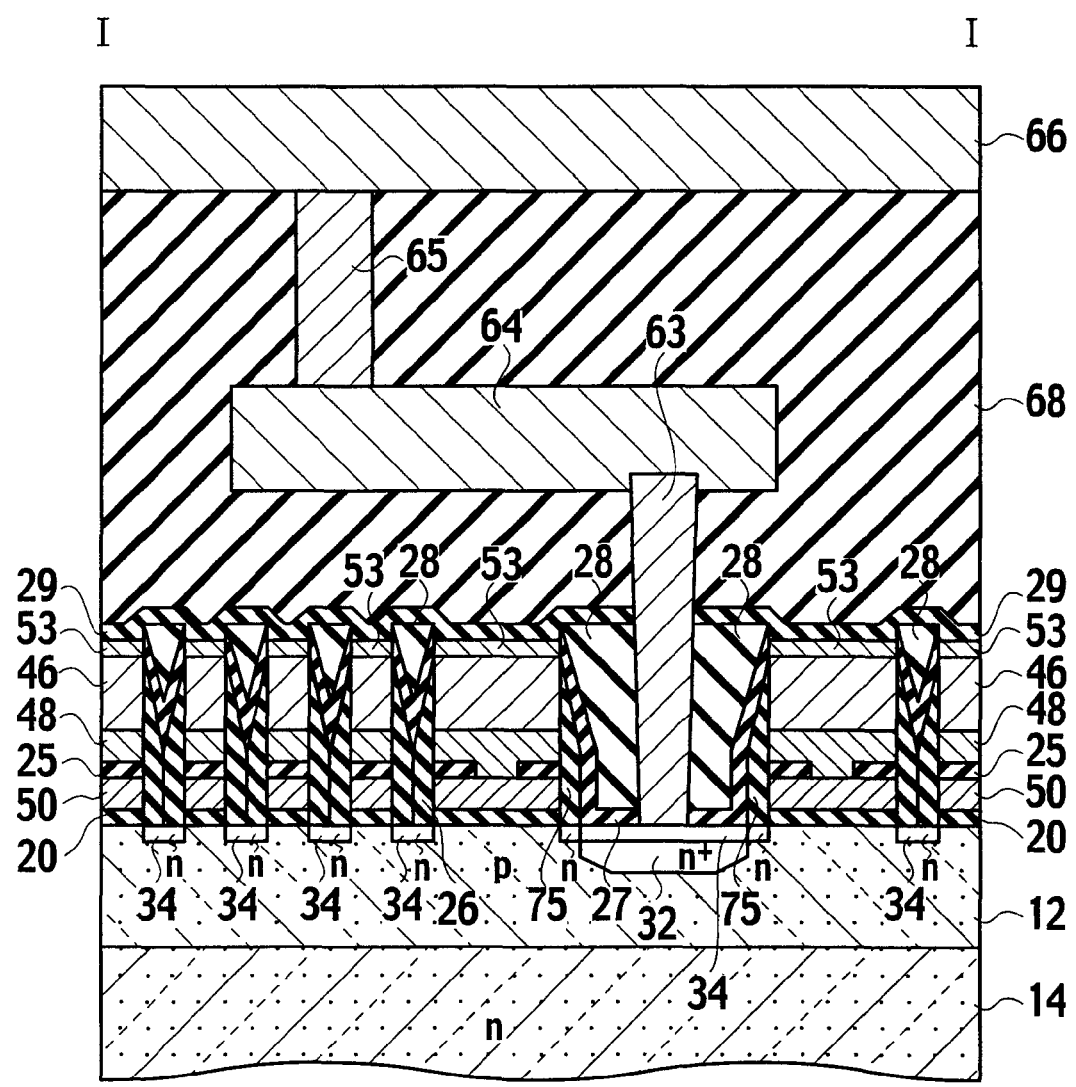
FIG. 33 schematically shows a cross section of the nonvolatile semiconductor memory, according to the first embodiment of the present invention, cut along the line I-I in FIG. 1, explaining a step of the fabrication process thereof.
Figure 34:
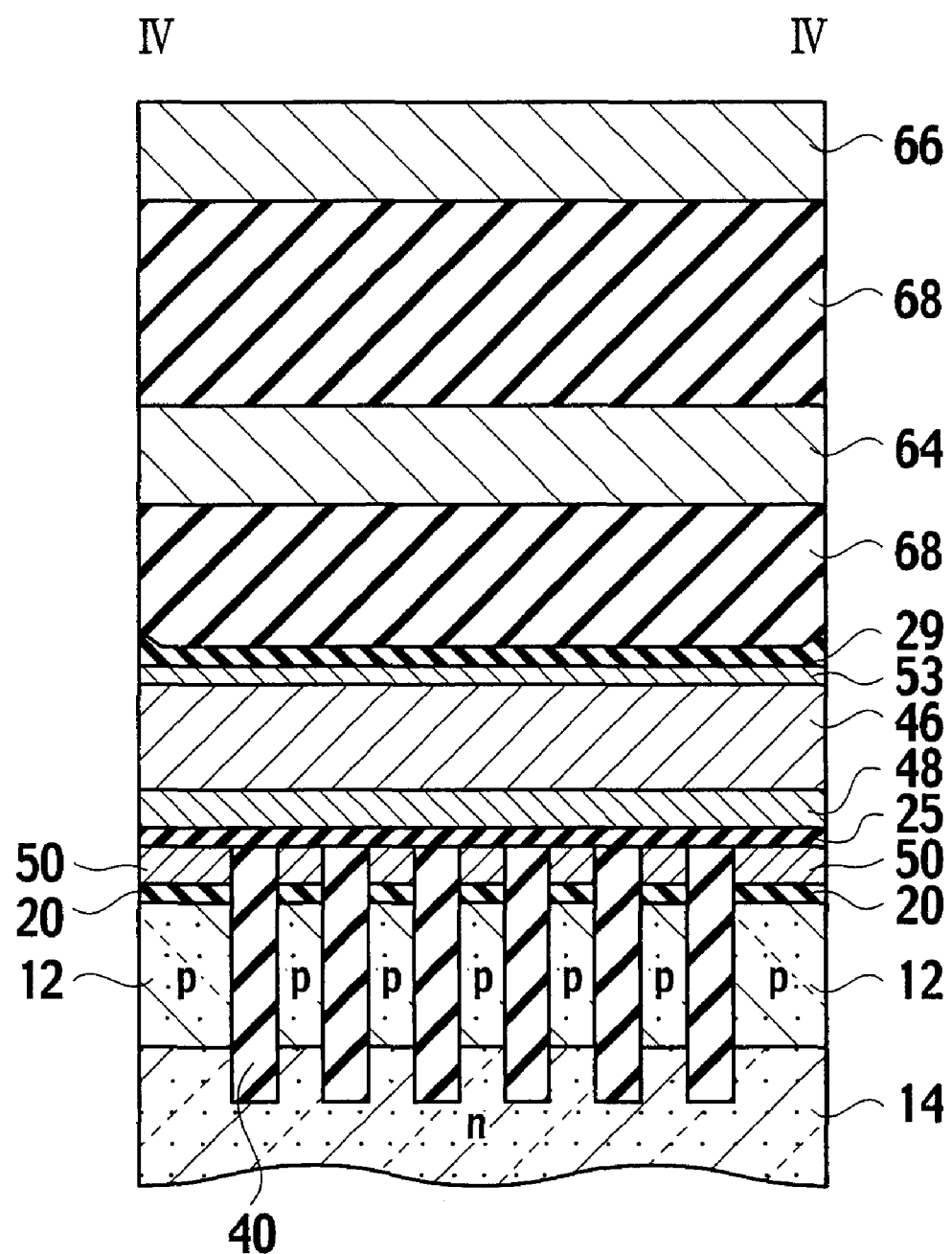
FIG. 34 schematically shows a cross section of the nonvolatile semiconductor memory, according to the first embodiment of the present invention, cut along the line IV-IV in FIG. 1, explaining a step of the fabrication process thereof.

The memory cell transistor in the cell array region 120 includes a semiconductor substrate 10, a n-well region 14 and a p-well region 12 formed in the semiconductor substrate 10 (12, 14), a tunneling insulating film 20 disposed on the semiconductor substrate 10, a floating gate electrode layer 50 formed on the tunneling insulating film 20, an inter-gate insulating film 25 disposed on the floating gate electrode layers 50, a first control gate electrode layer 48 disposed on the inter-gate insulating film 25, a second control gate electrode layer 46 disposed on the first control gate electrode layer 48, and a metallic silicide film 53 electrically connected to the upper region of the second control gate electrode layer 46, as shown in FIGS. 33 and 34.

The second control gate electrode layer 46 corresponds to word lines and thus the metallic silicide film 53 configures word lines.

Each of the select gate transistors SG1, SG2 formed adjacent to the memory cell transistors in the cell array region 120 include the floating gate electrode layer 50, the inter-gate insulating film 25 having an aperture disposed on the floating gate electrode layer 50, and the first control gate electrode layer 48 disposed on the inter-gate insulating film 25 having an aperture, the second control gate electrode layer 46 disposed on the first control gate electrode layer 48, and the metallic silicide film 53 electrically connected to the upper region of the second control gate electrode layer 46. The floating gate electrode layer 50 and the first control gate electrode layer 48 are electrically connected via the aperture of the inter-gate insulating film 25. Therefore, the floating gate electrode layer 50, the first control gate electrode layer 48 connected to the floating gate electrode layer 50, the second control gate electrode layer 46 disposed on the first control gate electrode layer 48, and the metallic silicide film 53 disposed on the second control gate electrode layer 46 are conductively in common, configuring the gate electrodes of the select gate transistors and select gate lines SGD, SGS disposed in parallel to the word lines. As shown in FIG. 35A, the high voltage circuit region (HV) 90 includes a p-well region 16 and a n-well region 18 formed within the semiconductor substrate 10, a nMOS transistor formed within the p-well region 16, and a pMOS transistor formed within the n-well region 18, for example.

The detailed structure of nMOS transistors in the high voltage circuit regions 90 includes a p-well region 16 formed in the semiconductor substrate 10, the high voltage gate insulating film 21 disposed on the p-well region 16, a high voltage gate electrode layer 51 disposed on the high voltage gate insulating film 21, the n-type source/drain regions 36, which are disposed on the surface of the p-well region 16 and become a source or a drain region, the inter-gate insulating film 25 having an aperture disposed on the high voltage gate electrode layer 51, the first control gate electrode layer 48 disposed on the inter-gate insulating film 25 having the aperture, the second control gate electrode layer 46 disposed on the first control gate electrode layer 48, and the metallic silicide film 53 electrically connected to the upper region of the second control gate electrode layer 46, for example.

The high voltage gate electrode layer 51 and the first control gate electrode layer 48 are connected to each other via the aperture of the inter-gate insulating film 25. Therefore, the high voltage gate electrode layer 51, the first control gate electrode layer 48 connected to the high voltage gate electrode layer 51, the second control gate electrode layer 46 disposed on the first control gate electrode layer 48, and the metallic silicide film 53 disposed on the second control gate electrode layer 46 are conductively in common, and become the gate electrodes of the nMOS high voltage transistors in the high voltage circuit regions 90.

Likewise, the detailed structure of each of the nMOS transistors in the high voltage circuit regions 90 includes the n-well region 18 formed in the semiconductor substrate 10, the high voltage gate insulating film 21 disposed on the n-well region 18, the high voltage gate electrode layer 51 disposed on the high voltage gate insulating film 21, the p-type source/drain regions 38, which are disposed on the surface of the n-well region 18 and become a source or a drain region, the inter-gate insulating film 25 having an aperture disposed on the high voltage gate electrode layer 51, the first control gate electrode layer 48 disposed on the inter-gate insulating film 25 having the aperture, the second control gate electrode layer 46 disposed on the first control gate electrode layer 48, and the metallic silicide film 53 electrically connected to the upper region of the second control gate electrode layer 46, for example.

The high voltage gate electrode layer 51 and the first control gate electrode layer 48 are electrically connected via the aperture in the inter-gate insulating film 25. Therefore, the high voltage gate electrode layer 51, the first control gate electrode layer 48 connected to the high voltage gate electrode layer 51, the second control gate electrode layer 46 disposed on the first control gate electrode layer 48, and the metallic silicide film 53 disposed on the second control gate electrode layer 46 are conductively in common, and become the gate electrodes of respective pMOS transistors in the high voltage circuit region 90.

As shown in FIG. 35B, the low voltage circuit region (LV) 80 includes the p-well region 16 and the n-well region 18 formed in the semiconductor substrate 10, nMOS transistors formed within the p-well region 16, and pMOS transistors formed within the n-well region 18, for example.

Likewise, the detailed structure of each of the nMOS transistors in the low voltage circuit region 80 includes the p-well region 16 formed in the semiconductor substrate 10, a gate insulating film formed on the p-well region 16 at the same time as the tunneling insulating film 20 is formed, the floating gate electrode layer 50 disposed on the tunneling insulating film 20, the n-type source/drain regions 36, which are disposed on the surface of the p-well region 16 and become a source or a drain region, the inter-gate insulating film 25 having an aperture disposed on the floating gate electrode layer 50, the first control gate electrode layer 48 disposed on the inter-gate insulating film 25 having the aperture, the second control gate electrode layer 46 disposed on the first control gate electrode layer 48, and the metallic silicide film 53 electrically connected to the upper region of the second control gate electrode layer 46, for example.

The floating gate electrode layer 50 and the first control gate electrode layer 48 are connected to each other via the aperture of the inter-gate insulating film 25. Therefore, the floating gate electrode layer 50, the first control gate electrode layer 48 connected to the floating gate electrode layer 50, the second control gate electrode layer 46 disposed on the first control gate electrode layer 48, and the metallic silicide film 53 disposed on the second control gate electrode layer 46 are conductively in common, and become the gate electrodes of respective nMOS high voltage transistors in the low voltage circuit region (LV) 80.

Likewise, the detailed structure of each of the pMOS transistors in the low voltage circuit region 80 includes the p-well region 18 formed in the semiconductor substrate 10, a gate insulating film formed on the n-well region 18 at the same time as the tunneling insulating film 20 is formed, the floating gate electrode layer 50 disposed on the tunneling insulating film 20, the p-type source/drain regions 38, which are disposed on the surface of the n-well region 18 and become a source or a drain region, the inter-gate insulating film 25 having an aperture disposed on the floating gate electrode layer 50, the first control gate electrode layer 48 disposed on the inter-gate insulating film 25 having the aperture, the second control gate electrode layer 46 disposed on the first control gate electrode layer 48, and the metallic silicide film 53 electrically connected to the upper region of the second control gate electrode layer 46, for example. The floating gate electrode layer 50 and the first control gate electrode layer 48 are connected via the aperture in the inter-gate insulating film 25.

Therefore, the floating gate electrode layer 50, the first control gate electrode layer 48 connected to the floating gate electrode layer 50, the second control gate electrode layer 46 disposed on the first control gate electrode layer 48, and the metallic silicide film 53 disposed on the second control gate electrode layer 46 are conductively in common, and become the gate electrodes of respective pMOS high voltage transistors in the low voltage circuit region 80.

(Fabrication Method)

Figure 1:
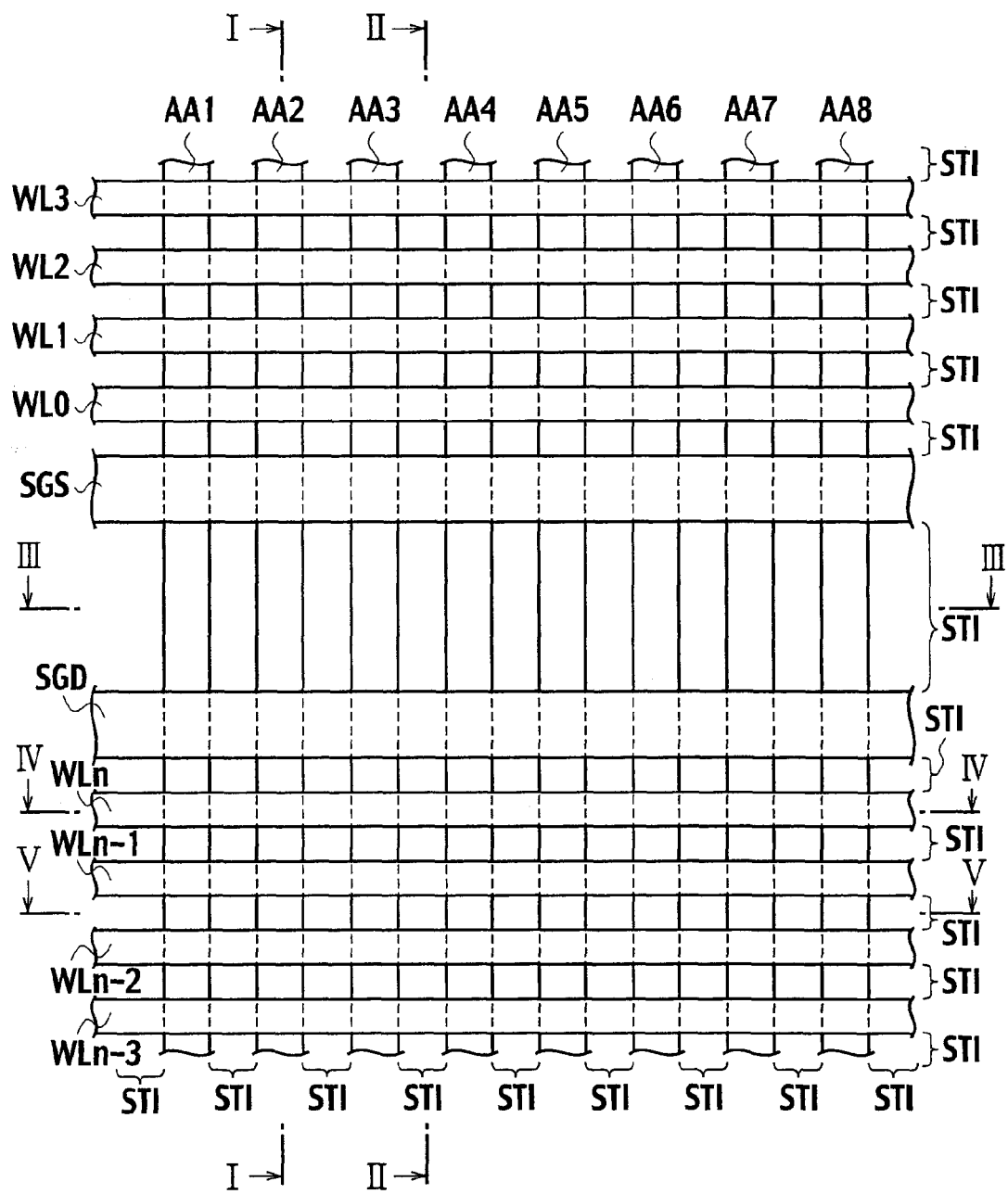
FIG. 1 schematically shows a plan view pattern of a memory cell array of a nonvolatile semiconductor memory, according to a first and a second embodiment of the present invention.
Figures 2A, 2B:
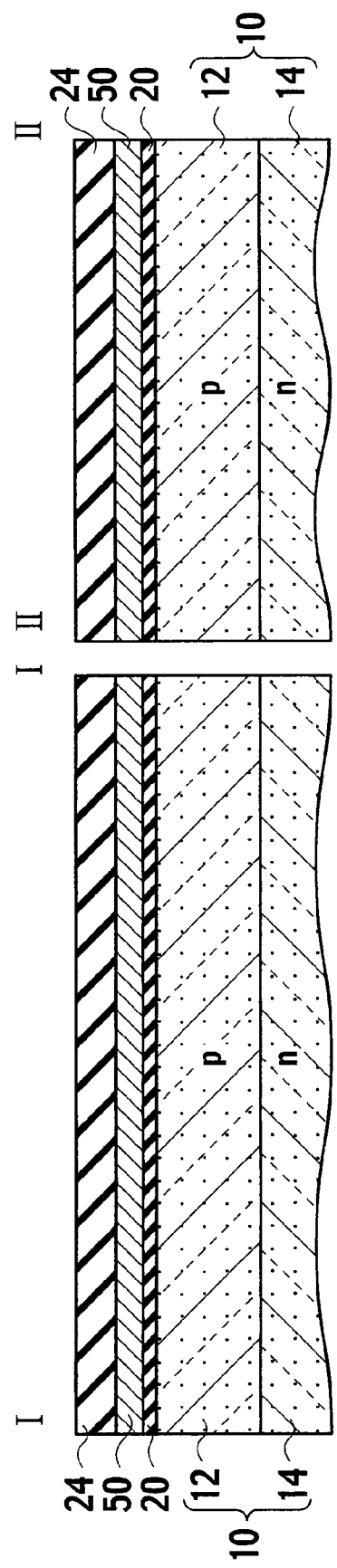
FIG. 2A schematically shows a cross section of the nonvolatile semiconductor memory, according to the first embodiment of the present invention, cut along a line I-I in FIG. 1, explaining a step of a fabrication process thereof.
FIG. 2B schematically shows a cross section of the nonvolatile semiconductor memory, according to the first embodiment of the present invention, cut along a line II-II in FIG. 1, explaining a step of the fabrication process thereof.
Figures 6A, 6B, 6C:
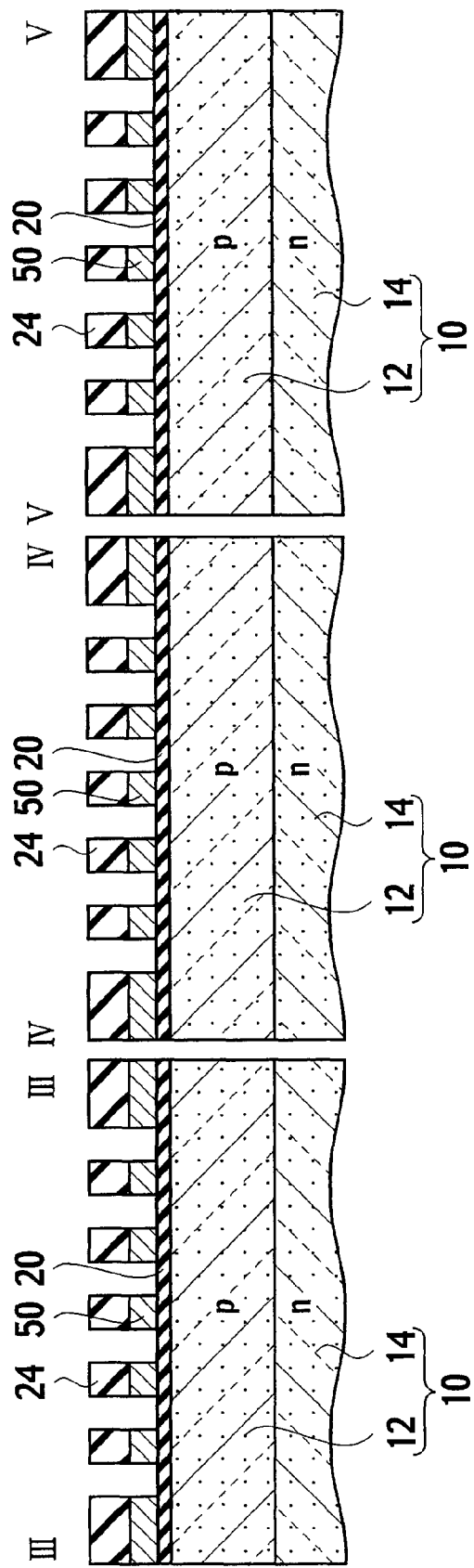
FIG. 6A schematically shows a cross section of the nonvolatile semiconductor memory, according to the first embodiment of the present invention, cut along a line III-III in FIG. 1, explaining a step of the fabrication process thereof.
FIG. 6B schematically shows a cross section of the nonvolatile semiconductor memory, according to the first embodiment of the present invention, cut along a line IV-IV in FIG. 1, explaining a step of the fabrication process thereof.
FIG. 6C schematically shows a cross section of the nonvolatile semiconductor memory, according to the first embodiment of the present invention, cut along a line V-V in FIG. 1, explaining a step of the fabrication process thereof.

As shown in FIG. 1, the plan view pattern of the nonvolatile semiconductor memory according to the first embodiment of the present invention includes a plurality of active regions AA1, AA2, AA3, AA4, AA5, AA6, AA7, AA8, ... extending along the column direction, element isolating regions (STI), which extend along the column direction and isolate each of the active regions AA1, AA2, AA3, AA4, AA5, AA6, AA7, AA8, ..., a plurality of word lines WL0, WL1, WL2, WL3, ..., WLn–3, WLn–2, WLn–1, and WLn, which extend along the row direction, and select gate lines SGS and SGD, which extend along the row direction. The select gate line SGS may be the SGD, alternatively. Moreover, the select gate line SGD may alternatively be the SGS. Alternatively, each of the select gate lines SGS and SGD may be configured with a plurality of lines.

In FIG. 1, the line I-I denotes a section line on active region AA2 extending along the column direction while the line II-II denotes a section line on an element isolating region (STI) between the active regions AA3 and AA4 extending along the column direction. The line III-III denotes a section line between the select gate lines SGS and SGD extending along the row direction while the line IV-IV denotes a section line on the word line $WL_n$ extending along the row direction. The line V-V denotes a section line between the word lines $WL_{n-1}$ and $WL_{n-2}$ extending along the row direction.

A fabrication method for the nonvolatile semiconductor memory according to the first embodiment of the present invention is described, referencing FIGS. 1 through 35.

(A-1) First, as shown in FIGS. 2A and 2B and 3A through 3C, an ion implantation (I/I) process is performed into the cell array region 120, forming a p-well region 12 and a n-well region 14, and at the same time, as shown in FIGS. 4A and 4B, an ion implantation (I/I) process is performed into the high voltage transistor region (HV) and the low voltage transistor region (LV), forming a p-well region 16 and a n-well region 18 in the semiconductor substrate 10.

(A-2) Next, as shown in FIGS. 2A and 2B, 3A through 3C, and 4A and 4B, the semiconductor substrate 10 is exposed to an oxidized atmosphere at high temperature, growing a tunneling insulating film 20 on the semiconductor substrate 10.

(A-3) Next, after a floating gate electrode layer 50, which is a material for floating gate electrodes of memory cell transistors, is deposited on the tunneling insulating film 20, a stopper film 24 is deposited on the floating gate electrode layer 50. At the same time, as shown in FIGS. 4A and 4B, after a floating gate electrode layer 50 is also deposited on the high voltage transistor region (HV) and the low voltage transistor region (LV), a stopper film 24 is deposited on the floating gate electrode layer 50. The stopper film 24 is a film layer working as a stopper film layer used for polishing and planarizing the surface of the device through the chemical mechanical polishing (CMP) process.

Figure 7A:
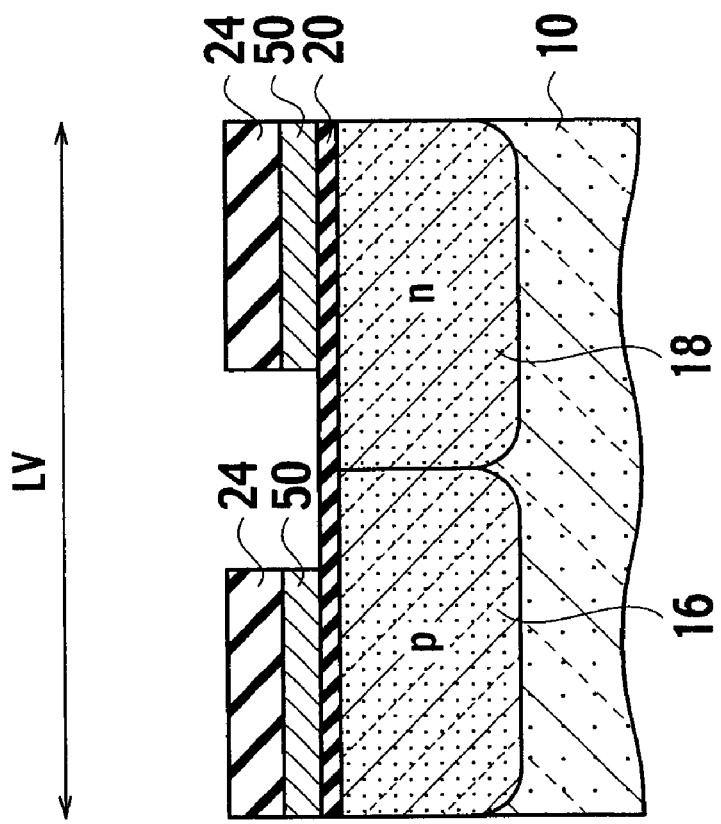
FIG. 7A schematically shows a cross section of a high voltage transistor in a high voltage transistor region, explaining a step of the fabrication process for the nonvolatile semiconductor memory, according to the first embodiment of the present invention.
Figure 7B:
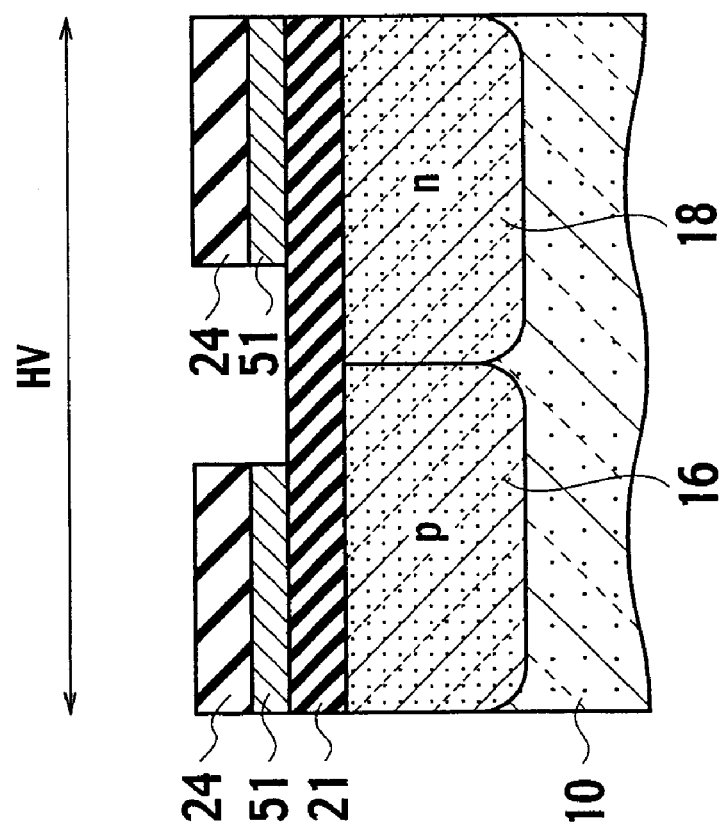
FIG. 7B schematically shows a cross section of a low voltage transistor in a low voltage transistor region, explaining a step of the fabrication process for the nonvolatile semiconductor memory, according to the first embodiment of the present invention.
Figure 18C:
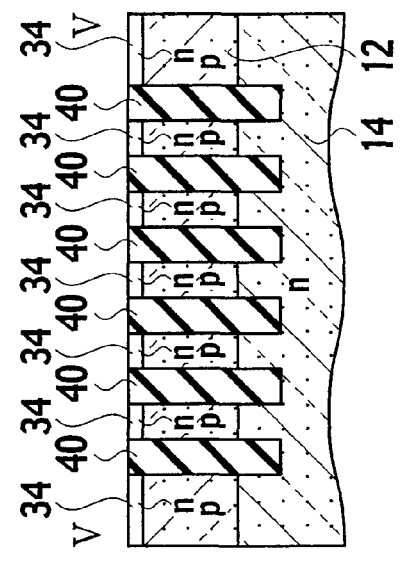
FIG. 18C schematically shows a cross section of the nonvolatile semiconductor memory, according to the first embodiment of the present invention, cut along the line V-V in FIG. 1, explaining a step of the fabrication process thereof.
Figure 18B:
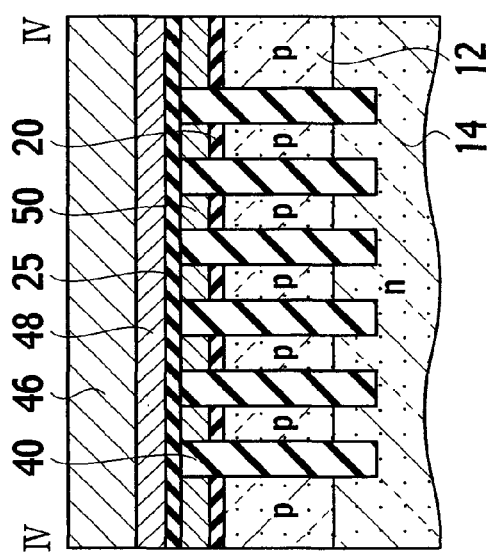
FIG. 18B schematically shows a cross section of the nonvolatile semiconductor memory, according to the first embodiment of the present invention, cut along the line IV-IV in FIG. 1, explaining a step of the fabrication process thereof.
Figure 18A:
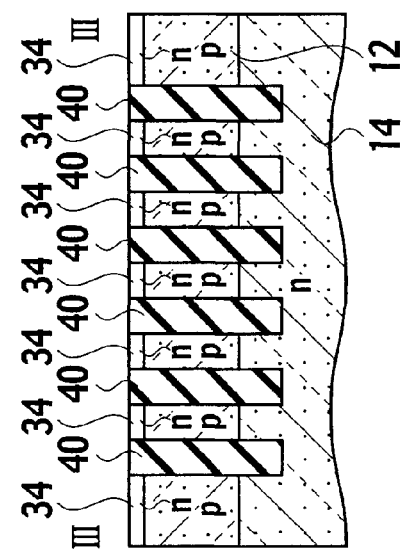
FIG. 18A schematically shows a cross section of the nonvolatile semiconductor memory, according to the first embodiment of the present invention, cut along the line III-III in FIG. 1, explaining a step of the fabrication process thereof.

(A-4) Next, as shown in FIG. 7A, the stopper film 24 and the floating gate electrode layer 50 in the high voltage transistor region (HV) are removed using lithography and dry etching techniques.

(A-5) Next, as shown in FIG. 7A, the semiconductor substrate 10 is exposed to an oxidized atmosphere at high temperature, growing a high voltage gate insulating film 21 in the high voltage transistor region (HV).

(A-6) Next, as shown in FIG. 7A, a high voltage gate electrode layer 51 made from a polysilicon layer or the like is formed on the high voltage gate insulating film 21 in the high voltage transistor region (HV), and a stopper film 24 is then deposited on the high voltage gate electrode layer 51.

(A-7) Next, as shown in FIGS. 5A and 5B, 6A through 6C, and 7A and 7B, the stopper film 24, the floating gate electrode layer 50, and the high voltage gate electrode layer 51 in a prospective region, in which element isolating regions (STI) are to be formed, in the cell array region 120, the high voltage transistor region (HV), and the low voltage transistor region (LV) are removed using lithography and dry etching techniques.

(A-8) Next, as shown in FIGS. 8A and 8B, 9A through 9C, and 10A and 10B, the semiconductor substrate 10, the high voltage gate insulating film 21, and the tunneling insulating film 20 in a prospective region in which element isolating regions (STI) are to be formed are removed until a depth at which the element isolating regions (STI) are to be formed, using a dry etching technique. As is apparent from FIGS. 8A and 8B, 9A through 9C and 10A and 10B, the value of the etching depth for the semiconductor substrate 10 is greater than the value of the junction depth of p-well regions 12 and 16 or n-well region 18.

(A-9) Next, as shown in FIGS. 11A and 11B, 12A through 12C, and 13A and 13B, an insulating film such as a TEOS film is deposited on the entire device surface including the cell array region 120, the high voltage transistor region (HV), and the low voltage transistor region (LV), filling in etching grooves formed in the cell array region 120, the high voltage transistor region (HV), and the low voltage transistor region (LV), and forming element isolating regions (STI) 40.

(A-10) Next, the insulating film such as a TEOS film deposited on the entire device surface is subjected to polishing and planarizing through the CMP process.

(A-11) Next, the stopper film 24 deposited on the entire device surface including the cell array region 120, the high voltage transistor region (HV), and the low voltage transistor region (LV) is removed.

(A-12) Next, as shown in FIGS. 11A and 11B, 12A through 12C, and 13A and 13B, an inter-gate insulating film 25 is formed on the entire device region including the cell array region 120, the high voltage transistor region (HV), and the low voltage transistor region (LV). A silicon oxide film, a nitride film, an ONO film, or an alumina film may be used as the material of the inter-gate insulating film 25.

(A-13) Next, a first control gate electrode layer 48 made of polysilicon or the like is deposited on the inter-gate insulating film 25 formed on the entire device surface including the cell array region 120, the high voltage transistor region (HV), and the low voltage transistor region (LV).

(A-14) Next, as shown in FIGS. 14A and 14B, 15A through 15C, and 16A and 16B, the first control gate electrode layer 48 and the inter-gate insulating film 25 in the cell array region 120, the high voltage transistor region (HV), and the low voltage transistor region (LV) are removed using lithography and etching techniques. Through this process, in part of an area in which select gate transistors for memory cell transistors are disposed in the cell array region 120, an aperture for electrically connecting the floating gate electrode layer 50 to the first and the second control gate electrode layer 48 and 46 is formed. In the same manner, in the high voltage transistor region (HV), an aperture for electrically connecting the high voltage gate electrode layer 51 to the first and the second control gate electrode layer 48 and 46 is formed. In the same manner, in the low voltage transistor region (LV), an aperture for electrically connecting the floating gate electrode layer 50 to the first and the second control gate electrode layer 48 and 46 is formed.

(A-15) Next, a first control gate electrode layer 48 and/or a second control gate electrode layer 46 both made of polysilicon or the like is deposited on the entire device surface including the cell array region 120, the high voltage transistor region (HV), and the low voltage transistor region (LV). The reason why the first control gate electrode layer 48 and the second control gate electrode layer 46, which are made of the same material, are deposited separately through two processes is because deposition of a resist on the inter-gate insulating film 25 for lithography may contaminate the inter-gate insulating film 25. Therefore, a resist is deposited on the first control gate electrode layer 48, and the inter-gate insulating film 25 is then processed so that contamination of the inter-gate insulating film 25 can be prevented.

Figure 19A:
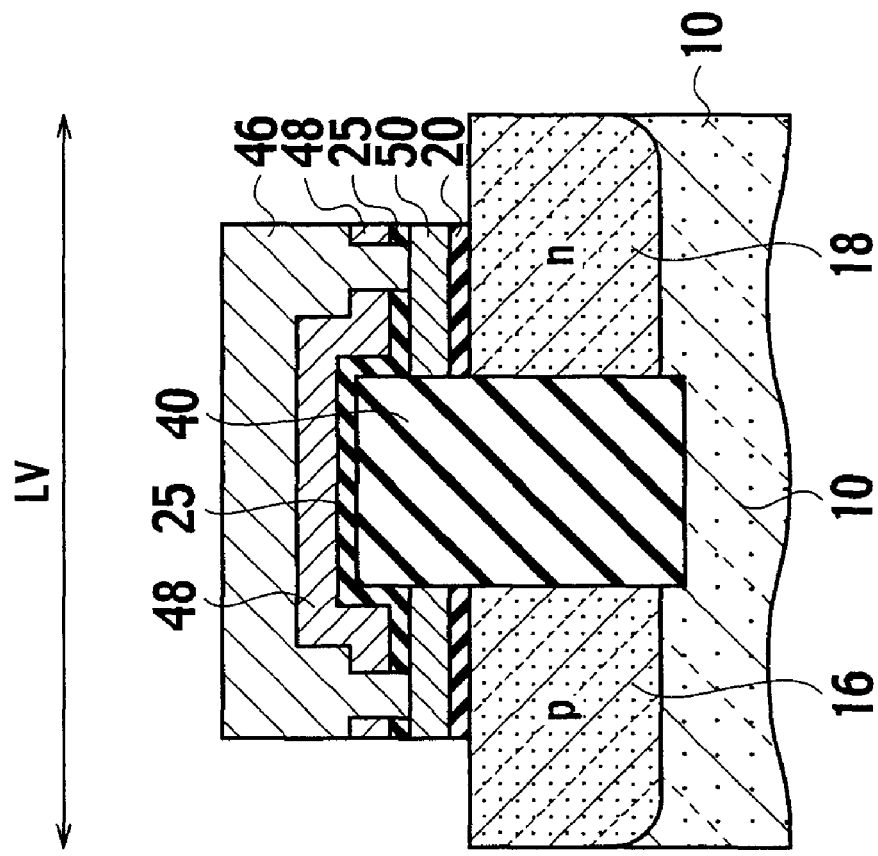
FIG. 19A schematically shows a cross section of a high voltage transistor in a high voltage transistor region, explaining a step of the fabrication process for the nonvolatile semiconductor memory, according to the first embodiment of the present invention.
Figure 19B:
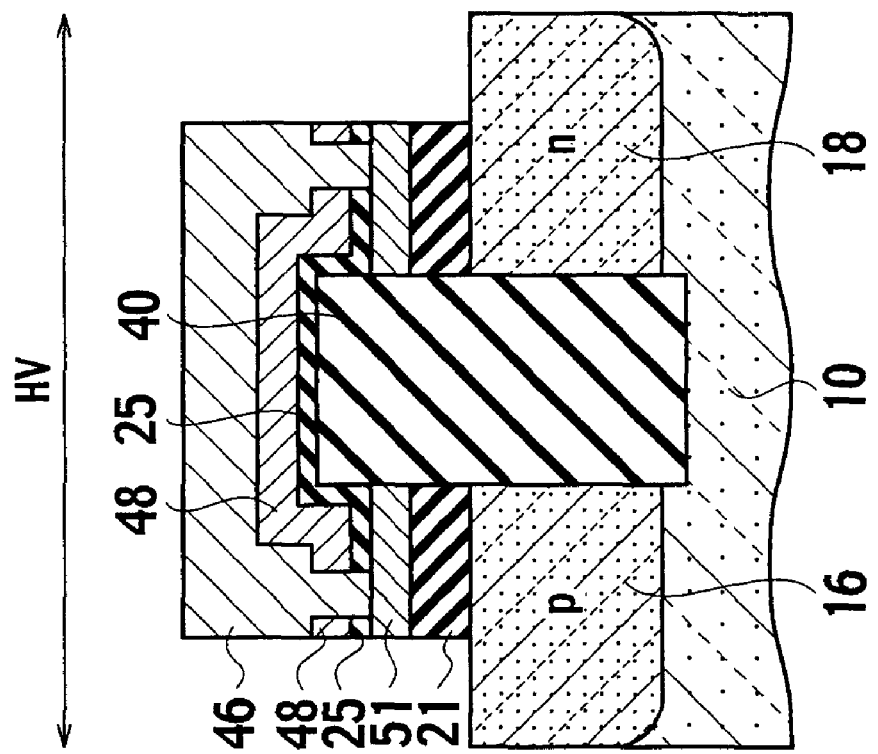
FIG. 19B schematically shows a cross section of a low voltage transistor in a low voltage transistor region, explaining a step of the fabrication process for the nonvolatile semiconductor memory, according to the first embodiment of the present invention.

(A-16) Next, as shown in FIGS. 17A and 17B, 18A through 18C, and 19A and 19B, the second control gate electrode layer 46, the first control gate electrode layer 48, the inter-gate insulating film 25, the floating gate electrode layer 50, and the tunneling insulating film 20 in the cell array region 120 and the low voltage transistor region (LV) are removed using lithography and etching techniques. At the same time, as shown in FIG. 19A, the second control gate electrode layer 46, the first control gate electrode layer 48, the inter-gate insulating film 25, the high voltage gate electrode layer 51, and the high voltage gate insulating film 21 in the high voltage transistor region (I-IV) are removed using lithography and etching techniques. As shown in FIG. 17A, the floating gate electrode layer 50 and the first and the second control gate electrode layer 48 and 46 in the cell array region 120 are electrically connected, forming wide select gate lines SGD and SGS. Further, memory cell transistors constructed by stacking the floating gate electrode layer 50 and the first and the second control gate electrode layer 48 and 46 via the inter-gate insulating film 25 are formed.

(A-17) Next, as shown in FIGS. 20A and 20B and 21A through 21C, atoms of group V such as phosphorus (P), arsenic (As), or antimony (Sb) are ion-implanted in the cell array region 120, the high voltage transistor region (HV) and the low voltage transistor region (LV) through an ion implantation (I/I) process, and n-type source/drain diffusion layers 34 for memory cell transistors are then formed in the cell array region 120 through the annealing process.

(A-18) Next, as shown in FIGS. 20A and 20B, 21A through 21C, and 22A and 22B, an inter-gate insulating film 26 made of a nitride film or the like is formed on the entire device region including the cell array region 120, the high voltage transistor region (HV), and the low voltage transistor region (LV).

Figure 20A:
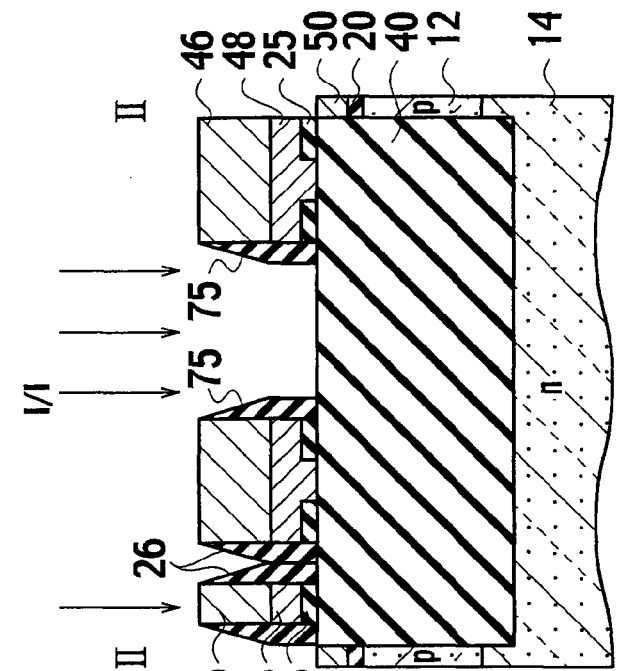
FIG. 20A schematically shows a cross section of the nonvolatile semiconductor memory, according to the first embodiment of the present invention, cut along the line I-I in FIG. 1, explaining a step of the fabrication process thereof.
Figure 20B:
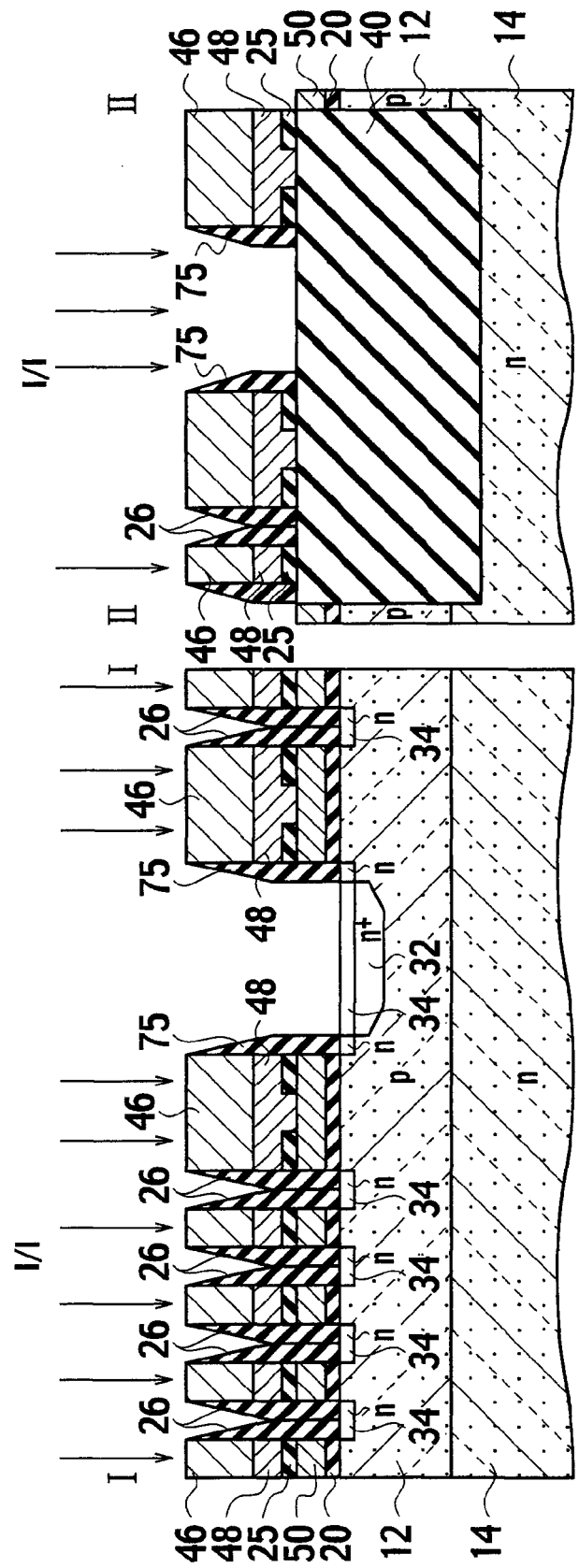
FIG. 20B schematically shows a cross section of the nonvolatile semiconductor memory, according to the first embodiment of the present invention, cut along the line II-II in FIG. 1, explaining a step of the fabrication process thereof.
Figures 28A, 28B, 28C:
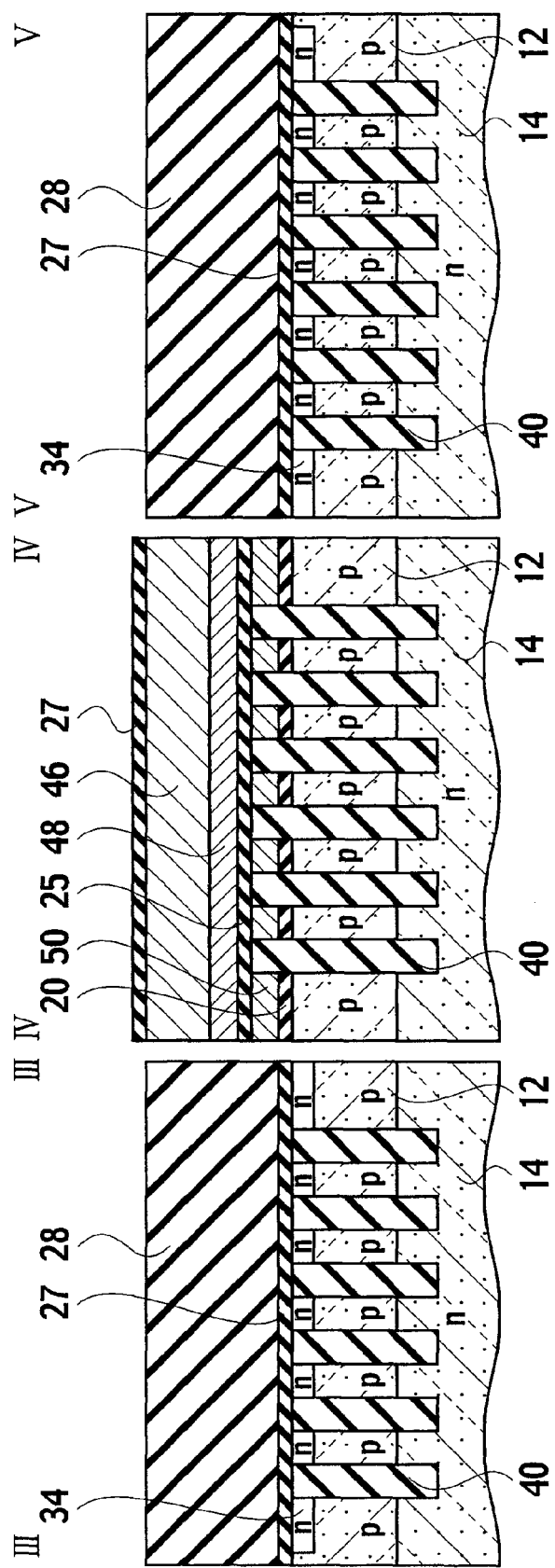
FIG. 28A schematically shows a cross section of the nonvolatile semiconductor memory, according to the first embodiment of the present invention, cut along the line III-III in FIG. 1, explaining a step of the fabrication process thereof.
FIG. 28B schematically shows a cross section of the nonvolatile semiconductor memory, according to the first embodiment of the present invention, cut along the line IV-IV in FIG. 1, explaining a step of the fabrication process thereof.
FIG. 28C schematically shows a cross section of the nonvolatile semiconductor memory, according to the first embodiment of the present invention, cut along the line V-V in FIG. 1, explaining a step of the fabrication process thereof.
Figure 29A:
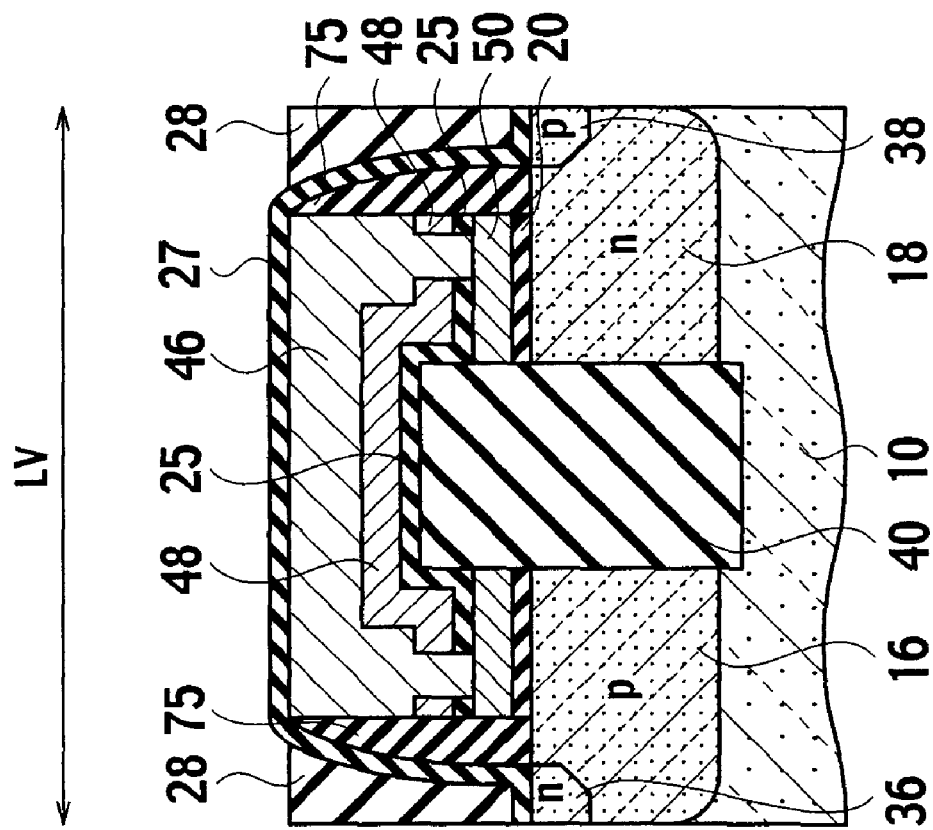
FIG. 29A schematically shows a cross section of a high voltage transistor in a high voltage transistor region, explaining a step of the fabrication process for the nonvolatile semiconductor memory, according to the first embodiment of the present invention.
Figure 29B:
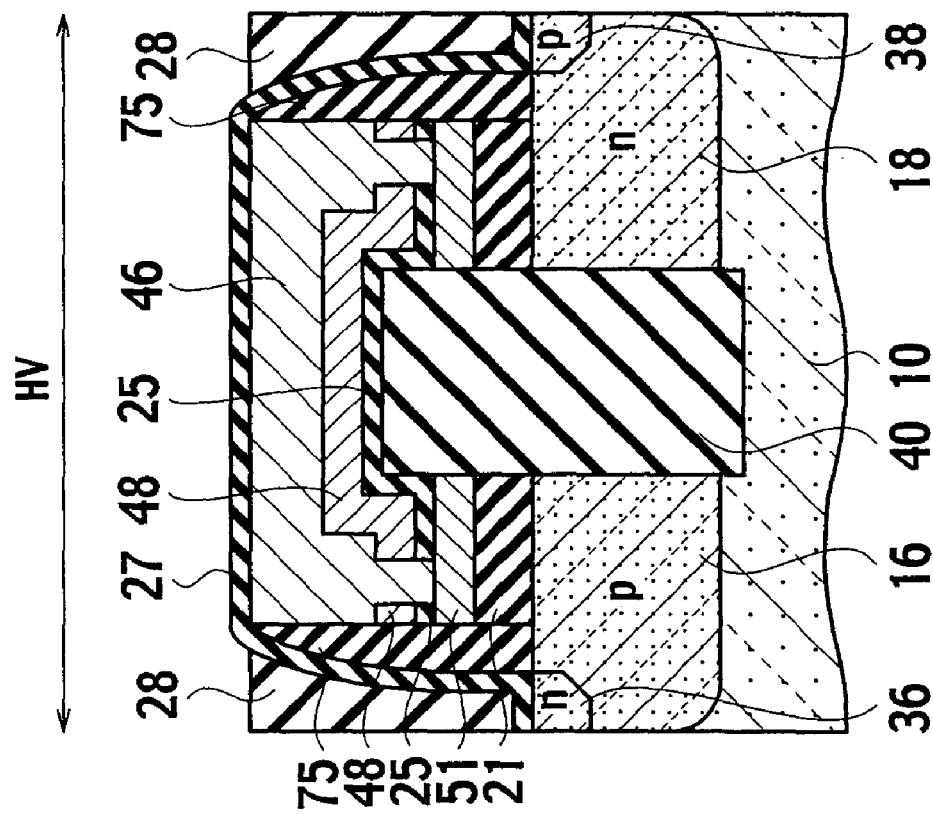
FIG. 29B schematically shows a cross section of a low voltage transistor in a low voltage transistor region, explaining a step of the fabrication process for the nonvolatile semiconductor memory, according to the first embodiment of the present invention.
Figures 30A, 30B:
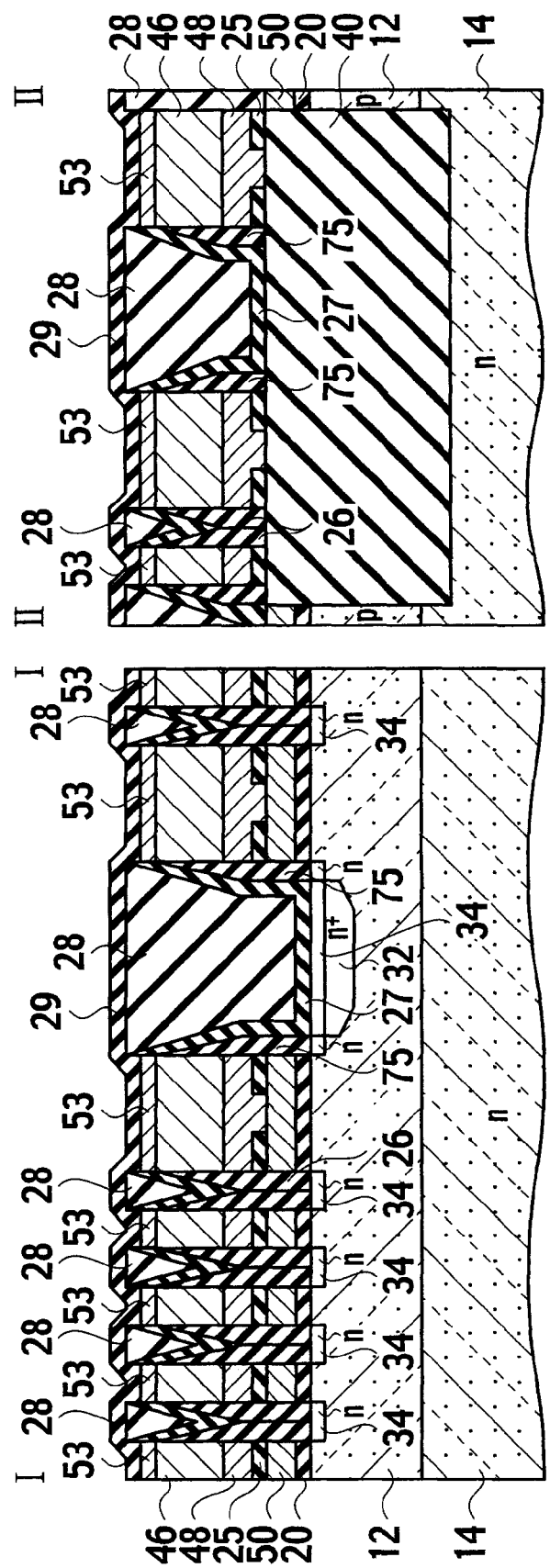
FIG. 30A schematically shows a cross section of the nonvolatile semiconductor memory, according to the first embodiment of the present invention, cut along the line I-I in FIG. 1, explaining a step of the fabrication process thereof.
FIG. 30B schematically shows a cross section of the nonvolatile semiconductor memory, according to the first embodiment of the present invention, cut along the line II-II in FIG. 1, explaining a step of the fabrication process thereof.
Figure 32A:
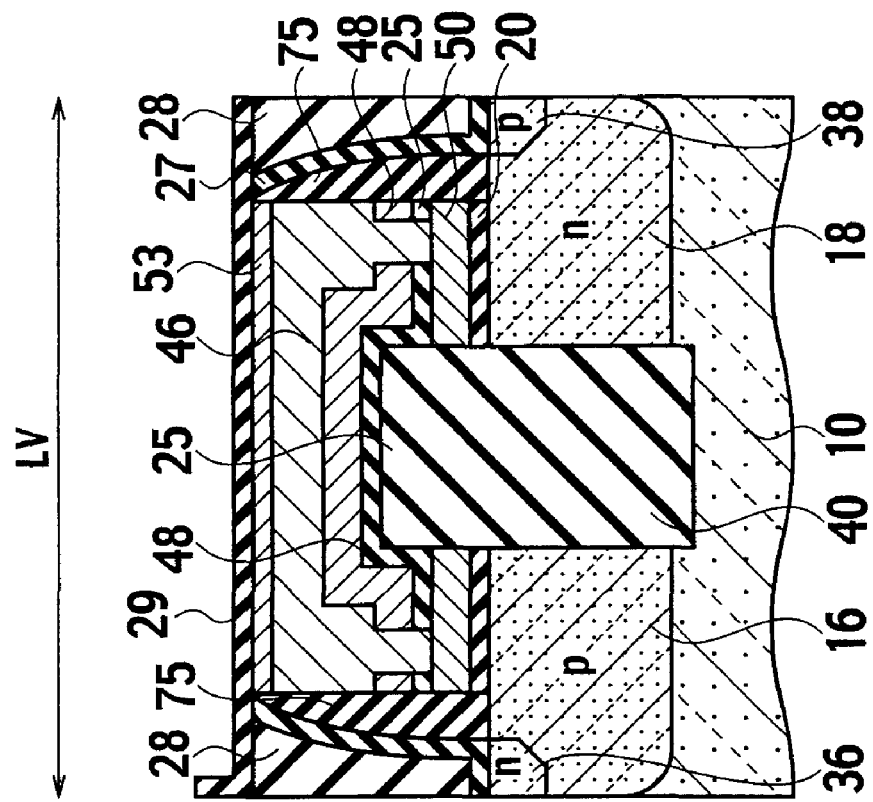
FIG. 32A schematically shows a cross section of a high voltage transistor in a high voltage transistor region, explaining a step of the fabrication process for the nonvolatile semiconductor memory, according to the first embodiment of the present invention.
Figure 32B:
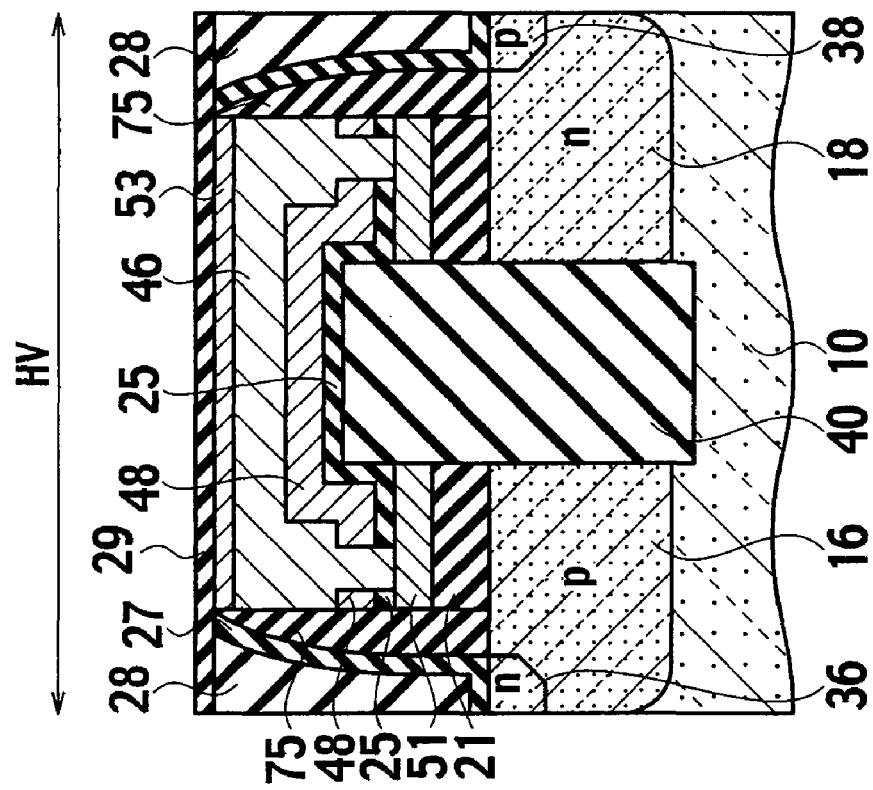
FIG. 32B schematically shows a cross section of a low voltage transistor in a low voltage transistor region, explaining a step of the fabrication process for the nonvolatile semiconductor memory, according to the first embodiment of the present invention.

As shown in FIG. 20A, the inter-gate insulating film 26 fills in the area between the first and the second control gate electrode layer 48 and 46 of adjacent memory cell transistors. Generation of voids is prevented between the first and the second control gate electrode layer 48 and 46 of adjacent memory cell transistors.

(A-19) Next, as shown in FIGS. 20A and 20B, 21A through 21C, and 22A and 22B, the filled inter-gate insulating film 26 in the cell array region 120, the high voltage transistor region (HV), and the low voltage transistor region (LV) is removed using lithography and etching techniques.

(A-20) Next, as shown in FIGS. 20A and 20B, 21A through 21C, and 22A and 22B, a gate sidewall insulating film 75 made of a nitride film or the like is formed on the entire device region including the cell array region 120, the high voltage transistor region (HV), and the low voltage transistor region (LV).

(A-21) Next, as shown in FIGS. 20A and 20B, 21A through 21C, and 22A and 22B, the gate sidewall insulating film 75 in the cell array region 120, the high voltage transistor region (HV), and the low voltage transistor region (LV) is removed using lithography and etching techniques.

A process of removing the gate sidewall insulating film 75 is described in detail forthwith, however illustrations for explaining it are omitted. The gate sidewall insulating film 75 is removed by depositing a resist on the entire device surface including the cell array region 120, the high voltage transistor region (HV), and the low voltage transistor region (LV), and then etching through lithography using as a mask, resists between adjacent word lines WL0, WL1, WL2, WL3, . . . , WLn between the select gate lines SGD and SGS. Afterwards, the resist is removed using a resist remover.

(A-22) Next, as shown in FIGS. 20A and 20B, 21A through 21C, and 22A and 22B, atoms of group V such as phosphorus (P), arsenic (As), or antimony (Sb) are ion-implanted in the cell array region 120, the high voltage transistor region (HV) and the low voltage transistor region (LV) through an ion implantation (I/I) process, and $n^+$ source/drain diffusion layers 32 for memory cell transistors in the cell array region 120 and n-type source/drain regions 36 in the high voltage transistor region (HV) and the low voltage transistor region (LV) are then formed through the annealing process.

(A-23) Next, as shown in FIGS. 23A and 23B, atoms of group III such as Boron (B) or the like are ion-implanted in the high voltage transistor region (HV) and the low voltage transistor region (LV) through an ion implantation (I/I) process, and p-type source/drain diffusion regions 38 in the high voltage transistor region (HV) and the low voltage transistor region (LV) are then formed through the annealing process.

(A-24) Next, as shown in FIGS. 24A and 24B, 25A through 25C, and 26A and 26B, a liner insulating film 27 made of a nitride film or the like is formed on the entire device surface region including the cell array region 120, the high voltage transistor region (HV), and the low voltage transistor region (LV).

The liner insulating film 27 is used as a etching stopper film for making contact with the second control gate electrode layer 46 of memory cell transistors in the cell array region 120, the second control gate electrode layer 46, which is formed on the high voltage gate electrode layer 51 of high voltage transistors in the high voltage transistor region (HV), and the second control gate electrode layer 46, which is formed on the floating gate electrode layer 50 of low voltage transistors in the low voltage transistor region (LV).

(A-25) Next, as shown in FIGS. 24A and 24B, 25A through 25C, and 26A and 26B, an interlayer insulating film 28 made of a TEOS film or a BPSG film is formed on the liner insulating film 27 in the cell array region 120, the high voltage transistor region (HV), and the low voltage transistor region (LV).

As shown in FIG. 24A, the inter-gate embedded insulating film 26, the liner insulating film 27, and the interlayer insulating film 28 fill in the area between the first and the second control gate electrode layer 48 and 46 of adjacent memory cell transistors.

(A-26) Next, as shown in FIGS. 27A and 27B, 28A through 28C, and 29A and 29B, the inter-gate insulating film 28 is planarized by the CMP process and then performing dry-etching process for the entire device surface region including the cell array region 120, the high voltage transistor region (HV), and the low voltage transistor region (LV).

(A-27) Next, an aperture is formed in a silicide formation region using lithography and etching techniques. A mask made of a nitride film or the like is disposed on areas in which interconnect wirings and resistors are to be made so that formation of a metallic silicide film can be prevented.

(A-28) Next, a metallic silicide film 53 is formed in the silicide formation region having an aperture of the cell array region 120, the high voltage transistor region (HV), and the low voltage transistor region (LV). The metallic silicide film 53 is formed on the entire or a part of the surface of the gate electrodes. A variety of metallic silicides such as cobalt silicide ($CoSi_2$), or nickel silicide ($NiSi_2$) or the like may be used as the metallic silicide film to be formed.

The silicide formation region includes the second control gate electrode layer 46 of memory cell transistors in the cell array region 120, the second control gate electrode layer 46 disposed on the high voltage gate electrode layer 51 of high voltage transistors in the high voltage transistor region (HV), and the second control gate electrode layer 46 disposed on the floating gate electrode layer 50 of low voltage transistors in the low voltage transistor region (LV).

(A-29) Next, as shown in FIGS. 30A and 30B, 31A through 31C, and 32A and 32B, a barrier insulating film 29 made of a nitride film or the like is deposited on the entire device surface including the cell array region 120, the high voltage transistor region (HV), and the low voltage transistor region (LV).

(A-30) Next, as shown in FIGS. 33, 34, and 35A and 35B, an interlayer insulating film 68 is deposited on the barrier insulating film 29 in the cell array region 120, the high voltage transistor region (HV), and the low voltage transistor region (LV), and contact plugs used to electrically connect onto the gate electrodes and semiconductor substrate 10 are then formed using lithography and etching techniques.

As shown in FIG. 33, bit line contact (CB) plugs 63 are formed on the n-type source/drain diffusion layers 34 and the n+ source/drain diffusion layers 32 in the cell array region 120.

In the high voltage transistor region (HV), gate contact (CG) plugs 69 are formed on the second control gate electrode layer 46 and the metallic silicide film 53, while source/drain contact (CS/D) plugs 67 are formed on the p-type source/drain region 38. Likewise, in the low voltage transistor region (LV), gate contact (CG) plugs 69 are formed on the second control gate electrode layer 46 and the metallic silicide film 53, while source/drain contact (CS/D) plugs 67 are formed on the p-type source/drain region 38.

(A-31) Next, as shown in FIGS. 33, 34, and 35A and 35B, in the cell array region 120, the high voltage transistor region (HV), and the low voltage transistor region (LV), a M0 metallic layer 64 is formed on the bit line contact (CB) plugs 63, the source/drain contact (CS/D) plugs 67, and the gate contact (CG) plugs 69, and moreover a via contact (V1) 65 is formed on the M0 metallic layer 64, connecting to an M1 metallic layer 66.

According to the nonvolatile semiconductor memory of the first embodiment of the present invention, the gate insulating film of the low voltage transistors in the low voltage circuit region 80 and the tunneling insulating film 20 of the memory cell transistors in the cell array region 120 can be fabricated at the same time for the 'all gate pre-fabrication' process, resulting in simplification of the fabrication process.

According to the nonvolatile semiconductor memory of the first embodiment of the present invention, since the thickness the high voltage gate insulating film 21 of the high voltage transistors in the high voltage circuit region 90 can be thicker than the thickness of the tunneling insulating film 20, the high voltage transistors can have higher breakdown voltage capability, at the same time.

According to the nonvolatile semiconductor memory of the first embodiment of the present invention, formation of metallic silicide films in gate electrode layers of a variety of elements and word lines allows provision of higher-speed operability, higher integration, and simpler processing of memory cell transistors; higher-speed operability and simpler processing of low voltage transistors; and higher breakdown voltage capability, higher-speed operability, and simpler processing of high voltage transistors, at the same time.

Second Embodiment (Device Structure)

As shown in FIGS. 1, 33, 34, and 63A and 63B, a nonvolatile semiconductor memory according to the second embodiment of the present invention includes: a cell array region 120 including memory cell transistors, each constructed by first source/drain diffusion layers 34, a first tunneling insulating film 20 on the semiconductor region between the first source/drain diffusion layers 34, a first floating gate electrode layer 50 on the first tunneling insulating film 20, a first inter-gate insulating film 25 on the first floating gate electrode layer 50, a first control gate electrode layer 48 on the first inter-gate insulating film 25, a second control gate electrode layer 46 on the first control gate electrode layer 48, and a first metallic silicide film 53 electrically connected to the second control gate electrode layer 46; high voltage circuit regions 90, which are arranged around the cell array region 120, in a recessed semiconductor substrate having a lower surface than the semiconductor substrate disposing the first source/drain diffusion layers 34 and include high voltage transistors, each constructed by second source/drain regions 36 or 38, a high voltage gate insulating film 21 on the semiconductor region between adjacent second source/drain regions 36 or 38, a second floating gate electrode layer 50 on the high voltage gate insulating film 21, a second inter-gate insulating film 25 having an aperture on the second floating gate electrode layer 50, a third control gate electrode layer 48 on the second inter-gate insulating film 25, a fourth control gate electrode layer 46 on the third control gate electrode layer 48, and a second metallic silicide film 53 electrically connected to the fourth control gate electrode layer 46; and low voltage circuit regions 80, which are arranged around the cell array region 120 in different positions than the high voltage circuit regions 90 and include low voltage transistors, each constructed by third source/drain regions 36 or 38, a second tunneling insulating film 20 on the semiconductor region between adjacent third source/drain regions 36 or 38, a third floating gate electrode layer 50 on the second tunneling insulating film 20, a third inter-gate insulating film 25 having an aperture on the third floating gate electrode layer 50, a fifth control gate electrode layer 48 on the third inter-gate insulating film 25, a sixth control gate electrode layer 46 on the fifth control gate electrode layer 48, and a third metallic silicide film 53 electrically connected to the sixth control gate electrode layer 46; and it further includes a liner insulating film 27 on the first source/drain diffusion layers 34, the second source/drain regions 36 or 38, and the third source/drain regions 36 or 38. The thickness of the high voltage gate insulating film 21 is thicker than the value of the thickness of the first and the second tunneling insulating film 20, and the surface of the high voltage gate insulating film 21 and the surfaces of the first and the second tunneling insulating film 20 are planarized.

The nonvolatile semiconductor memory according to the second embodiment of the present invention may include a barrier insulating film 29 which is disposed on the first source/drain diffusion layers 34, the second source/drain regions 36 or 38, and the third source/drain regions 36 or 38, and is partially connected to the liner insulating film 27.

Alternatively, in the nonvolatile semiconductor memory according to the second embodiment of the present invention, the barrier insulating film 29 may further be disposed on the first, the second, and the third metallic silicide film 53.

Alternatively, in the nonvolatile semiconductor memory according to the second embodiment of the present invention, the height from the surface of the semiconductor substrate in which the first through the third source/drain regions are formed to the barrier insulating film 29 may be greater than the height until the first through the third inter-gate insulating film 25.

In the nonvolatile semiconductor memory according to the second embodiment of the present invention, memory transistors and transistors in the peripheral low voltage circuit regions 80 and the high voltage circuit regions 90 have a stacked gate structure.

As shown in FIGS. 33 and 34, as with the first embodiment, for example, the memory cell transistors in the cell array region 120 include the semiconductor substrate 10, a n-well region 14 and a p-well region 12 formed in the semiconductor substrate 10, the tunneling insulating film 20 disposed on the semiconductor substrate 10, the floating gate electrode layer 50 disposed on the tunneling insulating film 20, the inter-gate insulating film 25 disposed on the floating gate electrode layer 50, the first control gate electrode layer 48 disposed on the inter-gate insulating film 25, the second control gate electrode layer 46 disposed on the first control gate electrode layer 48, and the metallic silicide film 53 electrically connected to the upper region of the second control gate electrode layer 46.

The second control gate electrode layer 46 corresponds to word lines, and the metallic silicide film 53 configures word lines accordingly.

The select gate transistors formed adjacent to memory cell transistors in the cell array region 120 include the floating gate electrode layer 50, the inter-gate insulating film 25 having an aperture disposed on the floating gate electrode layer 50, the first control gate electrode layer 48 disposed on the inter-gate insulating film 25 having an aperture, the second control gate electrode layer 46 disposed on the first control gate electrode layer 48, and the metallic silicide film 53 electrically connected to the upper region of the second control gate electrode layer 46.

The floating gate electrode layer 50 and the first control gate electrode layer 48 are electrically connected via the aperture of the inter-gate insulating film 25. Therefore, the floating gate electrode layer 50, the first control gate electrode layer 48 connected to the floating gate electrode layer 50, the second control gate electrode layer 46 disposed on the first control gate electrode layer 48, the metallic silicide film 53 disposed on the second control gate electrode layer 46 are conductively in common, configuring the gate electrodes of the select gate transistors and also configuring the select gate line disposed in parallel to the word lines.

As shown in FIG. 63A, the high voltage circuit region (HV) 90 includes a p-well region 16 and a n-well region 18 formed in a recessed surface of the semiconductor substrate 10, a nMOS transistor formed in the p-well region 16, and a pMOS transistor formed in the n-well region 18, for example.

The detailed structure of the nMOS transistor in the high voltage circuit region 90 includes a p-well region 16 formed in the semiconductor substrate 10, a high voltage gate insulating film 21 disposed on the p-well region 16, a floating gate electrode layer 50 disposed on the high voltage gate insulating film 21, a n-type source/drain region 36, which is formed on the surface of the p-well region 16 and becomes either a source region or a drain region, an inter-gate insulating film 25 having an aperture disposed on the floating gate electrode layer 50, a first control gate electrode layer 48 disposed on the inter-gate insulating film 25 having an aperture, a second control gate electrode layer 46 disposed on the first control gate electrode layer 48, and a metallic silicide film 53 electrically connected to the upper region of the second control gate electrode layer 46, for example.

The floating gate electrode layer 50 and the first control gate electrode layer 48 are electrically connected via the aperture in the inter-gate insulating film 25. Therefore, the floating gate electrode layer 50, the first control gate electrode layer 48 connected to the floating gate electrode layer 50, the second control gate electrode layer 46 disposed on the first control gate electrode layer 48, and the metallic silicide film 53 disposed on the second control gate electrode layer 46 are conductively in common, configuring the gate electrodes of nMOS high voltage transistors in the high voltage circuit region 90.

Likewise, the detailed structure of the pMOS transistor in the high voltage circuit region 90 includes a n-well region 18 formed in the semiconductor substrate 10, a high voltage gate insulating film 21 disposed on the n-well region 18, a floating gate electrode layer 50 disposed on the high voltage gate insulating film 21, a p-type source/drain region 38, which is formed on the surface of the n-well region 18 and becomes either a source region or a drain region, an inter-gate insulating film 25 having an aperture disposed on the floating gate electrode layer 50, a first control gate electrode layer 48 disposed on the inter-gate insulating film 25 having an aperture, a second control gate electrode layer 46 disposed on the first control gate electrode layer 48, and a metallic silicide film 53 electrically connected to the upper region of the second control gate electrode layer 46, for example.

The floating gate electrode layer 50 and the first control gate electrode layer 48 are electrically connected via the aperture in the inter-gate insulating film 25. Therefore, the floating gate electrode layer 50, the first control gate electrode layer 48 connected to the floating gate electrode layer 50, the second control gate electrode layer 46 disposed on the first control gate electrode layer 48, the metallic silicide film 53 disposed on the second control gate electrode layer 46 are conductively in common, configuring the gate electrodes of pMOS transistors in the high voltage circuit region 90.

As shown in FIG. 63B, the low voltage circuit region (LV) 80 includes a p-well region 16 and a n-well region 18 formed in the semiconductor substrate 10, a nMOS transistor formed in the p-well region 16, and a pMOS transistor formed in the n-well region 18, for example.

The detailed structure of the pMOS transistor in the high voltage circuit region 80 includes a p-well region 16 formed in the semiconductor substrate 10, a gate insulating film formed on the p-well region 16 at the same time as a tunneling insulating film 20 is formed, a floating gate electrode layer 50 disposed on the tunneling insulating film 20, a n-type source/drain region 36, which is formed on the surface of the p-well region 16 and becomes either a source region or a drain region, an inter-gate insulating film 25 having an aperture disposed on the floating gate electrode layer 50, a first control gate electrode layer 48 disposed on the inter-gate insulating film 25 having the aperture, a second control gate electrode layer 46 disposed on the first control gate electrode layer 48, and a metallic silicide film 53 electrically connected to the upper region of the second control gate electrode layer 46, for example. The floating gate electrode layer 50 and the first control gate electrode layer 48 are electrically connected via the aperture in the inter-gate insulating film 25.

Therefore, the floating gate electrode layer 50, the first control gate electrode layer 48 connected to the floating gate electrode layer 50, the second control gate electrode layer 46 disposed on the first control gate electrode layer 48, the metallic silicide film 53 disposed on the second control gate electrode layer 46 are conductively in common, configuring the gate electrodes of nMOS low voltage transistors in the low voltage circuit region (LV) 80.

Likewise, the detailed structure of the pMOS transistor in the low voltage circuit region 80 includes a n-well region 18 formed in the semiconductor substrate 10, a gate insulating film formed on the n-well region 18 at the same time as a tunneling insulating film 20 is formed, a floating gate electrode layer 50 disposed on the tunneling insulating film 20, a p-type source/drain region 38, which is formed on the surface of the n-well region 18 and becomes either a source region or a drain region, an inter-gate insulating film 25 having an aperture disposed on the floating gate electrode layer 50, a first control gate electrode layer 48 disposed on the inter-gate insulating film 25 having an aperture, a second control gate electrode layer 46 disposed on the first control gate electrode layer 48, and a metallic silicide film 53 electrically connected to the upper region of the second control gate electrode layer 46, for example.

The floating gate electrode layer 50 and the first control gate electrode layer 48 are electrically connected via the aperture in the inter-gate insulating film 25. Therefore, the floating gate electrode layer 50, the first control gate electrode layer 48 connected to the floating gate electrode layer 50, the second control gate electrode layer 46 disposed on the first control gate electrode layer 48, the metallic silicide film 53 disposed on the second control gate electrode layer 46 are conductively in common, configuring the gate electrodes of pMOS low voltage transistors in the low voltage circuit region 80.

(Fabrication Method)

As shown in FIG. 1, the plan view pattern of the nonvolatile semiconductor memory according to the second embodiment of the present invention includes a plurality of active regions AA1, AA2, AA3, AA4, AA5, AA6, AA7, AA8, . . . extending along the column direction, element isolating regions (STI), which extend along the column direction and isolate each of the active regions AA1, AA2, AA3, AA4, AA5, AA6, AA7, AA8, . . . , a plurality of word lines WL0, WL1, WL2, WL3, . . . , WLn−3, WLn−2, WLn−1, and WLn, which extend along the row direction, and select gate lines SGS and SGD, which extend along the row direction. The select gate line SGS may alternatively be the SGD. Moreover, the select gate line SGD may alternatively be the SGS. Alternatively, each of the select gate lines SGS and SGD may be configured with a plurality of lines.

A fabrication method for the nonvolatile semiconductor memory according to the second embodiment is described, referencing FIGS. 36 through 63.

(B-1) First, as shown in FIGS. 36A and 36B, 37A through 37C, and 38A and 38B, the semiconductor substrate 10 is exposed to an oxidized atmosphere at high temperature, depositing a pad insulating film 8, which is used for a local oxidation of silicon (LOCOS) processing, in the cell array region 120, the high voltage transistor region (HV) and the low voltage transistor region (LV) on the semiconductor substrate 10.

(B-2) Next, as shown in FIGS. 36A and 36B, 37A through 37C, and 38A and 38B, a nitride film 6, which is used for the LOCOS processing, is deposited on the pad insulating film 8 in the cell array region 120, the high voltage transistor region (HV), and the low voltage transistor region (LV).

Figure 38A:
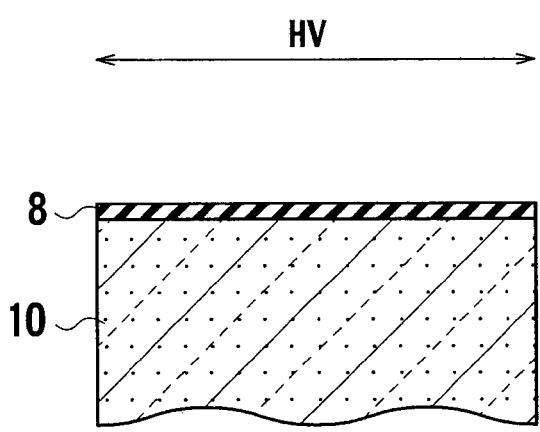
FIG. 38A schematically shows a cross section of a high voltage transistor in a high voltage transistor region, explaining a step of the fabrication process for the nonvolatile semiconductor memory, according to the second embodiment of the present invention.
Figure 38B:
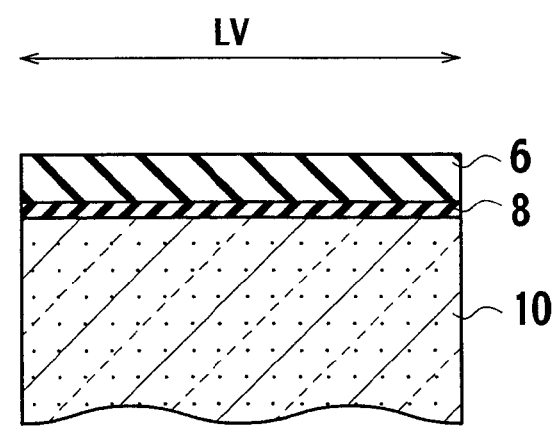
FIG. 38B schematically shows a cross section of a low voltage transistor in a low voltage transistor region, explaining a step of the fabrication process for the nonvolatile semiconductor memory, according to the second embodiment of the present invention.
Figure 39B:
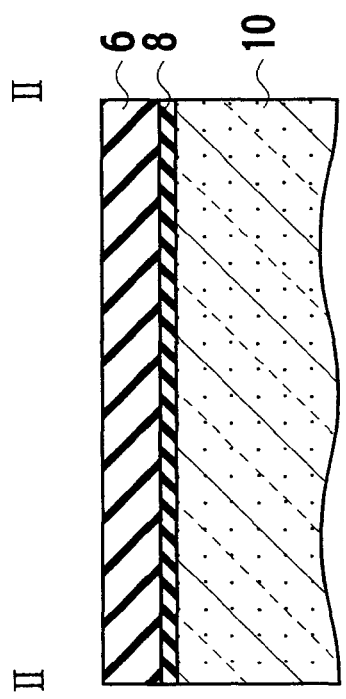
FIG. 39B schematically shows a cross section of the nonvolatile semiconductor memory, according to the second embodiment of the present invention, cut along the line II-II in FIG. 1, explaining a step of the fabrication process thereof.
Figure 39A:
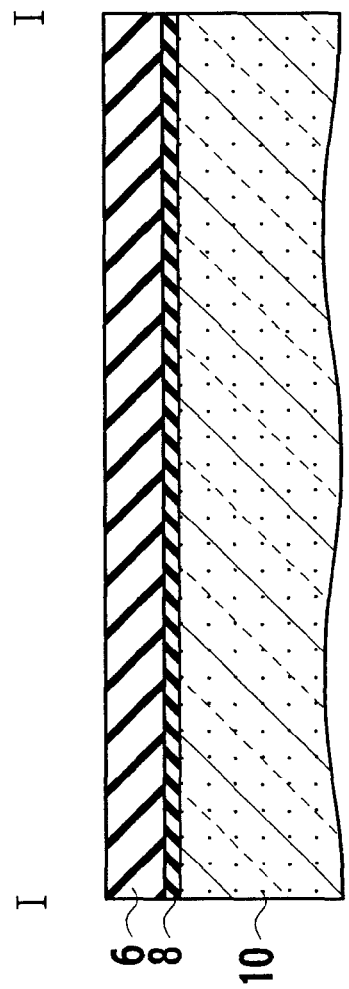
FIG. 39A schematically shows a cross section of the nonvolatile semiconductor memory, according to the second embodiment of the present invention, cut along the line I-I in FIG. 1, explaining a step of the fabrication process thereof.
Figures 41A, 41B:
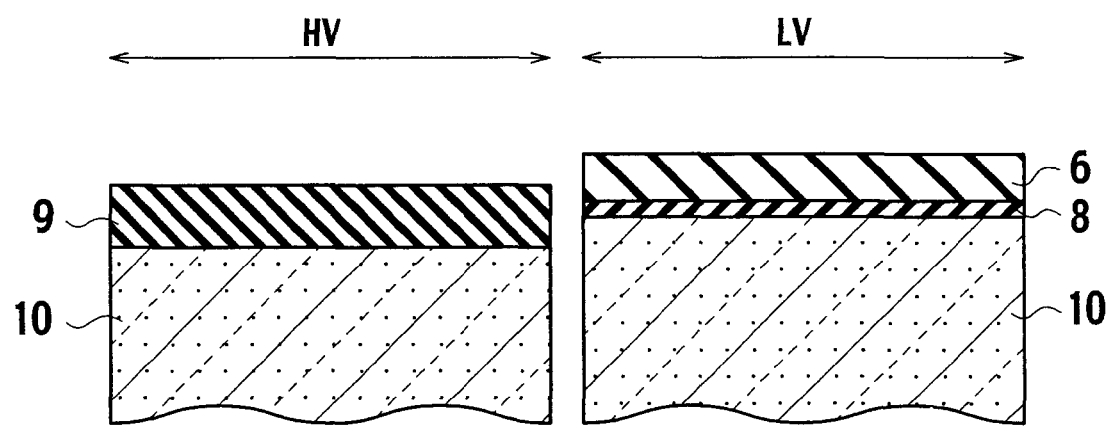
FIG. 41A schematically shows a cross section of a high voltage transistor in a high voltage transistor region, explaining a step of the fabrication process for the nonvolatile semiconductor memory, according to the second embodiment of the present invention.
FIG. 41B schematically shows a cross section of a low voltage transistor in a low voltage transistor region, explaining a step of the fabrication process for the nonvolatile semiconductor memory, according to the second embodiment of the present invention.
Figure 43A:
FIG. 43A schematically shows a cross section of the nonvolatile semiconductor memory, according to the second embodiment of the present invention, cut along the line III-III in FIG. 1, explaining a step of the fabrication process thereof.
Figure 43B:
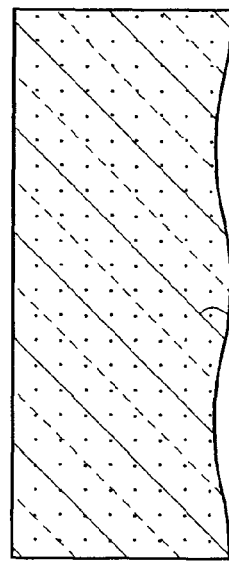
FIG. 43B schematically shows a cross section of the nonvolatile semiconductor memory, according to the second embodiment of the present invention, cut along the line IV-IV in FIG. 1, explaining a step of the fabrication process thereof.
Figure 43C:
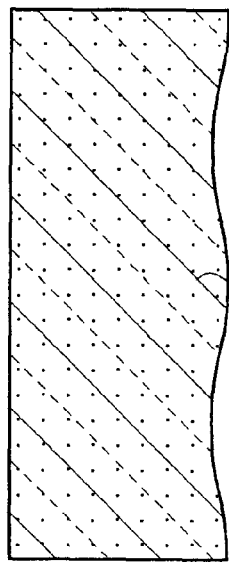
FIG. 43C schematically shows a cross section of the nonvolatile semiconductor memory, according to the second embodiment of the present invention, cut along the line V-V in FIG. 1, explaining a step of the fabrication process thereof.

(B-3) Next, as shown in FIG. 38A, the nitride film 6 formed on the pad insulating film 8 in the high voltage transistor region (HV) is removed using lithography and dry etching techniques.

(B-4) Next, as shown in FIGS. 39A and 39B, 40A through 40C, and 41A and 41B, a LOCOS insulating film 9, which is used for the LOCOS processing, is formed in the high voltage transistor region (HV) by exposing the entire surface of the semiconductor substrate 10 including the cell array region 120, the high voltage transistor region (HV), and the low voltage transistor region (LV) to an oxidized, high temperature atmosphere.

Figures 44A, 44B:
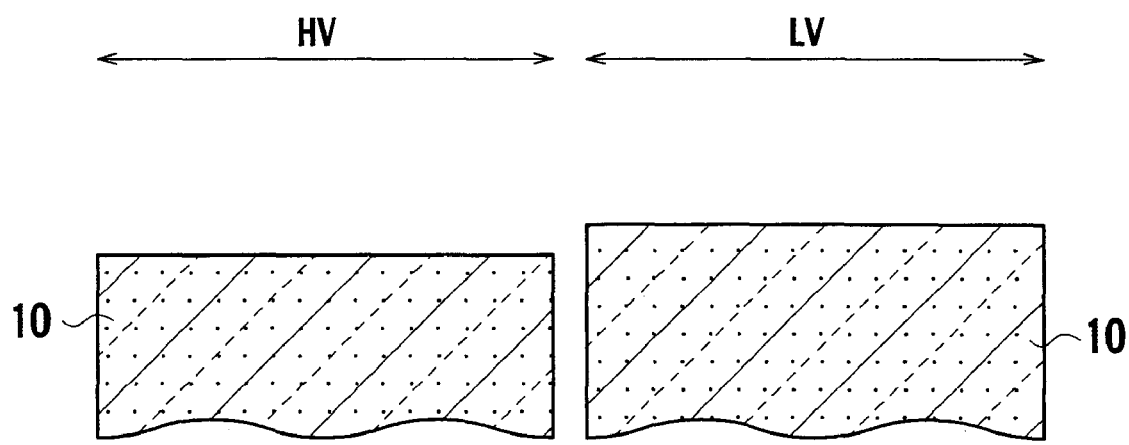
FIG. 44A schematically shows a cross section of a high voltage transistor in a high voltage transistor region, explaining a step of the fabrication process for the nonvolatile semiconductor memory, according to the second embodiment of the present invention.
FIG. 44B schematically shows a cross section of a low voltage transistor in a low voltage transistor region, explaining a step of the fabrication process for the nonvolatile semiconductor memory, according to the second embodiment of the present invention.
Figures 45A, 45B:
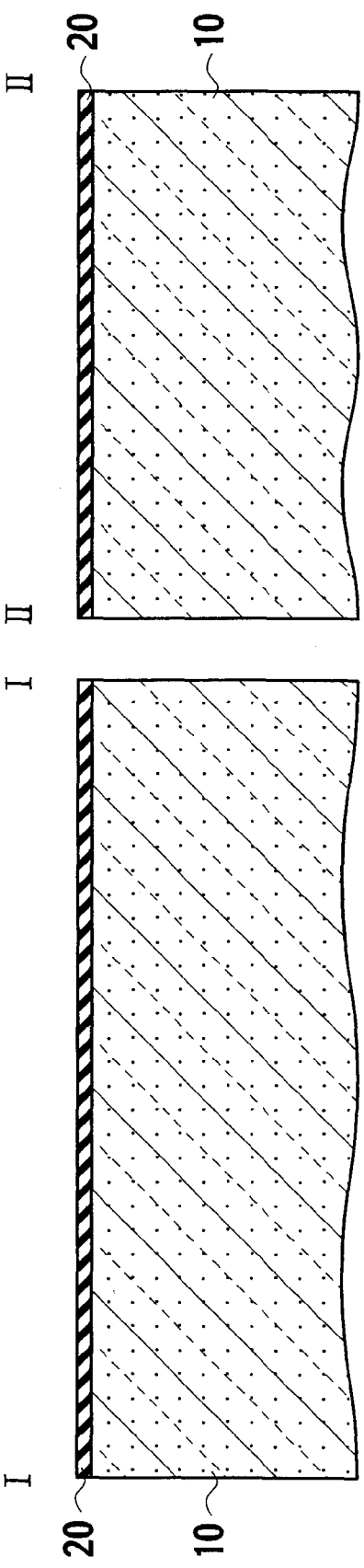
FIG. 45A schematically shows a cross section of the nonvolatile semiconductor memory, according to the second embodiment of the present invention, cut along the line I-I in FIG. 1, explaining a step of the fabrication process thereof.
FIG. 45B schematically shows a cross section of the nonvolatile semiconductor memory, according to the second embodiment of the present invention, cut along the line II-II in FIG. 1, explaining a step of the fabrication process thereof.
Figure 46A:
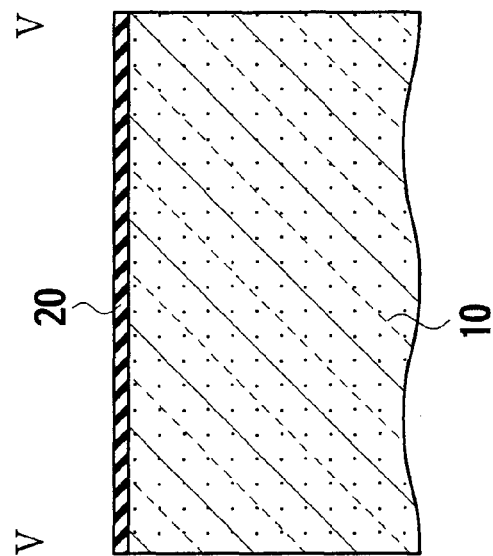
FIG. 46A schematically shows a cross section of the nonvolatile semiconductor memory, according to the second embodiment of the present invention, cut along a line in FIG. 1, explaining a step of a fabrication process thereof.
Figure 46B:
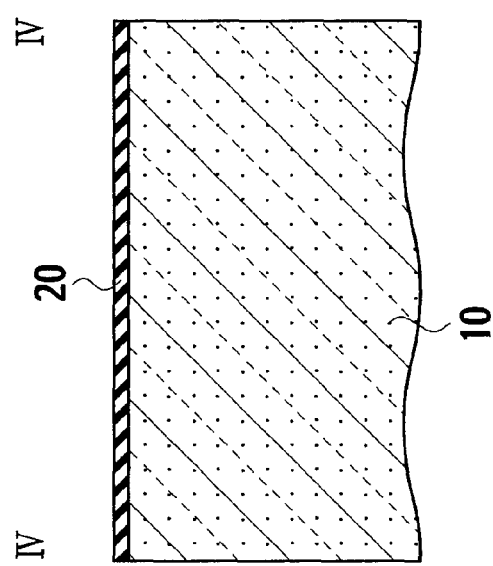
FIG. 46B schematically shows a cross section of the nonvolatile semiconductor memory, according to the second embodiment of the present invention, cut along the line IV-IV in FIG. 1, explaining a step of the fabrication process thereof.
Figure 46C:
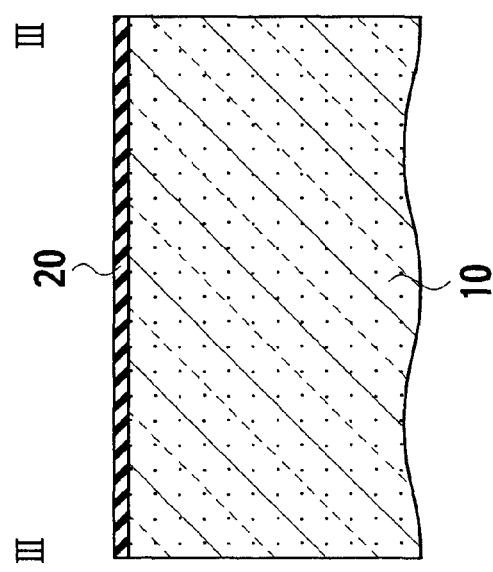
FIG. 46C schematically shows a cross section of the nonvolatile semiconductor memory, according to the second embodiment of the present invention, cut along the line V-V in FIG. 1, explaining a step of the fabrication process thereof.
Figure 49A:
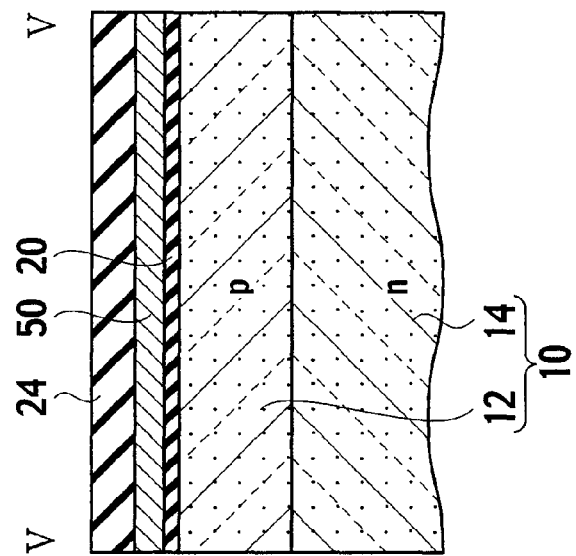
FIG. 49A schematically shows a cross section of the nonvolatile semiconductor memory, according to the second embodiment of the present invention, cut along the line III-III in FIG. 1, explaining a step of the fabrication process thereof.
Figure 49B:
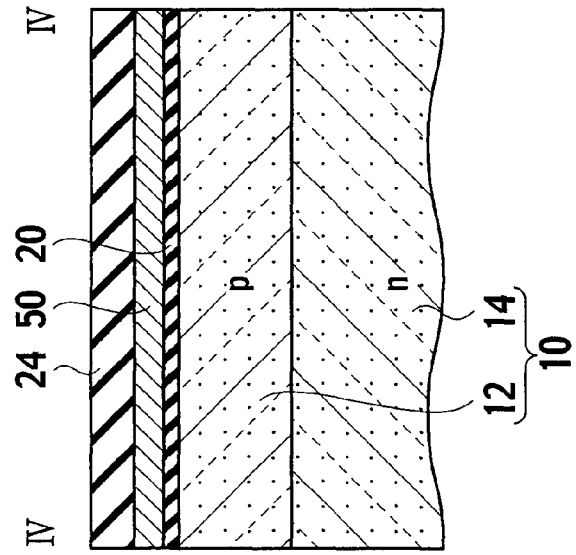
FIG. 49B schematically shows a cross section of the nonvolatile semiconductor memory, according to the second embodiment of the present invention, cut along the line IV-IV in FIG. 1, explaining a step of the fabrication process thereof.
Figure 49C:
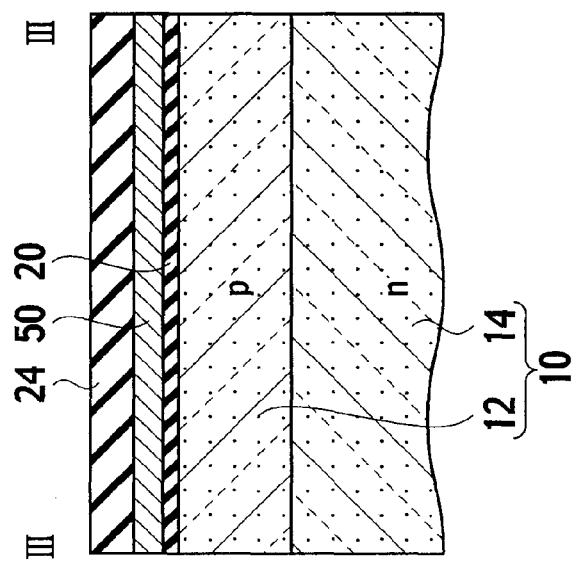
FIG. 49C schematically shows a cross section of the nonvolatile semiconductor memory, according to the second embodiment of the present invention, cut along the line V-V in FIG. 1, explaining a step of the fabrication process thereof.

(B-5) Next, as shown in FIGS. 42A and 42B, 43A through 43C, and 44A and 44B, the nitride film 6, the LOCOS insulating film 9, and the pad insulating film 8 on the entire device surface including the cell array region 120, the high voltage transistor region (HV), and the low voltage transistor region (LV) are removed by etching. As shown in FIGS. 44A and 44B, the height of the surface of the high voltage region (HV) in the semiconductor substrate 10 is lower than the height of the surface of the cell array region 120 and the low voltage transistor region (LV) in the semiconductor substrate 10 by the difference between the thickness of the LOCOS insulating film 9 and that of the pad insulating film 8.

(B-6) Next, as shown in FIGS. 47A and 47B, the high voltage transistor region (HV) and the low voltage transistor region (LV) are subjected to the ion-implantation (I/I) processing, forming a p-well region 16 and a n-well region 18.

(B-7) Next, as shown in FIGS. 45A and 45B, 46A through 46C, and 47A and 47B, a tunneling insulating film 20 is deposited on the cell array region 120 and the low voltage transistor region (LV) of the semiconductor substrate 10, and a high voltage gate insulating film 21, which is thicker than the thickness of the tunneling insulating film 20, is also deposited on the high voltage transistor region (HV) of the semiconductor substrate 10 by exposing the entire surface of the semiconductor substrate 10 including the cell array region 120, the high voltage transistor region (HV), and the low voltage transistor region (LV) to an oxidized, high temperature atmosphere.

(B-8) Next, as shown in FIGS. 48A and 48B, 49A through 49C, and 50A and 50B, the cell array region 120 is subjected to an ion-implantation (I/I) processing, forming a p-well region 12 and a n-well region 14.

Figure 50A:
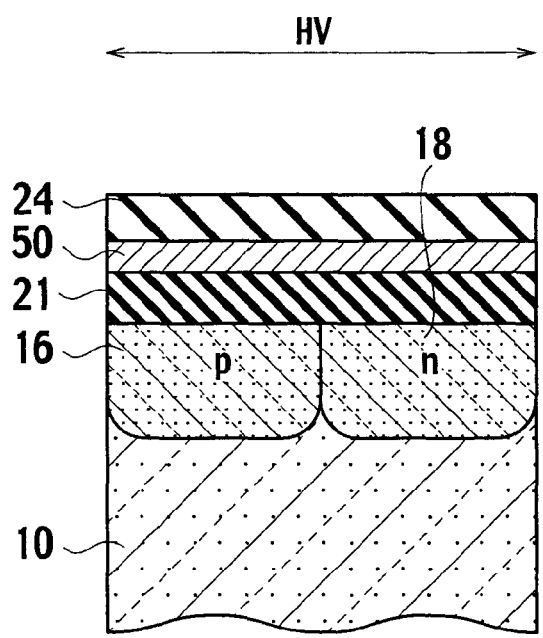
FIG. 50A schematically shows a cross section of a high voltage transistor in a high voltage transistor region, explaining a step of the fabrication process for the nonvolatile semiconductor memory, according to the second embodiment of the present invention.
Figure 50B:
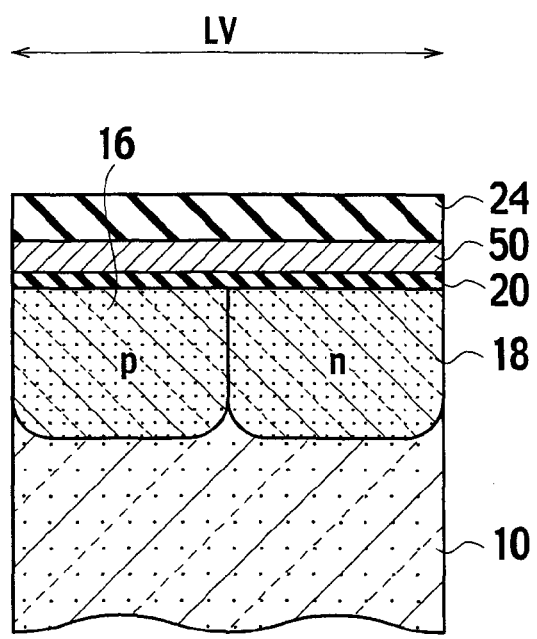
FIG. 50B schematically shows a cross section of a low voltage transistor in a low voltage transistor region, explaining a step of the fabrication process for the nonvolatile semiconductor memory, according to the second embodiment of the present invention.

(B-9) Next, as shown in FIGS. 48A and 48B, and 49A through 49C, after a floating gate electrode layer 50, which is a material for floating gates of memory cell transistors, is deposited on the tunneling insulating film 20, a stopper film 24 is deposited on the floating gate electrode layer 50. At the same time, as shown in FIGS. 50A and 50B, after the floating gate electrode layer 50 is deposited, a stopper film 24 is deposited on the floating gate electrode layer 50 in the high voltage transistor region (HV) and the low voltage transistor region (LV). The stopper film 24 is used as an etching stopper for polishing and planarizing the entire surface of the device through the CMP process.

(B-10) Next, as shown in FIGS. 51A and 51B, in the high voltage transistor region (HV) and the low voltage transistor region (LV), the stopper film 24 and the floating gate electrode layer 50 in which element isolating regions (STI) are to be formed are removed using lithography and dry etching techniques.

At the same time, in the same manner as shown in FIGS. 5A and 5B and 6A through 6C for the first embodiment, in the cell array region 120, the stopper film 24 and the floating gate electrode layer 50 in which element isolating regions (STI) are to be formed are removed using lithography and dry etching techniques.

(B-11) Next, as shown in FIGS. 52A and 52B, the semiconductor substrate 10, the high voltage gate insulating film 21, and the tunneling insulating film 20 in which element isolating regions (STI) are to be formed in the high voltage transistor region (HV) and the low voltage transistor region (LV) are removed using lithography and dry etching techniques until a depth at which the element isolating regions (STI) are to be formed.

At the same time, in the same manner as shown in FIGS. 8A and 8B, and 9A through 9C for the first embodiment, in the cell array region 120, the semiconductor substrate 10 and the tunneling insulating film 20 in which element isolating regions (STI) are to be formed are removed using lithography and dry etching techniques until a depth at which the element isolating regions (STI) are to be formed. As is apparent from FIGS. 52A and 52B, the etching depth for the semiconductor substrate 10 is greater than junction depths of p-well regions 12 and 16 or n-well region 18.

(B-12) Next, an insulating film such as a TEOS film is deposited on the entire device surface including the cell array region 120, the high voltage transistor region (HV), and the low voltage transistor region (LV), filling in etching grooves formed in the cell array region 120, the high voltage transistor region (HV), and the low voltage transistor region (LV), and forming element isolating regions (STI) 40.

(B-13) Next, the insulating film such as a TEOS film deposited on the entire device surface is subjected to polishing and planarizing through the CMP process.

(B-14) Next, the stopper film 24 deposited on the entire device surface including the cell array region 120, the high voltage transistor region (HV), and the low voltage transistor region (LV) is removed.

(B-15) Next, an inter-gate insulating film 25 is deposited on the entire device surface including the cell array region 120, the high voltage transistor region (HV), and the low voltage transistor region (LV). A silicon oxide film, a nitride film, an ONO film, or an alumina film may be used as the material for the inter-gate insulating film 25.

(B-16) Next, as shown in FIGS. 53A and 53B, a first control gate electrode layer 48 made of polysilicon or the like is deposited on the inter-gate insulating film 25, which is formed on the entire device region including the high voltage transistor region (HV) and the low voltage transistor region (LV).

At the same time, as with the first embodiment, the first control gate electrode layer 48 made of polysilicon or the like is deposited on the inter-gate insulating film 25 in the cell array region 120.

(B-17) Next, as shown in FIGS. 54A and 54B, in the high voltage transistor region (HV) and the low voltage transistor region (LV), the inter-gate insulating film 25 and the first control gate electrode layer 48 are removed using lithography and etching techniques. Through this process, in the high voltage transistor region (HV), an aperture for electrically connecting the floating gate electrode layer 50 to the first and the second control gate electrode layer 48 and 46 is formed. In the same manner, even in the low voltage transistor region (HV), an aperture for electrically connecting the floating gate electrode layer 50 to the first and the second control gate electrode layer 48 and 46 is formed.

At the same time, in the same manner as shown in FIGS. 14A and 14B and 15A through 15C for the first embodiment, the first control gate electrode layer 48 and the inter-gate insulating film 25 in the cell array region 120, are removed using lithography and etching techniques. Through this process, an aperture for electrically connecting the floating gate electrode layer 50 to the first and the second control gate electrode layer 48 and 46 is formed in an area of the cell array region 120 where select gate transistors for memory cell transistors are disposed.

(B-18) Next, as shown in FIGS. 55A and 55B, a first control gate electrode layer 48 and/or a second control gate electrode layer 46 both made of polysilicon or the like is deposited on the entire device surface including the high voltage transistor region (HV) and the low voltage transistor region (LV).

At the same time, as with the first embodiment, the first control gate electrode layer 48 and/or a second control gate electrode layer 46 both made of polysilicon or the like is deposited on the cell array region 120. The reason why the first control gate electrode layer 48 and the second control gate electrode layer 46, which are made of the same material, are deposited separately through two processes is because deposition of a resist on the inter-gate insulating film 25 for the lithography process may contaminate the inter-gate insulating film 25. Therefore, a resist is deposited on the first control gate electrode layer 48, and the inter-gate insulating film 25 is then processed so that the contamination of the inter-gate insulating film 25 can be prevented.

(B-19) Next, as shown in FIG. 56B, the second control gate electrode layer 46, the first control gate electrode layer 48, and the inter-gate insulating film 25, the floating gate electrode layer 50, and the tunneling insulating film 20 in the low voltage transistor region (LV) are removed using lithography and etching techniques. At the same time, as shown in FIG.

56A, the second control gate electrode layer 46, the first control gate electrode layer 48, and the inter-gate insulating film 25, the floating gate electrode layer 50, and the high voltage gate insulating film 21 in the high voltage transistor region (HV) are removed using lithography and etching techniques.

At the same time, in the same manner as shown in FIGS. 17A and 17B and 18A through 18C for the first embodiment, the second control gate electrode layer 46, the first control gate electrode layer 48, and the inter-gate insulating film 25, the floating gate electrode layer 50, and the tunneling insulating film 20 even in the cell array region 120 are removed using lithography and etching techniques.

In the same manner as shown in FIG. 17A, the floating gate electrode layer 50 and the first and the second control gate electrode layer 48 and 46 in the cell array region 120 are electrically connected, forming wide select gate lines SGD and SGS. Further, memory cell transistors constructed by stacking the floating gate electrode layer 50 and the first and the second control gate electrode layer 48 and 46 via the inter-gate insulating film 25 are formed.

(B-20) Next, in the same manner as shown in FIGS. 20A and 20B, and 21A through 21C for the first embodiment, atoms of group V such as phosphorus (P), arsenic (As), or antimony (Sb) are ion-implanted in the cell array region 120, the high voltage transistor region (HV), and the low voltage transistor region (LV) through an ion implantation (I/I) process, and n-type source/drain diffusion layers 34 of memory cell transistors in the cell array region 120 are then formed through the annealing process.

(B-21) Next, in the same manner as shown in FIGS. 20A and 20B, 21A through 21C, and 22A and 22B, an inter-gate embedded insulating film 26 made of a nitride film or the like is deposited on the entire device surface including the cell array region 120, the high voltage transistor region (HV), and the low voltage transistor region (LV).

As shown in FIG. 20A, the inter-gate embedded insulating film 26 fills in the area between the first and the second control gate electrode layer 48 and 46 of adjacent memory cell transistors. Generation of voids is prevented between the first and the second control gate electrode layer 48 and 46 of adjacent memory cell transistors.

(B-22) Next, in the same manner as shown in FIGS. 20A and 20B, 21A through 21C, and 22A and 22B, the filled inter-gate embedded insulating film 26 in the cell array region 120, the high voltage transistor region (HV), and the low voltage transistor region (LV) is removed using lithography and etching techniques.

(B-23) Next, in the same manner as shown in FIGS. 20A and 20B, 21A through 21C, and 22A and 22B, a gate sidewall insulating film 75 made of a nitride film or the like is deposited on the entire device surface including the cell array region 120, the high voltage transistor region (HV), and the low voltage transistor region (LV).

(B-24) Next, as shown in FIGS. 57A and 57B, in the high voltage transistor region (HV) and the low voltage transistor region (LV), the gate sidewall insulating film 75 is removed using lithography and etching techniques.

At the same time, in the same manner as shown in FIGS. 20A and 20B, and 21A through 21C for the first embodiment, in the cell array region 120, the gate sidewall insulating film 75 is removed using lithography and etching techniques.

A process of removing the gate sidewall insulating film 75 is described forthwith. However, drawings for the description are omitted. The gate sidewall insulating film 75 is removed by depositing a resist on the entire device surface including the cell array region 120, the high voltage transistor region (HV), and the low voltage transistor region (LV) and then using the resist as a mask to etch the area between the select gate lines SGD and SGS and area between adjacent word lines WL0, WL1, WL2, WL3, ..., WLn−3, WLn−2, WLn−1, and WLn. Afterward, the resist is removed using a resist remover.

(B-25) Next, as shown in FIGS. 57A and 57B, atoms of group V such as phosphorus (P), arsenic (As), or antimony (Sb) are ion-implanted in the high voltage transistor region (HV) and the low voltage transistor region (LV) through the ion implantation (I/I) processing, and n-type source/drain diffusion regions 36 of the high voltage and the low voltage transistor region are then formed through the annealing process.

At the same time, in the same manner as shown in FIGS. 20A and 20B, and 21A through 21C, for the first embodiment, atoms of group V such as phosphorus (P), arsenic (As), or antimony (Sb) are ion-implanted even in the cell array region 120 through an ion implantation (I/I) process, and n+ source/drain diffusion regions 32 of memory cell transistors in the cell array region 120 are then formed through the annealing process.

(B-26) Next, as shown in FIGS. 58A and 58B, atoms of group III such as Boron (B) are ion-implanted in the high voltage transistor region (HV) and the low voltage transistor region (LV) through an ion implantation (I/I) process, and p-type source/drain diffusion regions 38 of the high voltage and the low voltage transistor region are then formed through the annealing process.

(B-27) Next, a liner insulating film 27 made of a nitride film or the like is deposited on the entire device surface including the high voltage transistor region (HV) and the low voltage transistor region (LV), as shown in FIGS. 59A and 59B.

At the same time, in the same manner as shown in FIGS. 24A and 24B, and 25A through 25C for the first embodiment, the liner insulating film 27 made of a nitride film or the like is deposited on the entire device surface even in the cell array region 120.

The liner insulating film 27 is an etching stopper film used for forming a contact plugs in the second control gate electrode layer 46 disposed on memory cell transistors in the cell array region 120, in second control gate electrode layer 46 disposed on the floating gate electrode layer 50 of high voltage transistors in the high voltage transistor region (HV), and in second control gate electrode layer 46 disposed on the floating gate electrode layer 50 of low voltage transistors in the low voltage transistor region (LV).

(B-28) Next, as shown in FIGS. 59A and 59B, an interlayer insulating film 28 made of a TEOS film, a BPSG film or the like is deposited thick on the liner insulating film 27 in the high voltage transistor region (HV) and the low voltage transistor region (LV).

At the same time, in the same manner as shown in FIGS. 24A and 24B and 25A through 25C for the first embodiment, the inter-gate insulating film 28 made of a TEOS film, a BPSG film or the like is deposited thick on the liner insulating film 27 even in the cell array region 120.

As shown in FIG. 24A, the inter-gate embedded insulating film 26, the liner insulating film 27, and the inter-gate insulating film 28 fill in the area between the first and the second control gate electrode layer 48 and 46 of adjacent memory cell transistors.

(B-29) Next, as shown in FIGS. 60A and 60B, the entire device surface including the high voltage transistor region (HV) and the low voltage transistor region (LV) is subjected to the CMP process and then dry-etching, planarizing the inter-gate insulating film 28.

At the same time, in the same manner as shown in FIGS. 27A and 27B and 28A through 28C for the first embodiment, the entire device surface including the cell array region 120 is subjected to the CMP process and then thy-etching, planarizing the inter-gate insulating film 28.

(B-30) Next, an aperture is made in a silicide formation region using lithography and etching techniques. A mask made of a nitride film or the like is disposed on areas in which interconnect wirings and resistors are to be made so that formation of silicide can be prevented.

(B-31) Next, as shown in FIGS. 61A and 61B, in the high voltage transistor region (HV) and the low voltage transistor region (LV), the metallic silicide film 53 is formed only in the silicide formation region having an aperture.

At the same time, in the same manner as the first embodiment, a metallic silicide film 53 is formed only in the silicide formation region having an aperture of the cell array region 120. The metallic silicide film 53 is formed on the entire surface of gate electrodes. A variety of metallic silicides such as cobalt silicide ($CoSi_2$), nickel silicide ($NiSi_2$) or the like may be used as the metallic silicide layer to be formed.

The silicide formation region includes the second control gate electrode layer 46 of memory transistors in the cell array region 120, second control gate electrode layer 46 disposed on the floating gate electrode layer 50 of high voltage transistors in the high voltage transistor region (HV), and second control gate electrode layer 46 disposed on the floating gate electrode layer 50 of low voltage transistors in the low voltage transistor region (LV).

(B-32) Next, a barrier insulating film 29 made of a nitride film is deposited on the entire device surface including the high voltage transistor region (HV) and the low voltage transistor region (LV), as shown in FIGS. 62A and 62B.

At the same time, in the same manner as shown in FIGS. 30A and 30B and 31A through 31C for the first embodiment, a barrier insulating film 29 made of a nitride film is deposited on the entire device surface of the cell array region 120.

(B-33) Next, as shown in FIGS. 63A and 63B, in the high voltage transistor region (HV) and the low voltage transistor region (LV), an interlayer insulating film 68 is deposited on the barrier insulating film 29, and contact plugs for electrical connection to an upper region of gate electrodes and upper region of the semiconductor substrate 10 are formed using lithography and etching techniques.

At the same time, in the same manner as shown in FIG. 33 for the first embodiment, bit line contact (CB) plugs 63 are formed on the n-type source/drain diffusion layer 34 and the n+ source/drain diffusion layer 32 in the cell array region 120.

In the high voltage transistor region (HV), source/drain contact (CB) plugs 67 are formed on the p-type source/drain diffusion layer 38, while gate contact (CG) plugs 69 are formed on the second control gate electrode layer 46 and the metallic silicide film 53.

Likewise, in the low voltage transistor region (LV), gate contact (CG) plugs 69 are formed on the second control gate electrode layer 46 and the metallic silicide film 53, while source/drain contact (CS/D) plugs 67 are formed on the p-type source/drain region 38.

(B-34) Next, as shown in FIGS. 63A and 63B, in the high voltage transistor region (HV) and the low voltage transistor region (LV), a M0 metal layer 64 is formed on the source/drain contact (CS/D) plugs 67 and the gate contact (CG) plugs 69, and a via contact (V1) 65 is formed on the M0 metal layer 64 and connected to a M1 metal layer 66.

At the same time, in the same manner as shown in FIG. 33 for the first embodiment, even in the cell array region 120, a M0 metal layer 64 is formed on the bit line contact (CB) plugs 63, and a via contact (V1) 65 is formed on the M0 metal layer 64 and connected to the M1 metal layer 66.

According to the nonvolatile semiconductor memory of the second embodiment of the present invention, the gate insulating film of the low voltage transistors in the low voltage circuit region 80 and the tunneling insulating film 20 of the memory cell transistors in the cell array region 120 can be fabricated at the same time for "all gate pre-fabrication" process, resulting in simplification of the fabrication process.

Furthermore, according to the nonvolatile semiconductor memory of the second embodiment of the present invention, since the thickness of the high voltage gate insulating film 21 of the high voltage transistors in the high voltage circuit region 90 can be thicker than the value of the thickness of the tunneling insulating film 20, the high voltage transistors can have higher breakdown voltage capability at the same time.

Yet furthermore, according to the nonvolatile semiconductor memory of the second embodiment of the present invention, since the LOCOS technique is used to form high voltage transistors, which are prepared for the high voltage circuit region 90, in a lower area of a step region formed in the semiconductor substrate, the step region resulting from the difference in thickness between the high voltage gate insulating film 21 and the tunneling insulating film 20 is suppressed, resulting in the height of the high voltage transistors being the same as the height of the low voltage transistors in the low voltage circuit region 80 and the height of the memory cell transistors in the cell array region 120 so that a flat surface can be provided throughout. According to such nonvolatile semiconductor memory with a flat surface, problems such as broken interconnect wirings, increase in resistance of interconnects, or decrease in yield in fabrication processes due to poor step coverage of step regions can be solved, resulting in provision of highly reliable nonvolatile semiconductor memories with a high yield and good step coverage of the step regions.

According to the nonvolatile semiconductor memory of the second embodiment of the present invention, formation of metallic silicide films in gate electrode layers of a variety of elements and word lines in NAND flash memory allows provision of: higher-speed operability, higher integration, and simpler processing of memory cell transistors; higher-speed operability and simpler processing of low voltage transistors; and higher breakdown voltage capability, higher-speed operability, and simpler processing of high voltage transistors at the same time.

Third Embodiment (AND Circuit Structure)

As schematically shown in FIG. 67, a structure of a memory cell array 130 of a nonvolatile semiconductor memory according to the third embodiment of the present invention includes an AND memory cell array circuit structure.

Referring to FIG. 67, areas 134 enclosed by dotted lines denote respective AND cell units. The AND cell units 134 is constructed by memory cell transistors M0 through M15 connected in parallel and select gate transistors SG1 and SG2, as shown in detail in FIG. 67. The drains of the select gate transistors SG1 are connected to respective bit lines ... $BL_{j-1}$, $BL_j$, $BL_{j+1}$ ... via bit line contacts CB, while the sources of the select gate transistors SG2 are connected to a common source line SL via source line contacts CS.

In each of the AND cell units 134, drain regions of respective memory cell transistors M0 through M15 are commonly connected while source regions thereof are also commonly connected. In other words, as shown in FIG. 67, in each of the AND cell units 134 in the AND flash memory, memory cell transistors M0 through M15 are commonly connected. On one side thereof, the select gate transistors SG1 are connected while the select gate transistors SG2 are connected on the other side thereof. Word lines WL0 through WL15 are connected to the gates of respective memory cell transistors M0 through M15 one-to-one. A select gate line SGD is connected to the gate of the bit line side select transistor SG1. A select gate line SGS is connected to the gate of the source line side select transistor SG2.

According to the nonvolatile semiconductor memory of the third embodiment of the present invention, formation of metallic silicide films in gate electrode layers of a variety of elements and word lines in AND flash memory allows provision of: higher-speed operability, higher integration, and simpler processing of memory cell transistors; higher-speed operability and simpler processing of low voltage transistors; and higher breakdown voltage capability, higher-speed operability, and simpler processing of high voltage transistors at the same time.

Fourth Embodiment (NOR Circuit Structure)

As schematically shown in FIG. 68, a structure of a memory cell array 130 of nonvolatile semiconductor memory according to the fourth embodiment of the present invention includes a NOR memory cell array circuit structure.

Referring to FIG. 68, an area 136 enclosed by a dotted line denotes a NOR cell unit. In each of the NOR cell units 136, the common source region of adjacent two memory cell transistors is connected to a source line SL via source line contacts CS. The common drain regions of adjacent two memory cell transistors are connected to respective bit lines . . . $BL_{j-2}$, $BL_{j-1}$, $BL_j$, $BL_{j+1}$, $B_{j+2}$ . . . via bit line contacts CB. Furthermore, each of the NOR cell units 136 is disposed in the row direction extending along the plurality of word lines . . . , $WL_{i-1}$, $WL_i$, $WL_{i+1}$ . . . perpendicular to the bit lines . . . , $BL_{j-2}$, $BL_{j-1}$, $BL_j$, $BL_{j+1}$, $BL_{j+2}$, . . . . The gates of respective memory cell transistors of adjacent NOR cell units 136 are commonly connected by respective word lines . . . , $WL_{i-1}$, $WL_i$, $WL_{i+1}$, . . . . The nonvolatile semiconductor memory with the NOR circuit structure is characterized by higher speed read-out capability than the NAND circuit structure.

According to the nonvolatile semiconductor memory of the fourth embodiment of the present invention, formation of metallic silicide films in gate electrode layers of a variety of elements and word lines in NOR flash memory allows provision of: higher-speed operability, higher integration, and simpler processing of memory cell transistors; higher-speed operability and simpler processing of low voltage transistors; and higher breakdown voltage capability, higher-speed operability, and simpler processing of high voltage transistors at the same time.

Fifth Embodiment (Two-Transistor/Cell Circuit Structure)

As shown in FIG. 69, a structure of a memory cell array 130 of a nonvolatile semiconductor memory according to the fifth embodiment of the present invention includes a two-transistor/cell memory cell array circuit structure.

The nonvolatile semiconductor memory of the fifth embodiment of the present invention has the two-transistor/cell memory cell array circuit structure as a basic structure and includes stacked gate memory cell transistors. The drain regions of n-type source/drain regions of memory cell transistors MT are connected to respective bit line contacts CB, while the source regions of n-type source/drain regions of memory cell transistors MT are connected to respective drain regions of select gate transistors ST. Furthermore, the source regions of the select gate transistors ST are connected to respective source contacts CS. Such two-transistor/cell memory cells are arranged in parallel in the row direction extending along the plurality of word lines, configuring memory cell blocks 33, as shown in FIG. 69. In each of the memory cell blocks 33, the word line $WL_{i-2}$ is commonly connected to control gate electrode layers of memory cell transistors MT, configuring page units 31. Needless to say that pages in a plurality of blocks may be united into a page unit. Furthermore, a select gate line SGS is commonly connected to the gate electrodes of the select transistors ST. On the other hand, two-transistor/cell memory cells have a replicated structure centered on a source line SL and are arranged in series along the direction of the bit lines BL0, BL1, BL2, . . . , BLn−1.

According to the nonvolatile semiconductor memory of the fifth embodiment of the present invention, formation of metallic silicide films in gate electrode layers of a variety of elements and word lines in two-transistor/cell flash memory allows provision of higher-speed operability, higher integration, and simpler processing of memory cell transistors; higher-speed operability and simpler processing of low voltage transistors; and higher breakdown voltage capability, higher-speed operability, and simpler processing of high voltage transistors at the same time.

Sixth Embodiment (Three Transistor/Cell Circuit Structure)

As shown in FIG. 70, a structure of a memory cell array 130 of a nonvolatile semiconductor memory according to the sixth embodiment of the present invention includes a three-transistor/cell memory cell array circuit structure.

A nonvolatile semiconductor memory according to the sixth embodiment of the present invention has a three-transistor/cell structure as a basic structure, and includes memory cell transistors MT having a stacked gate structure and select transistors ST1 and ST2, each disposed at either ends of the memory cell transistors MT. The drain regions of memory cell transistors MT are connected to respective bit line contacts CB via bit line side select transistors ST1, while the source regions of the memory cell transistors MT are connected to respective source line contacts CS via source line side select transistors ST2. Such three-transistor/cell memory cells are arranged in parallel in the row direction extending along the plurality of word lines, configuring memory cell blocks 33, as shown in FIG. 70. In each of the memory cell blocks 33, the word line $WL_{i-2}$ is commonly connected to control gate electrode layers of memory cell transistors MT, configuring page units 31. Needless to say that pages in a plurality of blocks may be united into a page unit.

Furthermore, a select gate line SGS is commonly connected to the gate electrodes of the source line side select transistors ST2, while a select gate line SGD is commonly connected to the gate electrodes of the bit line side select transistors ST1. On the other hand, three-transistor/cell memory cells have a replicated structure centered on a source line SL and are arranged in series in the column direction extending along the plurality of bit lines BL0, BL1, BL2, . . . , BLn−1.

The semiconductor memory according to the sixth embodiment of the present invention can have an intermediate function between the NAND type and the NOR type.

According to the nonvolatile semiconductor memory of the sixth embodiment of the present invention, formation of metallic silicide films in gate electrode layers of a variety of elements and word lines in three-transistor/cell flash memory allows provision of: higher-speed operability, higher integration, and simpler processing of memory cell transistors; higher-speed operability and simpler processing of low voltage transistors; and higher breakdown voltage capability, higher-speed operability, and simpler processing of high voltage transistors at the same time.

[Applications]

The nonvolatile semiconductor memory according to the embodiments of the present invention has three major operation modes. They are called as a page mode, as a byte mode, and as a ROM included EEPROM mode.

In the page mode, an operation of collectively reading out from a memory cell row existing on word lines in a flash memory cell array to a sense amplifier via bit lines, or collectively writing in from the sense amplifier is performed. In other words, read-out and write-in are performed page by page.

On the other hand, in the byte mode, an operation of collectively reading out from memory cells existing on word lines in the flash memory cell array to the sense amplifier via bit lines byte by byte, or collectively writing in from the sense amplifier to the memory cells is performed. In other words, read-out and write-in being performed byte by byte is what differs from the page mode.

Meanwhile, in the ROM included EEPROM mode, the flash memory cell array is divided into a flash memory section and a ROM included EEPROM section, and operations of reading out or rewriting formation from/to the flash memory cell array page by page or byte by byte are performed while the ROM included EEPROM section is switched over systematically.

Needless to say that even the nonvolatile semiconductor memory according to the above-given first through the sixth embodiment can operate in either the page mode, the byte mode, or the ROM included EEPROM mode.

The nonvolatile semiconductor memory according to the first through the sixth embodiment of the present invention may be applied in various ways. Some of these applications are shown in FIGS. 71 through 85.

(Application 1)

FIG. 71 is a schematic block diagram of principle elements of a flash memory device and system. As shown in FIG. 71, a flash memory system 142 is configured with a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first through the sixth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which stores transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received this request packet, this request will be accepted by the USB flash unit controller 156.

Next, the USB flash unit controller 156 performs various operations such as read-out, write-in or erasure of data from or to the flash memory module 158. In addition, it supports basic USB functions such as acquiring a USB address and the like. The USB flash unit controller 156 controls the flash memory module 158 via either a control line 160, which is used to control output of the flash memory module 158, or, for example, other various signals such as a chip enable signal CE, a read-out signal, or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

(Memory Card)
(Application 2)

As an example, a memory card 260 including a semiconductor memory device 250 is configured as shown in FIG. 72. The nonvolatile semiconductor memory according to the first through the sixth embodiment of the present invention may be applied to the semiconductor memory device 250. The memory card 260 may operate so as to receive a predetermined signal from an external device (not shown in the drawing), or output a predetermined signal to the external device, as shown in FIG. 72.

A signal line DAT, a command line enable signal line CLE, an address line enable signal line ALE, and a ready/busy signal line R/B are connected to the memory card 260 housing the semiconductor memory device 250. The signal line DAT transfers a data signal, an address signal, or a command signal. The command line enable signal line CLE transmits a signal indicating that a command signal is being transferred over the signal line DAT. The address line enable signal line ALE transmits a signal indicating that an address signal is being transferred over the signal line DAT. The ready/busy signal line R/B transmits a signal indicating whether or not the semiconductor memory device 250 is ready to operate.

(Application 3)

Another specific example of the memory card 260 differs from the exemplary memory card of FIG. 72, including a controller 276 configured to control the semiconductor memory device 250 and transmit and receive predetermined signals to and from an external device, as shown in FIG. 73, in addition to the semiconductor memory device 250. The controller 276 includes an interface unit (I/F) 271, a microprocessor unit (MPU) 273, a buffer RAM 274, and an error-correction code unit (ECC) 275 within the interface unit (I/F) 272.

The interface unit (I/F) 271 transmits and receives a predetermined signal to and from the external device, and the interface unit (I/F) 272 transmits and receives a predetermined signal to and from the semiconductor memory device 250. The microprocessor unit (MPU) 273 converts a logical address to a physical address. The buffer RAM 274 temporarily stores data. The error-correction code unit (ECC) 275 generates an error-correction code.

A command signal line CMD, a clock signal line CLK, and the signal line DAT are connected to the memory card 260. The number of control signal lines, the bit width of the signal line DAT, and the circuit structure of the controller 276 may be modified as needed.

(Application 4)

Yet another exemplary configuration of the memory card 260 implements a system LSI chip 507 that integrates the interface units (I/F) 271 and 272, the microprocessor unit (MPU) 273, the buffer RAM 274, the error-correction code unit (ECC) 275 included in the interface unit (I/F) 272, and a semiconductor memory device area 501, as shown in FIG. 74. Such system LSI chip 507 is mounted on the memory card 260.

(Application 5)

Yet another exemplary configuration of the memory card 260 implements a system LSI chip 506 that integrates a memory included MPU 502, which is configured by forming the semiconductor memory device area 501 within the microprocessor unit (MPU) 273, the interface units (I/F) 271, the buffer RAM 274, and the interface unit (I/F) 272 including the error-correction code unit (ECC) 275, as shown in FIG. 75. Such system LSI chip 506 is mounted on the memory card 260.

(Application 6)

Yet another exemplary configuration of the memory card 260 includes, as shown in FIG. 76, flash memory 503 of ROM included EEPROM, which is configured by NAND flash memory and byte-type EEPROM, instead of the semiconductor memory device 250 shown in FIG. 72 or 73.

The flash memory 503 of the ROM included EEPROM and the controller 276 may naturally be integrated into a system LSI chip 507, as shown in FIG. 74. Furthermore, as shown in FIG. 75, the memory included MPU 502, which is configured by forming the flash memory 503 of the ROM included EEPROM in the microprocessor unit (MPU) 273, the interface units (I/F) 271 and 272, and the buffer RAM 274 may naturally be integrated into a system LSI chip 506.

(Application 7)

A memory card holder 280, as shown in FIG. 77, may be assumed as an application of the memory cards 260 of FIGS. 72 through 76. The memory card holder 280 may house the memory card 260, which includes the nonvolatile semiconductor memory described with the first through the sixth embodiment of the present invention as the semiconductor memory device 250. The memory card holder 280 is connected to an electronic device (not shown in the drawing) and may operate as an interface for the memory card 260 and the electronic device. The memory card holder 280 may execute various functions as well as those of the controller 276 within the memory card 260, the microprocessor unit (MPU) 273, the buffer RAM 274, the error-correction code unit (ECC) 275, the interface units (I/F) 271 and 272, and the like disclosed in FIGS. 72 through 76.

(Application 8)

Yet another application is described forthwith while referencing FIG. 78. A connecting equipment 290 capable of housing the memory card 260 or the memory cardholder 280 is disclosed in FIG. 78. Either the memory card 260 or the memory card holder 280 includes the nonvolatile semiconductor memory described in detail with the first through the sixth embodiment of the present invention as any one of the semiconductor memory device 250 or the semiconductor memory device area 501, the memory included MPU 502, or the flash memory 503 of the ROM included EEPROM. The memory card 260 or the memory card holder 280 is attached and electrically connected to the connecting equipment 290. The connecting equipment 290 is connected to a circuit board 291, which includes a CPU 294 and a bus 295, via a connecting wire 292 and an interface circuit 293.

(Application 9)

Yet another application is described forthwith while referencing FIG. 79. Either the memory card 260 or the memory card holder 280 includes the nonvolatile semiconductor memory described in detail with the first through the sixth embodiment of the present invention as any one of the semiconductor memory device 250 or the semiconductor memory device area 501, the memory included MPU 502, or the flash memory 503 of the ROM included EEPROM. The memory card 260 or the memory card holder 280 is attached and electrically connected to the connector 290. The connecting equipment 290 is connected to a personal computer (PC) 350 via the connecting wire 292.

(Application 10)

Yet another application is described forthwith while referencing FIG. 80. Either the memory card 260 or the memory card holder 280 may include the nonvolatile semiconductor memory described in detail with the first through the sixth embodiment of the present invention as any one of the semiconductor memory device 250 or the semiconductor memory device area 501, the memory included MPU 502, or the flash memory 503 of the ROM included EEPROM. An example where such a memory card 260 is applied to a digital camera 650 housing the memory cardholder 280 is shown in FIG. 80.

(IC Card)

(Application 11)

Yet another application of the nonvolatile semiconductor memory according to the first through the sixth embodiment of the present invention is constituted by a MPU 400, which is constituted by the semiconductor memory device 250, ROM 410, RAM 420, and a CPU 430, and an interface circuit (IC) card 500, which includes a plane terminal 600, as shown in FIGS. 81 and 82. The IC card 500 is connectable to an external device via the plane terminal 600. Furthermore, the plane terminal 600 is connected to the MPU 400 in the IC card 500. The CPU 430 includes a calculation section 431 and a control section 432. The control section 432 is connected to the semiconductor memory device 250, the ROM 410, and the RAM 420. It is preferable that the MPU 400 should be molded on one surface of the IC card 500 and that the plane terminal 600 should be formed on the other surface of the IC card 500.

The nonvolatile semiconductor memory described in detail in the first through the sixth embodiment of the present invention may be applied to the semiconductor memory device 250 or the ROM 410 in FIG. 46. Furthermore, the page mode, the byte mode, and the ROM included pseudo EEPROM mode are applicable to the operation of the nonvolatile semiconductor memory.

(Application 12)

Yet another exemplary configuration of the IC card 500 includes a system LSI chip 508, which integrates the ROM 410, the RAM 420, the CPU 430, and the semiconductor memory device area 501, as shown in FIG. 83. Such system LSI chip 508 is embedded in the IC card 500. The nonvolatile semiconductor memory described in detail in the first through the sixth embodiment of the present invention may be applied to the semiconductor memory device area 501 or the ROM 410 in FIG. 83. Furthermore, the page mode, the byte mode, and the ROM included EEPROM mode are applicable to the operation of the nonvolatile semiconductor memory.

(Application 13)

Yet another exemplary configuration of the IC card 500 includes the flash memory 510 of the ROM included EEPROM, which is constituted on the whole by integrating the ROM 410 in the semiconductor memory device area 501, as shown in FIG. 84.

Furthermore, the flash memory 510 of the ROM included EEPROM, the RAM 420, and the CPU 430 are integrated into a system LSI chip 509. Such a system LSI chip 509 is embedded in the memory card 500.

(Application 14)

Yet another exemplary configuration of the IC card 500 includes the flash memory 510 of the ROM included EEPROM, which is constructed on the whole by embedding the ROM 410 in the semiconductor memory device area 250 shown in FIG. 46, as shown in FIG. 85. Such flash memory 510 of the ROM included EEPROM is similar to that of FIG. 82 in that it is embedded in the MPU 400.

Other Embodiments

As described above, the present invention is described according to the first through the sixth embodiment; however, it should not be perceived that descriptions and drawings forming a part of this disclosure are not intended to limit the spirit and scope of the present invention. Various alternative embodiments, working examples, and operational techniques will become apparent from this disclosure for those skills in the art.

A stacked gate structure has been disclosed as the basic element structure of the memory cell transistor in the nonvolatile semiconductor memory according to the first through the sixth embodiment; however, it is not limited to this structure, and may naturally have a sidewall control gate structure, a MONOS structure, or the like. Furthermore, various variations and modifications are naturally possible in the fabrication process.

Moreover, the memory cell transistor of the nonvolatile semiconductor memory according to the first through the sixth embodiment is not limited to binary logic memory. For example, multi-valued logic memory, more specifically three or more valued memory is also applicable. For example, four-valued nonvolatile semiconductor memory can have a memory capacity twice that of the two-valued nonvolatile semiconductor memory. In addition, the present invention is applicable to m or more valued nonvolatile semiconductor memory (m>3).

As such, the present invention naturally includes various embodiments not described herein. Accordingly, the technical scope of the present invention is determined only by specified features of the invention according to the following claims that can be regarded appropriate from the above-mentioned descriptions.

While the present invention has been described according to the first through the sixth embodiment, these embodiments and drawings constituting a part of this disclosure do not limit the scope of the present invention. This disclosure shows those skilled in the present invention a variety of embodiments, alternative embodiments, and operational technologies.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation. Various modifications will become possible for those skilled in the art after receiving the teachings of the present disclosure without departing from the scope thereof.

What is claimed is:

1. A fabrication method for a nonvolatile semiconductor memory, which includes a cell array region, a high-voltage circuit region, and a low-voltage circuit region, the fabrication method comprising:

forming a tunneling insulating film on a semiconductor substrate, a floating gate electrode layer on the tunneling insulating film, and a first stopper film on the floating gate electrode layer in the cell array region, the high-voltage circuit region, and the low-voltage circuit region;

removing the first stopper film and the floating gate electrode layer only in the high voltage region;

forming a high voltage gate insulating film on the semiconductor substrate, a high voltage gate electrode layer on the high voltage gate insulating film, and a second stopper film on the high voltage gate electrode layer in the high voltage region;

removing portions of the second stopper film, the high voltage gate electrode layer, the first stopper film, and the floating gate electrode layer, in prospective regions, in which element isolating regions are to be formed, in the cell array region, the high-voltage circuit region, and the low-voltage circuit region;

removing portions of the high voltage gate insulating film, and the tunneling insulating film in the prospective regions in which element isolating regions are to be formed, in the cell array region, the high-voltage circuit region, and the low-voltage circuit region;

etching the semiconductor substrate until a depth at which the element isolating regions are to be formed and forming etching grooves in the semiconductor substrate in the cell array region, the high-voltage circuit region, and the low-voltage circuit region;

filling the etching grooves with a first insulating film and forming element isolating regions in the cell array region, the high-voltage circuit region, and the low-voltage circuit region;

removing the first stopper film and the second stopper film in the cell array region, the high-voltage circuit region, and the low-voltage circuit region;

depositing a second insulating film on the device surface including the cell array region, the high voltage circuit region, and the low voltage circuit region;

depositing a control gate electrode layer on the second insulating film including the cell array region, the high voltage circuit region, and the low voltage circuit region; and etching portions of the control gate electrode layer and the second insulating film in the cell array region, the high voltage circuit region, and the low voltage circuit region to expose the high voltage gate electrode layer.

2. The fabrication method of claim 1, further comprising:

depositing a pad insulating film on the semiconductor substrate in the cell array region, the high voltage circuit region, and the low voltage circuit region;

depositing a nitride film on the pad insulating film in the cell array region, the high voltage circuit region, and the low voltage circuit region;

removing the nitride film on the pad insulating film in the high voltage circuit region;

forming a LOCOS insulating film in the high voltage circuit region; and removing the nitride film, the LOCOS insulating film, and the pad insulating film;

forming the surface of the semiconductor substrate for the high voltage circuit region to be lower than the surface of the semiconductor substrate for the cell array region and the low voltage circuit region by the difference between the thickness of the LOCOS insulating film and that of the pad insulating film.

3. A fabrication method for a nonvolatile semiconductor memory, which includes a cell array region, a high-voltage circuit region, and a low-voltage circuit region, the fabrication method comprising:

depositing a tunneling insulating film on a semiconductor substrate, a floating gate electrode layer on the tunneling insulating film, in the cell array region, high-voltage circuit region, and the low-voltage circuit region;

depositing a high voltage gate insulating film on the semiconductor substrate, and a high voltage gate electrode layer on the high voltage gate insulating film in the cell array region, high-voltage circuit region, and the low-voltage circuit region;

removing portions of the floating gate electrode layer, the high voltage gate electrode layer, the high voltage gate insulating film, the tunneling insulating film, and the semiconductor substrate in prospective regions, in which element isolating regions are to be formed, in the cell array region, the high-voltage circuit region, and the low-voltage circuit region to form grooves;

filling a first insulating film in the grooves to form element isolating regions;

depositing a second insulating film and a control gate electrode layer on the device surface including the cell array region, the high voltage circuit region, and the low voltage circuit region;

forming memory cells, a gate electrode of a high voltage transistor, and a gate electrode of a low voltage transistor by etching the control gate electrode layer, the second insulating film, the floating gate electrode layer, and the high voltage gate electrode layer;

forming an interlayer insulating film in the cell array region, the high-voltage circuit region, and the low-voltage circuit region;

forming a metallic silicide film on the memory cells, the gate electrode of the high voltage transistor, and the gate electrode of the low voltage transistor; and forming a barrier insulating film on the metallic silicide film on the memory cells, the gate electrode of the high voltage transistor, and the gate electrode of the low voltage transistor.

4. The fabrication method of claim 3, further comprising:

forming a liner insulating film on sidewall surfaces of the memory cell, the gate electrode of the high voltage transistor, and the gate electrode of the low voltage transistor, before forming the interlayer insulating film.

5. The fabrication method of claim 3, further comprising:

forming an upper surface of the interlayer insulating film substantially equal to an upper surface of the memory cells, the gate electrode of the high voltage transistor, and the gate electrode of the low voltage transistor, after forming the interlayer insulating film.

6. The fabrication method of claim 3, further comprising:

exposing upper surfaces of the memory cells, the gate electrode of the high voltage transistor, and the gate electrode of the low voltage transistor, after forming the interlayer insulating film, wherein the metallic silicide film is formed on the upper surfaces of the memory cell, the gate electrode of the high voltage transistor, and the gate electrode of the low voltage transistor.

7. The fabrication method of claim 3, further comprising:

forming an inter-gate insulating film between the memory cells, after forming the memory cells, the gate electrode of the high voltage transistor, and the gate electrode of the low voltage transistor; and forming a gate sidewall insulating film on sidewall surfaces of the gate electrode of the high voltage transistor, and the gate electrode of the low voltage transistor.

8. The fabrication method of claim 4, further comprising:

forming an inter-gate insulating film between the memory cells, after forming the memory cells, the gate electrode of the high voltage transistor, and the gate electrode of the low voltage transistor; and forming a gate sidewall insulating film on sidewall surfaces of the gate electrode of the high voltage transistor, and the gate electrode of the low voltage transistor, wherein the gate sidewall insulating film is disposed between the liner insulating film and the gate electrode of the high voltage transistor, and the gate electrode of the low voltage transistor.

9. The fabrication method of claim 3, further comprising:

forming the surface of the semiconductor substrate for the high voltage circuit region to be lower than the surface of the semiconductor substrate for the cell array region and the low voltage circuit region, before depositing a tunneling insulating film.

10. The fabrication method of claim 9, wherein forming the surface of the semiconductor substrate for the high voltage circuit region to be lower than the surface of the semiconductor substrate for the cell array region and the low voltage circuit region comprises:

depositing a nitride film on a pad insulating film in the cell array region, the high voltage circuit region, and the low voltage circuit region;

removing the nitride film on the pad insulating film in the high voltage circuit region;

forming a LOCOS insulating film in the high voltage circuit region; and removing the nitride film, the LOCOS insulating film, and the pad insulating film.

* * * * *